(12) United States Patent
Chang et al.

(10) Patent No.: US 12,327,811 B2
(45) Date of Patent: *Jun. 10, 2025

(54) ION IMPLANTATION WITH ANNEALING FOR SUBSTRATE CUTTING

(71) Applicant: Taiwan Semiconductor Manufacturing Co., Ltd., Hsinchu (TW)

(72) Inventors: Huicheng Chang, Tainan (TW); Jyh-Cherng Sheu, Hsinchu (TW); Chen-Fong Tsai, Hsinchu (TW); Yun Chen Teng, New Taipei (TW); Han-De Chen, Hsinchu (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/390,439

(22) Filed: Dec. 20, 2023

(65) Prior Publication Data

US 2024/0120314 A1    Apr. 11, 2024

Related U.S. Application Data

(63) Continuation of application No. 17/497,050, filed on Oct. 8, 2021, now Pat. No. 11,855,040.

(Continued)

(51) Int. Cl.
*H01L 21/265* (2006.01)
*H01L 21/683* (2006.01)

(Continued)

(52) U.S. Cl.
CPC .......... *H01L 24/83* (2013.01); *H01L 21/265* (2013.01); *H01L 21/6835* (2013.01); *H01L 21/7806* (2013.01); *H01L 25/50* (2013.01)

(58) Field of Classification Search
CPC ... H01L 24/83; H01L 21/265; H01L 21/6835; H01L 21/7806; H01L 25/50; H01L 21/76224; H01L 21/768

(Continued)

(56) References Cited

U.S. PATENT DOCUMENTS

| 7,018,484 B1 * | 3/2006 | Atanackovic ..... H01L 21/02107 438/459 |
| 7,157,352 B2 * | 1/2007 | Yamanaka ........ H01L 27/14621 438/455 |

(Continued)

OTHER PUBLICATIONS

Agarwal et al., "Efficient Production of Silicon-on-Insulator Films by Co-implantation of He+ with H+," Proceedings 1997 IEEE international SOI Conference, Oct. 1997, pp. 44-45.

*Primary Examiner* — Vu A Vu
(74) *Attorney, Agent, or Firm* — Slater Matsil, LLP

(57) ABSTRACT

Methods of ion implantation combined with annealing using a pulsed laser or a furnace for cutting substrate in forming semiconductor devices and semiconductor devices including the same are disclosed. In an embodiment, a method includes forming a transistor structure of a device on a first semiconductor substrate; forming a front-side interconnect structure over a front side of the transistor structure; bonding a carrier substrate to the front-side interconnect structure; implanting ions into the first semiconductor substrate to form an implantation region of the first semiconductor substrate; and removing the first semiconductor substrate. Removing the first semiconductor substrate includes applying an annealing process to separate the implantation region from a remainder region of the first semiconductor substrate. The method also includes forming a back-side interconnect structure over a back side of the transistor structure.

20 Claims, 80 Drawing Sheets

Related U.S. Application Data

(60) Provisional application No. 63/187,558, filed on May 12, 2021.

(51) Int. Cl.
*H01L 21/78* (2006.01)
*H01L 23/00* (2006.01)
*H01L 25/00* (2006.01)

(58) Field of Classification Search
USPC .......................................................... 257/406
See application file for complete search history.

(56) References Cited

U.S. PATENT DOCUMENTS

| | | | | |
|---|---|---|---|---|
| 7,262,464 B2 * | 8/2007 | Takafuji | ............ | H01L 21/02164 |
| | | | | 257/353 |
| 7,361,528 B2 * | 4/2008 | Lee | ................... | H01L 31/1864 |
| | | | | 438/222 |
| 7,736,988 B2 * | 6/2010 | Ghyselen | .......... | H01L 21/76259 |
| | | | | 438/455 |
| 8,101,498 B2 * | 1/2012 | Pinnington | ......... | H01L 21/2007 |
| | | | | 438/455 |
| 8,288,250 B2 * | 10/2012 | Clavelier | ............ | H01L 21/2007 |
| | | | | 438/455 |
| 8,461,017 B2 * | 6/2013 | Sadaka | ................... | H01L 24/80 |
| | | | | 438/455 |
| 9,064,697 B2 * | 6/2015 | Arriagada | ............. | H01L 21/304 |
| 9,564,320 B2 * | 2/2017 | D'Evelyn | ............ | H01L 29/2003 |
| 10,304,722 B2 * | 5/2019 | Wang | ................... | H01L 21/0262 |
| 11,217,472 B2 * | 1/2022 | Or-Bach | ................ | H10B 12/20 |
| 11,374,118 B2 * | 6/2022 | Or-Bach | ................ | H01L 23/367 |
| 11,855,040 B2 * | 12/2023 | Chang | ................. | H01L 21/6835 |

* cited by examiner

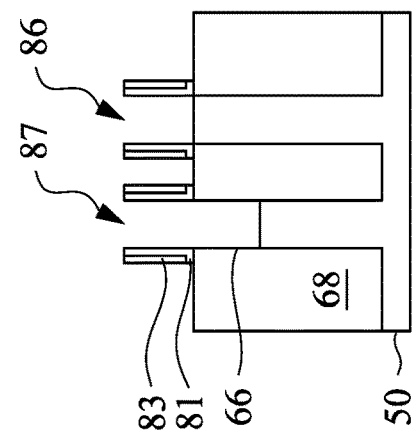
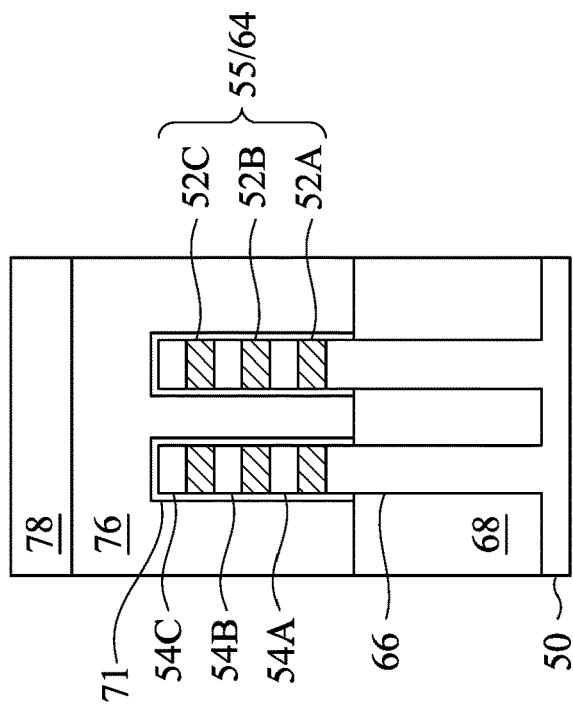
Figure 10A
Figure 10B

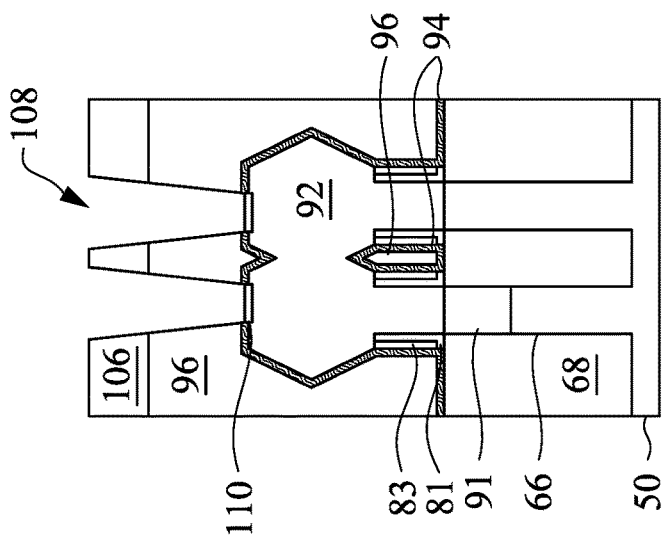
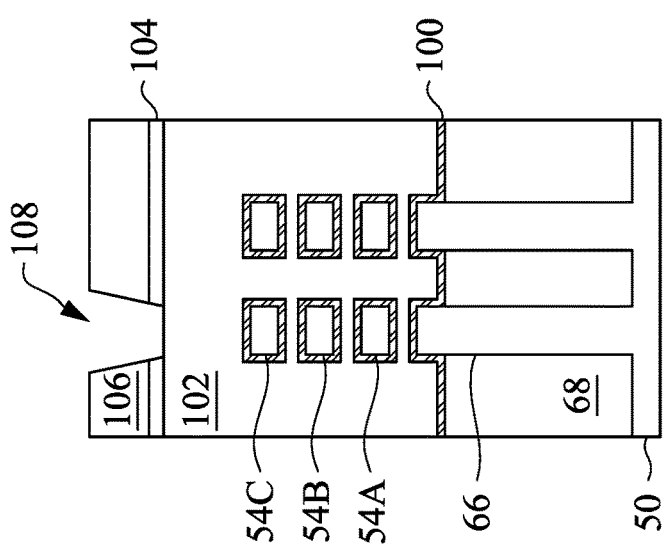
Figure 19A
Figure 19B

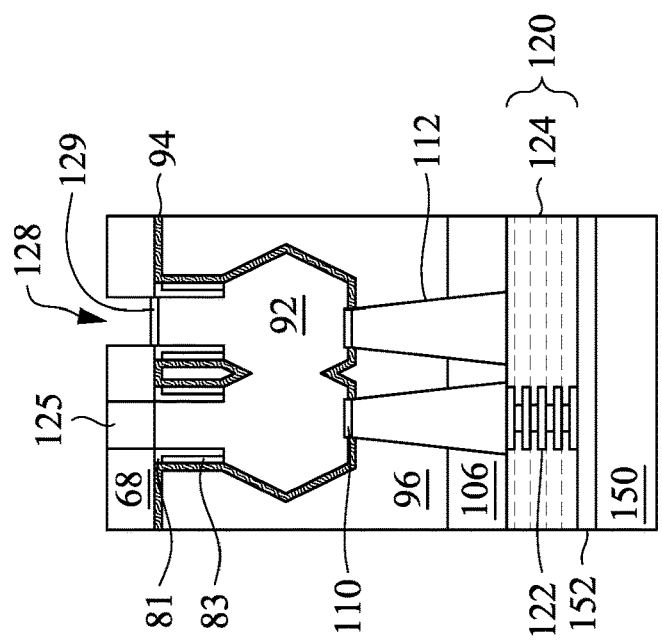
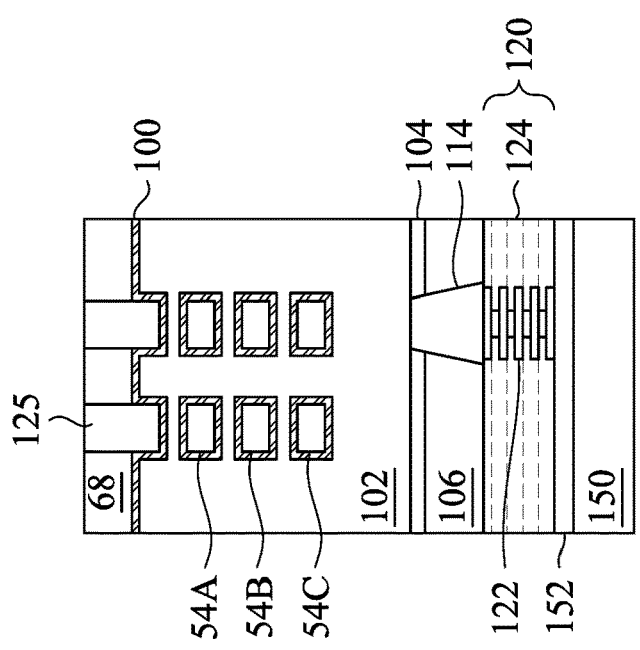
Figure 29B
Figure 29A

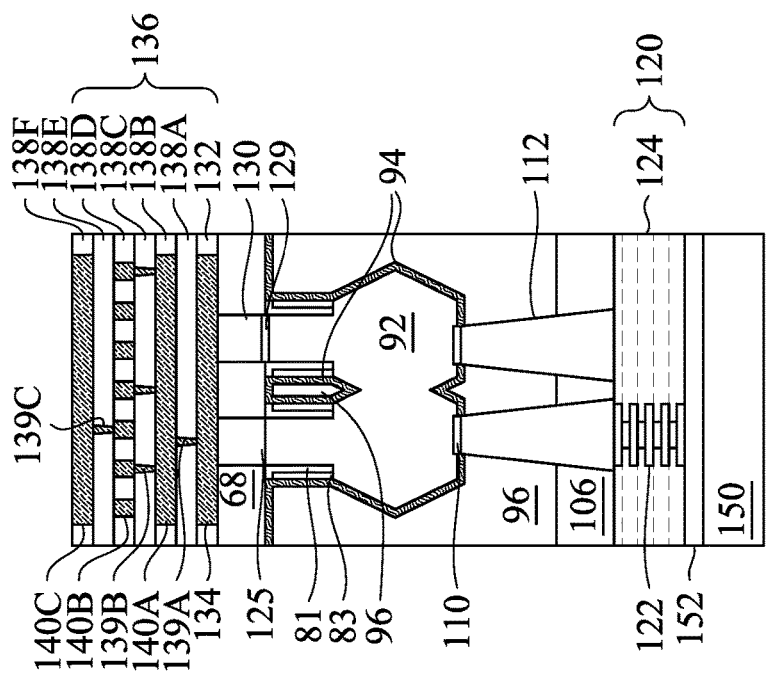
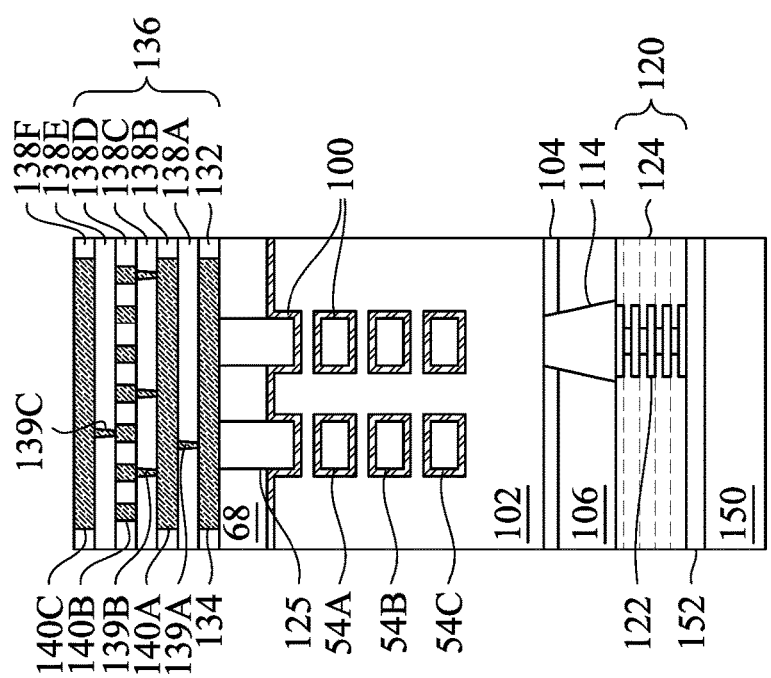
Figure 32B
Figure 32A

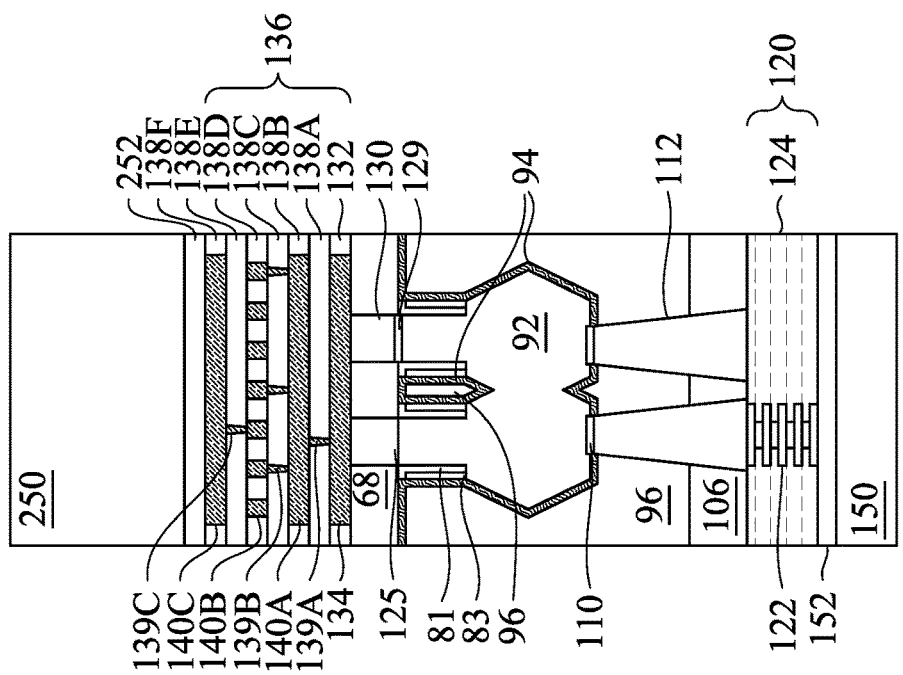
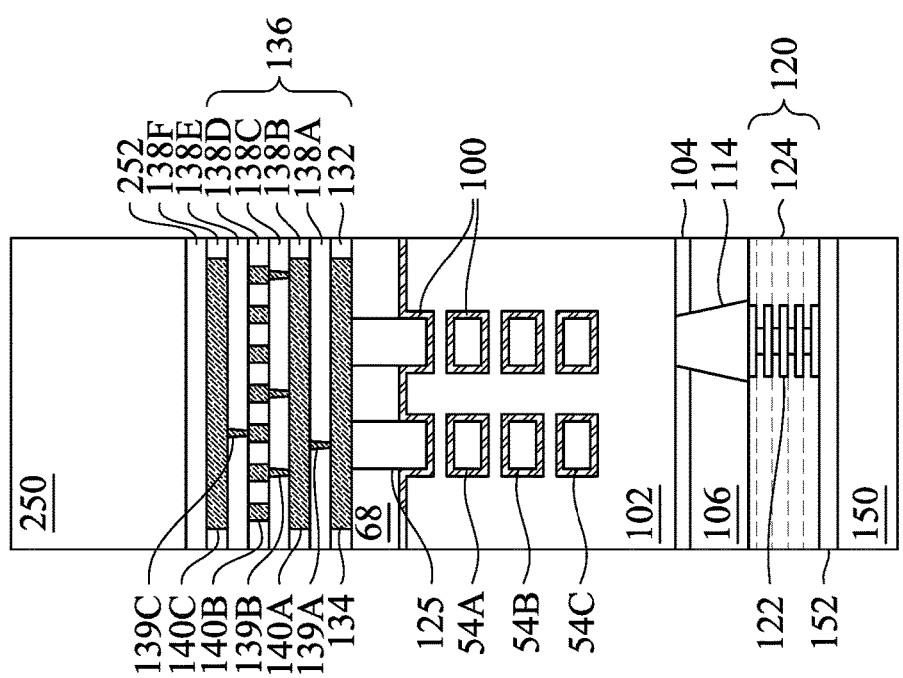
Figure 33B
Figure 33A

ION IMPLANTATION WITH ANNEALING FOR SUBSTRATE CUTTING

PRIORITY CLAIM AND CROSS-REFERENCE

This application is a continuation of U.S. patent application Ser. No. 17/497,050, filed on Oct. 8, 2021, which claims the benefit of U.S. Provisional Application No. 63/187,558, filed on May 12, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, IBC, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, 30C, 31A, 31B, 31C, 31D, 32A, 32B, 32C, 33A, 33B, 33C, 34A, 34B, 34C, 35A, 35B, 35C, 36A, 36B, 36C, 37, 38A, 38B, 38C, 39A, 39B, 39C, 40A, 40B, 40C, 41A, 41B, 41C, 42A, 42B, and 42C are cross-sectional views of intermediate stages in the manufacturing of nano-FETs, in accordance with some embodiments.

DETAILED DESCRIPTION

Figure 1:
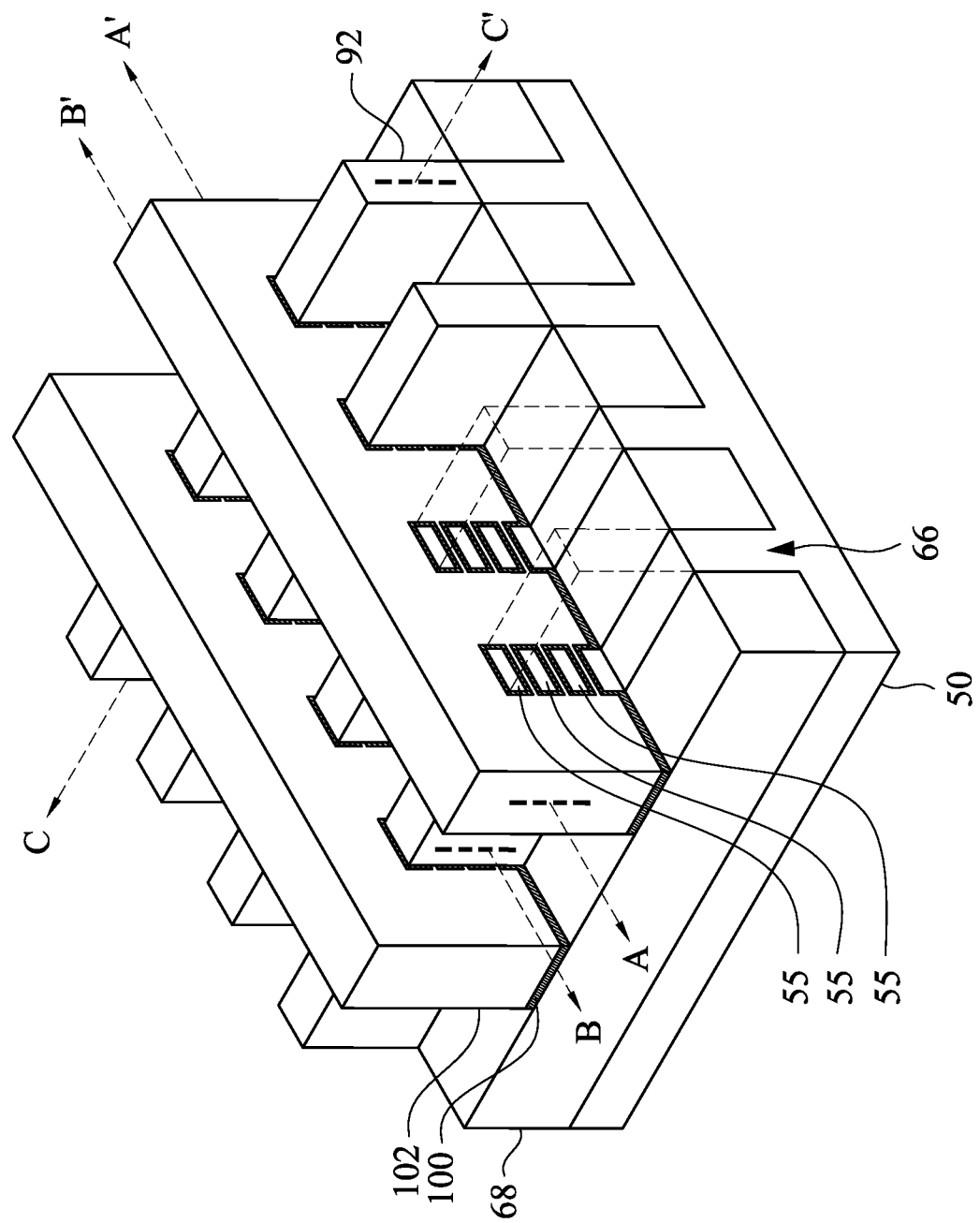
FIG. 1 illustrates an example of a nanostructure field-effect transistor (nano-FET) in a three-dimensional view, in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for removing temporary substrates using ion implantation combined with annealing and semiconductor devices including the same. In some embodiments, hydrogen ions and/or helium ions are implanted in a substrate to form an implantation region of the substrate. An annealing process using a pulsed laser or a furnace is applied to separate the implantation region from a remainder region of the substrate for reducing the thickness of the substrate. Ion implantation combined with annealing may be applied as a part of the semiconductor substrate removal before forming a back-side interconnect structure. Ion implantation combined with annealing may also be applied as a part of carrier substrate removal. Using the embodiment techniques, the cut substrate may be reused. The embodiment techniques also avoid the thickness uniformity and substrate edge peeling issues. Furthermore, the embodiment techniques provide cost and throughput advantages.

Some embodiments discussed herein are described in the context of a die including nano-FETs. However, various embodiments may be applied to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 10ft. Epitaxial source/drain regions 92 are disposed on the fins 66 on opposing sides of the gate dielectric layers wo and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 42C are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, 34A, 35A, 36A, 37, 38A, 39A, 40A, 41A, and 42A illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, 21B, 22B, 23B, 24B, 25B, 26B, 27B, 28B, 29B, 30B, 31B, 32B, 33B, 34B, 35B, 36B, 38B, 39B, 40B, 41B, and 42B illustrate reference cross-section B-B' illustrated in FIG. 1. FIGS. 7C, 8C, 9C, 10C, 11C, 11D, 12C, 12E, 13C, 14C, 15C, 16C, 17C, 18C, 19C, 20C, 21C, 22C, 23C, 24C, 25C, 26C, 27C, 28C, 29C, 30C, 31C, 31D, 32C, 33C, 34C, 35C, 36C, 38C, 39C, 40C, 41C, and 42C illustrate reference cross-section C-C' illustrated in FIG. 1.

Figure 2:
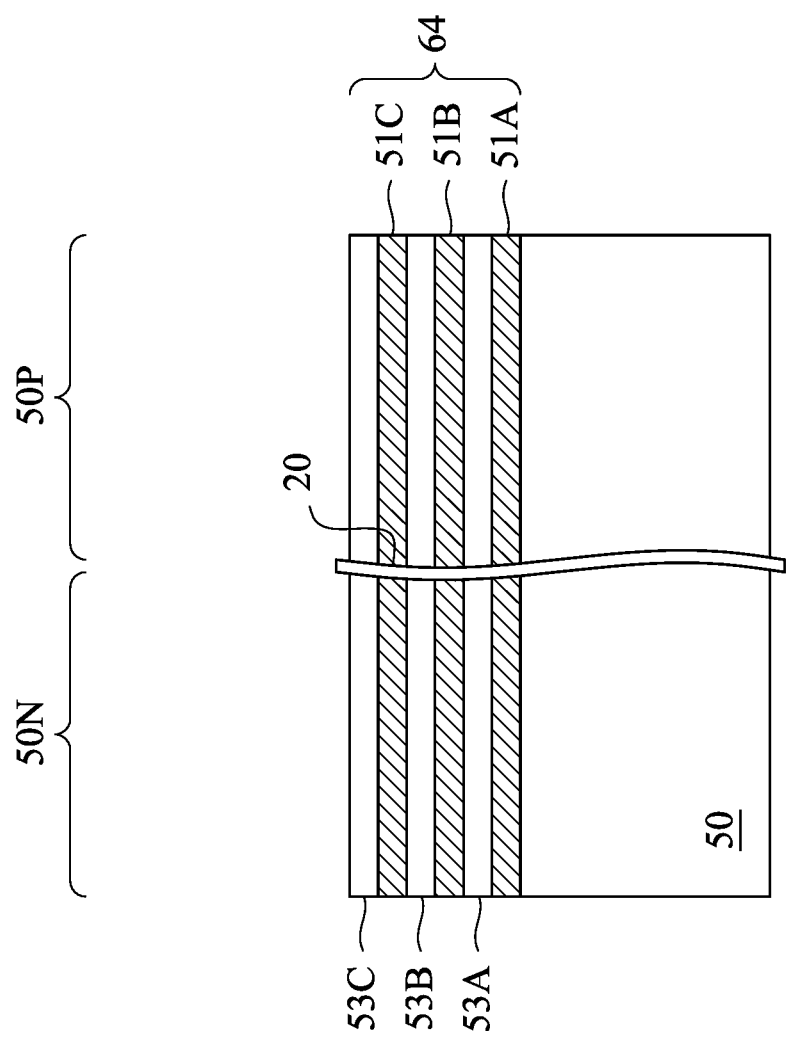

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
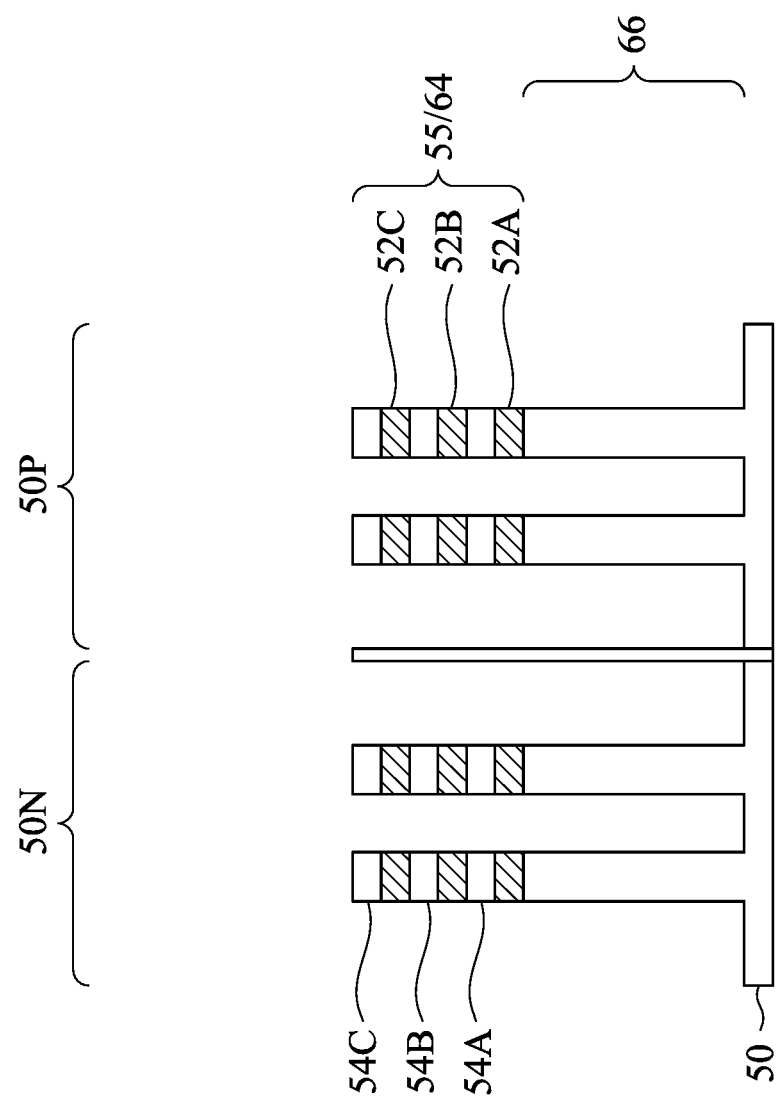

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
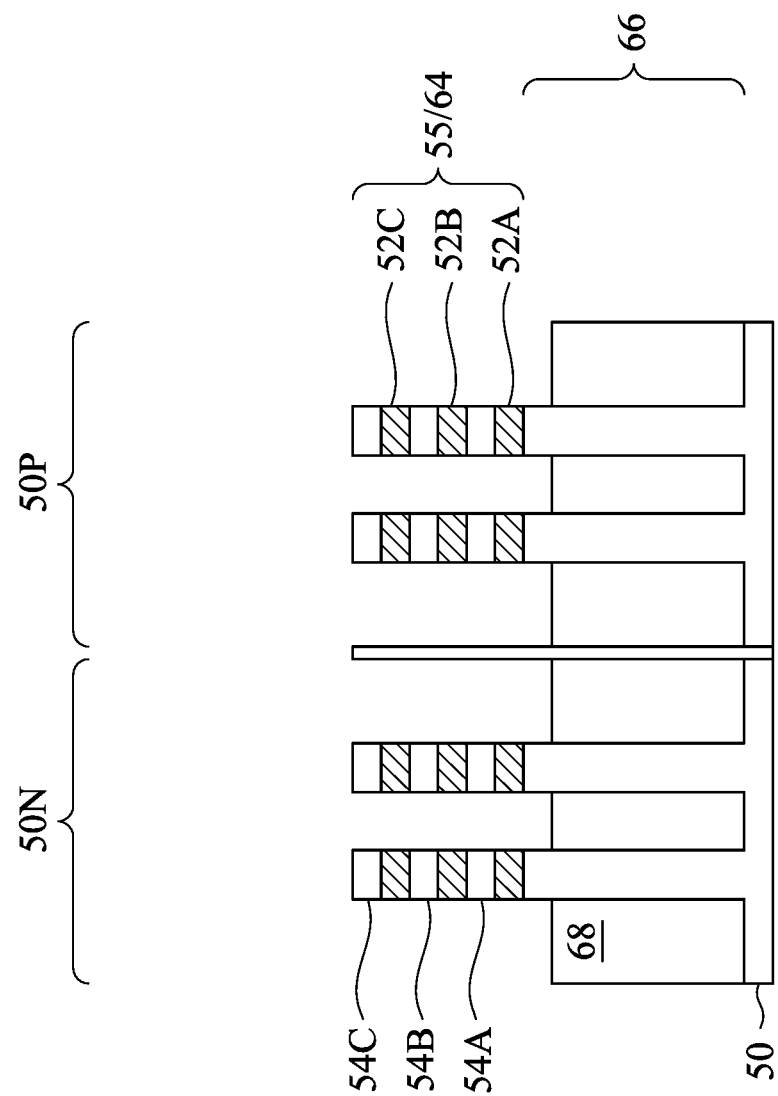

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about 1014 atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about 1014 atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
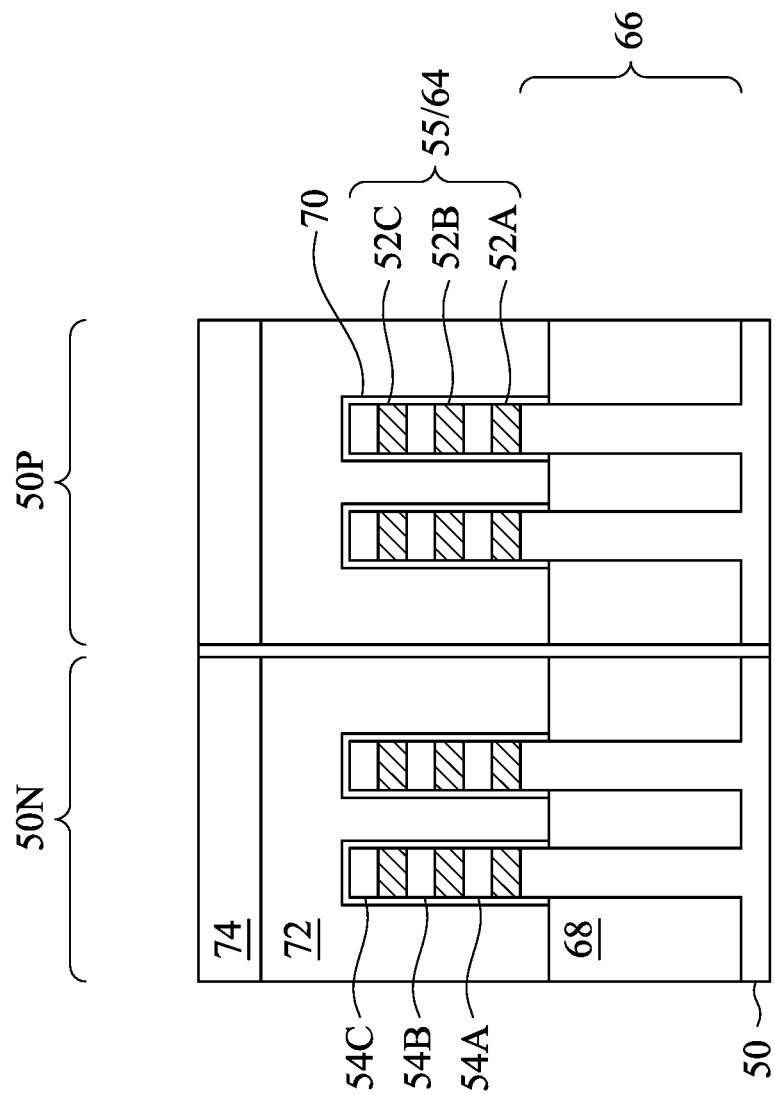

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
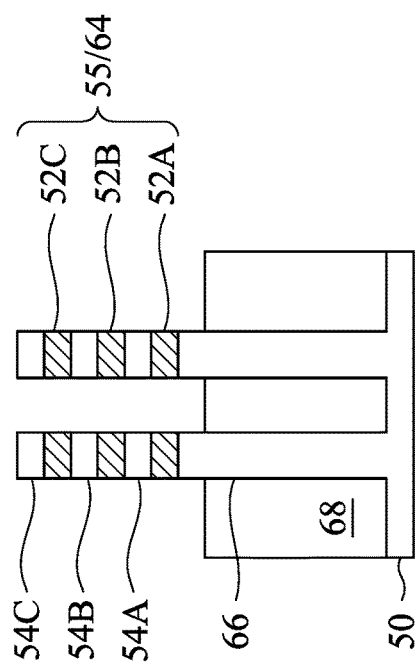
Figure 6A:
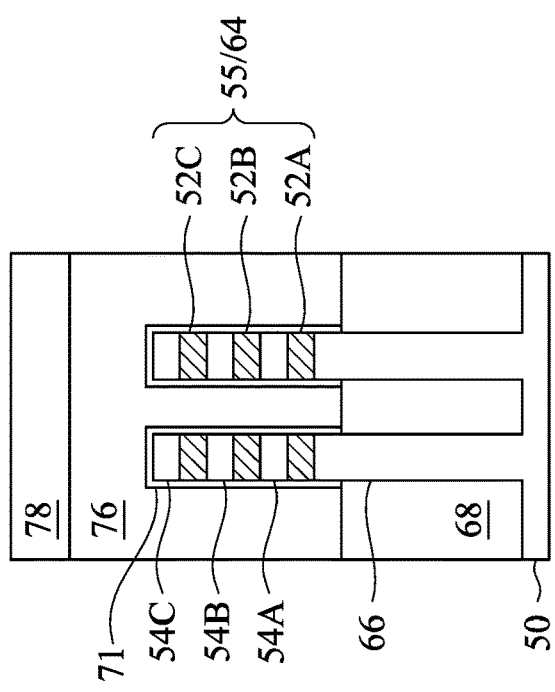
Figure 6C:
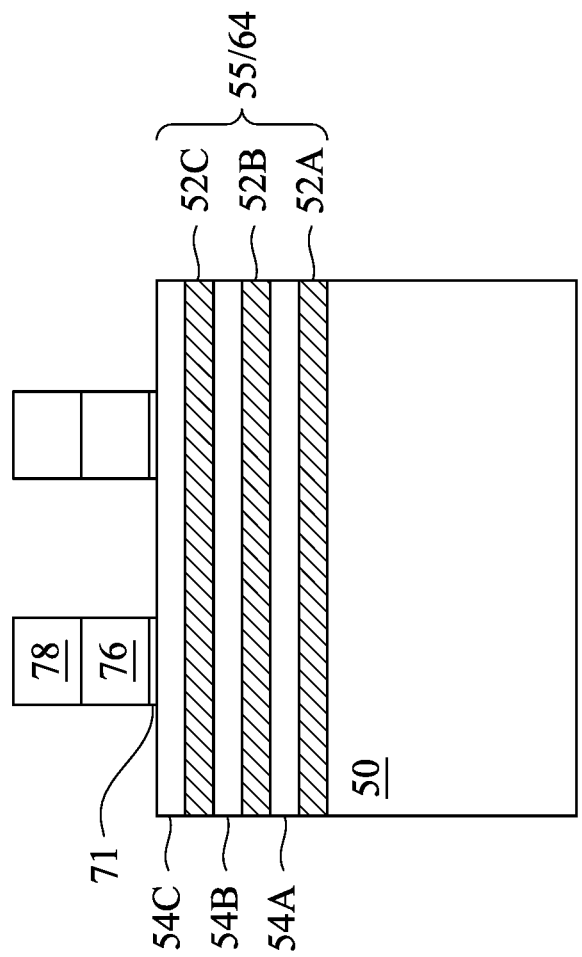

FIGS. 6A through 18C illustrate various additional steps in the manufacturing of embodiment devices. FIGS. 6A through 18C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7B:
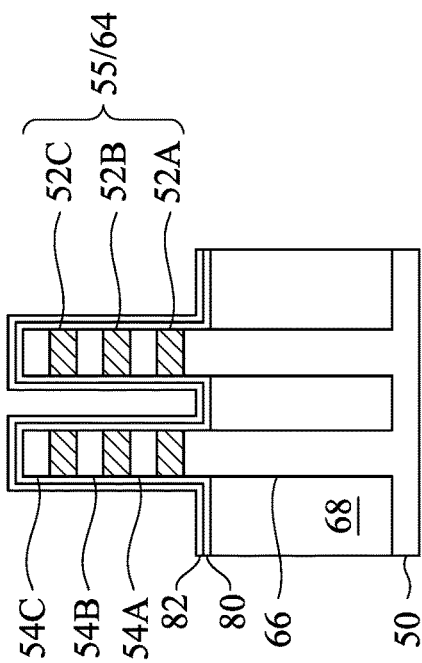
Figure 7A:
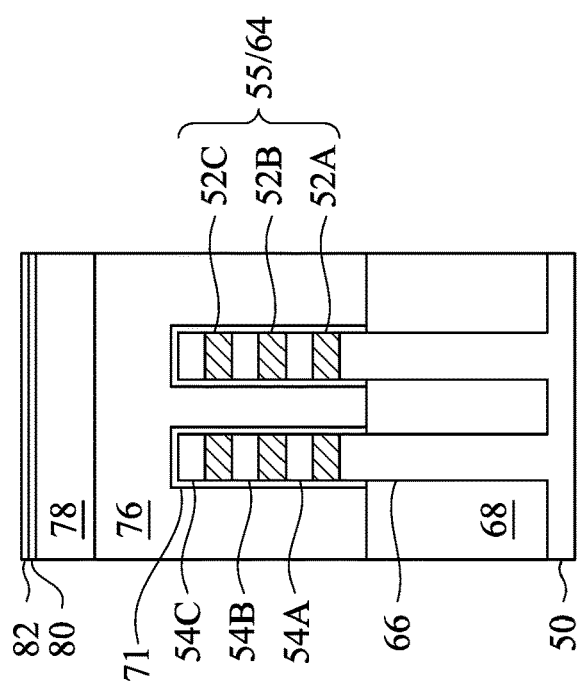
Figure 7C:
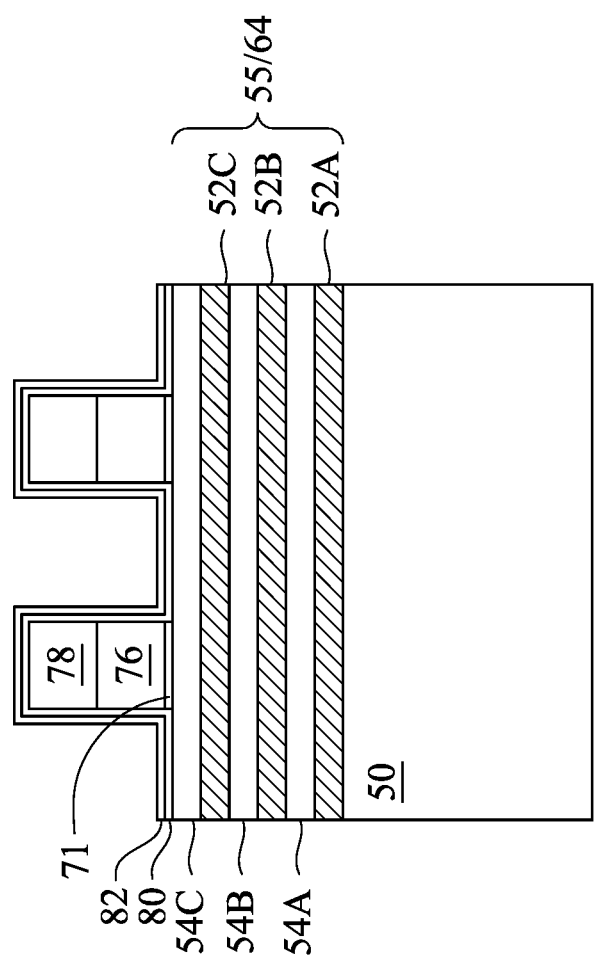

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{13}$ atoms/cm$^3$ to about $1\times10^{19}$ atoms/cm$^3$. An anneal may be used to repair implant damage and to activate the implanted impurities.

Figure 8B:
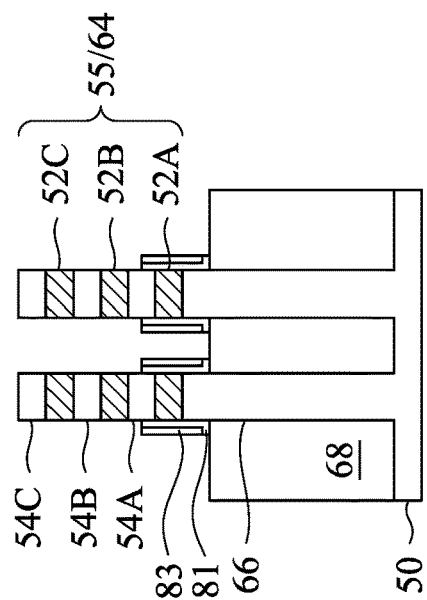
Figure 8A:
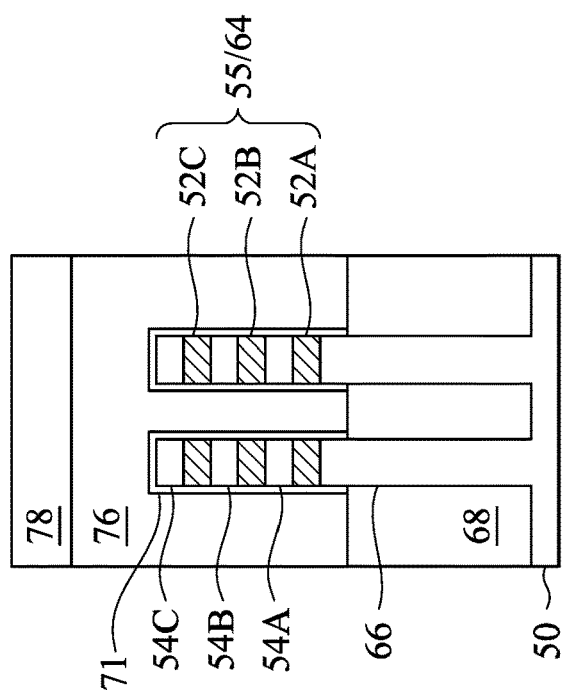
Figure 8C:
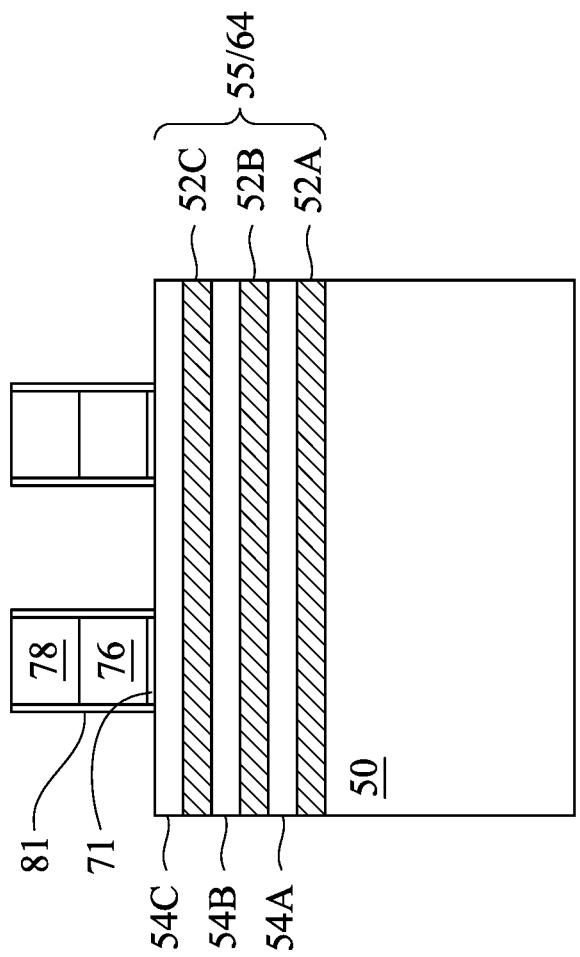

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
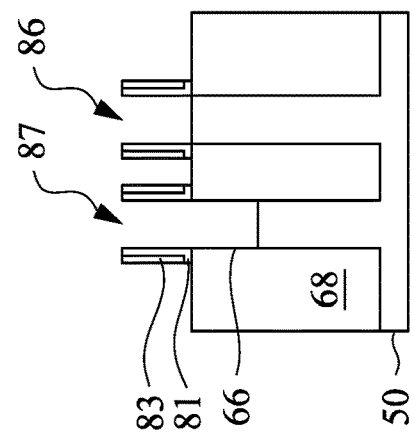
Figure 9A:
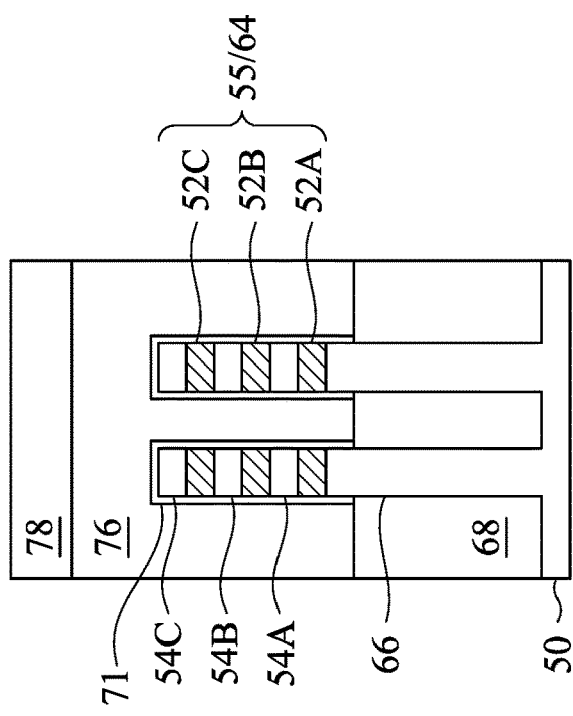
Figure 9C:
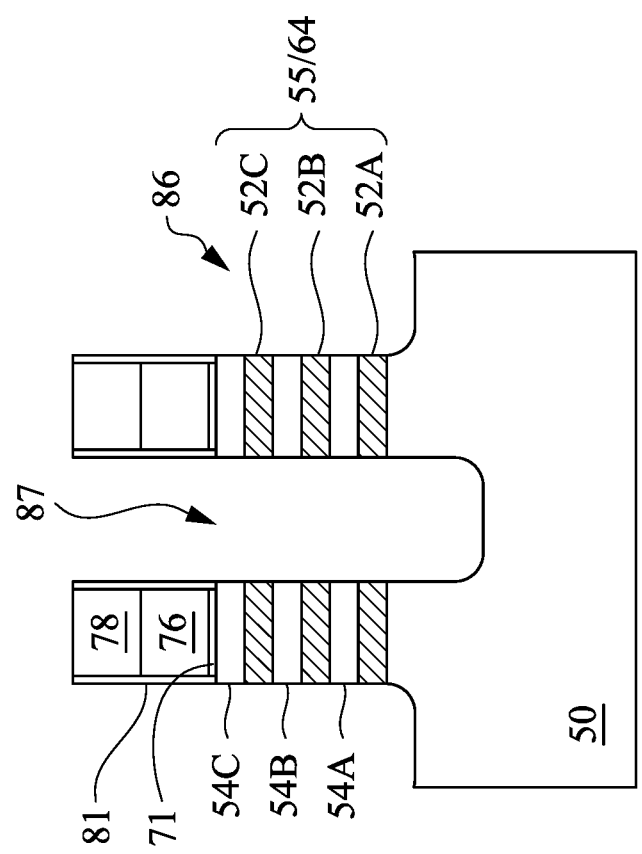

In FIGS. 9A through 9C, first recesses 86 and second recesses 87 are formed in the fins 66, the nanostructures 55, and the substrate 50, in accordance with some embodiments. Epitaxial source/drain regions will be subsequently formed in the first recesses 86 and first epitaxial materials and epitaxial source/drain regions will be subsequently formed in the second recesses 87. The first recesses 86 and the second recesses 87 may extend through the first nanostructures 52 and the second nanostructures 54, and into the substrate 50. As illustrated in FIG. 9B, top surfaces of the STI regions 68 may be level with bottom surfaces of the first recesses 86. In various embodiments, the fins 66 may be etched such that bottom surfaces of the first recesses 86 are disposed below the top surfaces of the STI regions 68 or the like. Bottom surfaces of the second recesses 87 may be disposed below the bottom surfaces of the first recesses 86 and the top surfaces of the STI regions 68. The first recesses 86 and the second recesses 87 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86 and the second recesses 87. A single etch process or multiple etch processes may be used to etch each layer of the nanostructures 55 and/or the fins 66. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 10C:
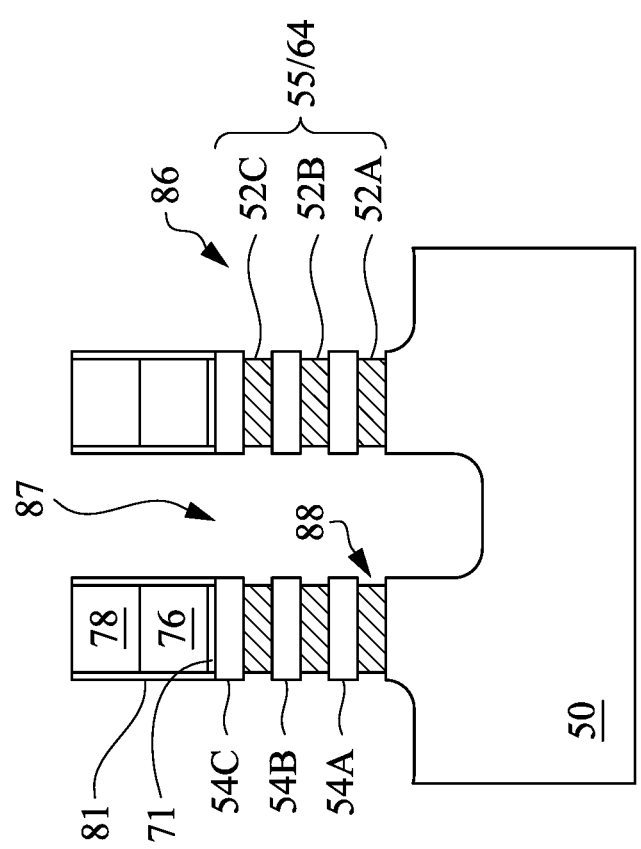

In FIGS. 10A through 10C, portions of sidewalls of the layers of the multi-layer stack 64 formed of the first semiconductor materials (e.g., the first nanostructures 52) exposed by the first recesses 86 and the second recesses 87 are etched to form sidewall recesses 88. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and a gate structure. As will be discussed in greater detail below, source/drain regions and epitaxial materials will be formed in the first recesses 86 and the second recesses 87, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Figure 11B:
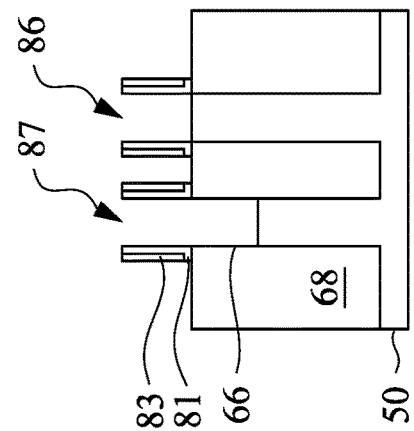
Figure 11A:
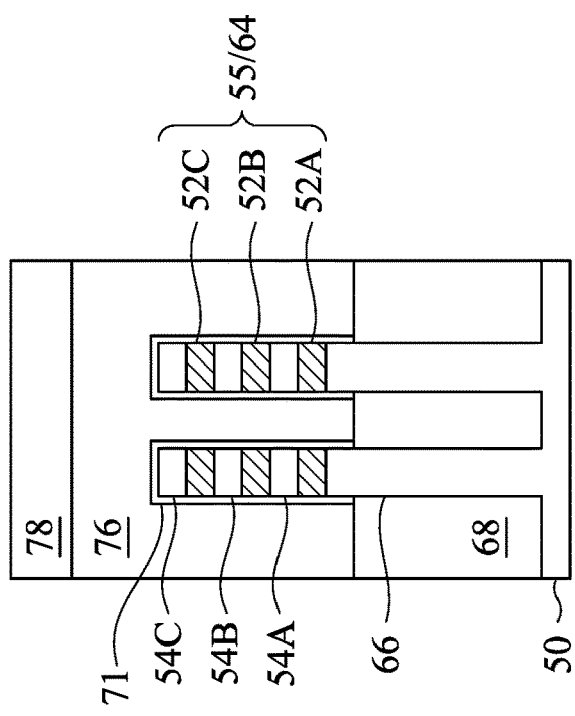
Figure 11C:
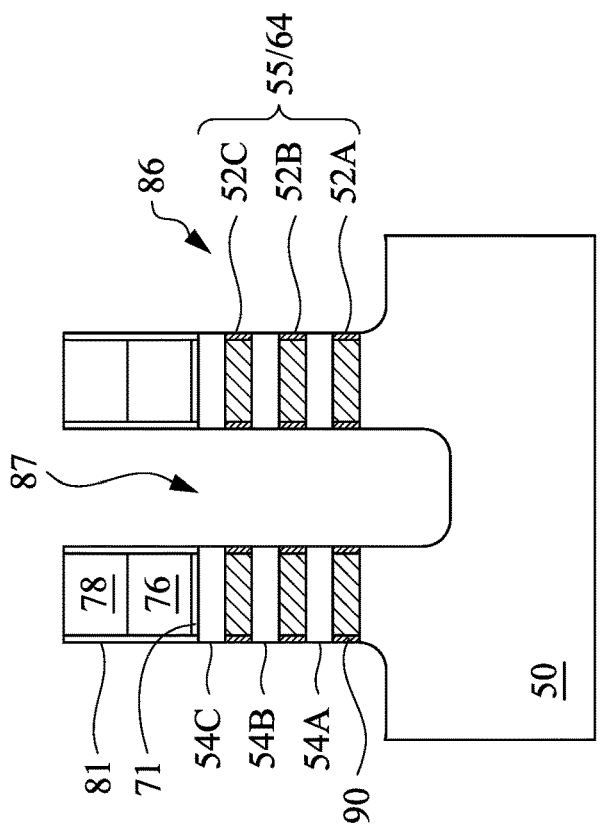
Figure 11D:
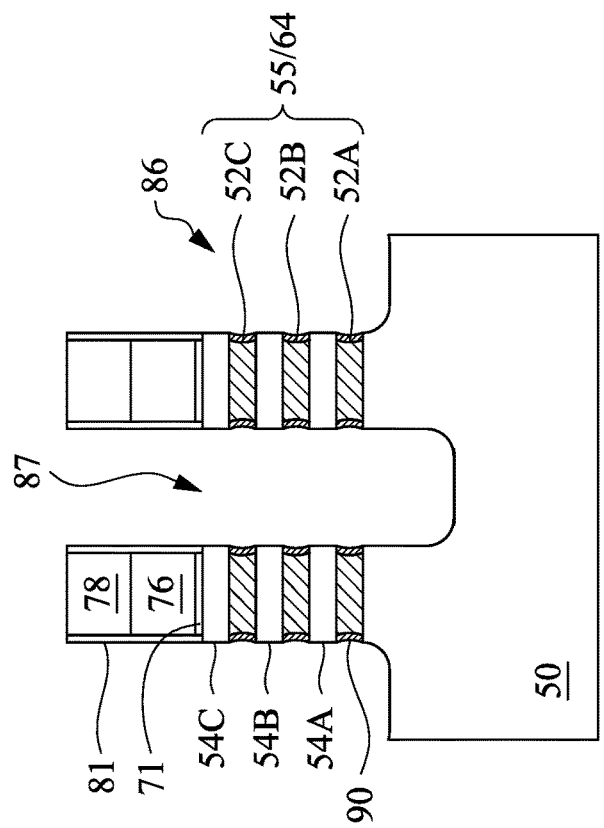

Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

In FIGS. 12A through 12E, first epitaxial materials 91 are formed in the second recesses 87 and epitaxial source/drain regions 92 are formed in the first recesses 86 and the second recesses 87. In some embodiments, the first epitaxial materials 91 may be sacrificial materials, which are subsequently removed to form back-side vias (such as the back-side vias 130, discussed below with respect to FIGS. 30A through 30D). As illustrated in FIGS. 12B through 12E, top surfaces of the first epitaxial materials 91 may be level with bottom surfaces of the first recesses 86. However, in some embodiments, top surfaces of the first epitaxial materials 91 may be disposed above or below bottom surfaces of the first recesses 86. The first epitaxial materials 91 may be epitaxially grown in the second recesses 87 using a process such as chemical vapor deposition (CVD), atomic layer deposition (ALD), vapor phase epitaxy (VPE), molecular beam epitaxy (MBE), or the like. The first epitaxial materials 91 may include any acceptable material, such as silicon germanium or the like. The first epitaxial materials 91 may be formed of materials having high etch selectivity to materials of the epitaxial source/drain regions 92, the substrate 50, and dielectric layers (such as the STI regions 68 and second dielectric layers 125, discussed below with respect to FIGS. 24A through 24C). As such, the first epitaxial materials 91 may be removed and replaced with the back-side vias without significantly removing the epitaxial source/drain regions 92 and the dielectric layers.

Figure 12B:
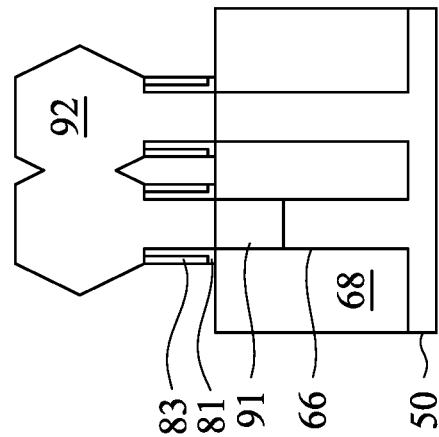

The epitaxial source/drain regions 92 are then formed in the first recesses 86 and over the first epitaxial materials 91 in the second recesses 87. In some embodiments, the epitaxial source/drain regions 92 may exert stress on the second nanostructures 54, thereby improving performance. As illustrated in FIG. 12C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 12B. In other embodiments, adjacent epitaxial source/drain regions 92 remain separated after the epitaxy process is completed as illustrated by FIG. 12D. In the embodiments illustrated in FIGS. 12B and 12D, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12A:
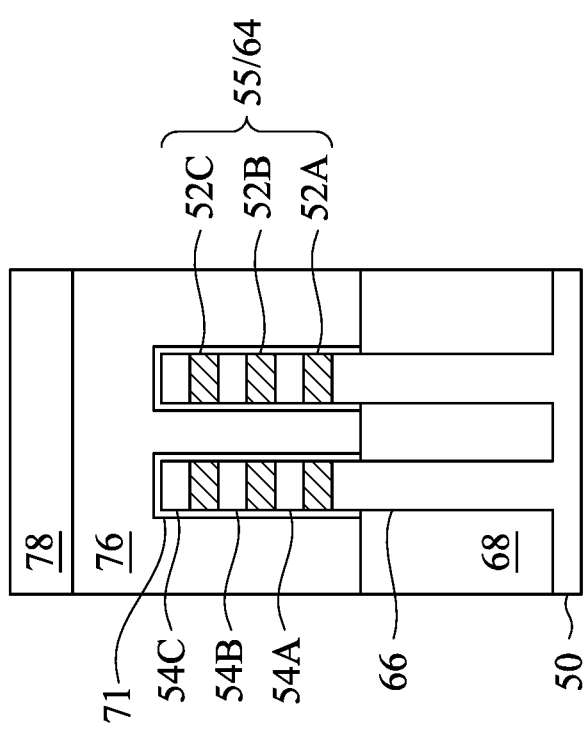
Figure 12D:
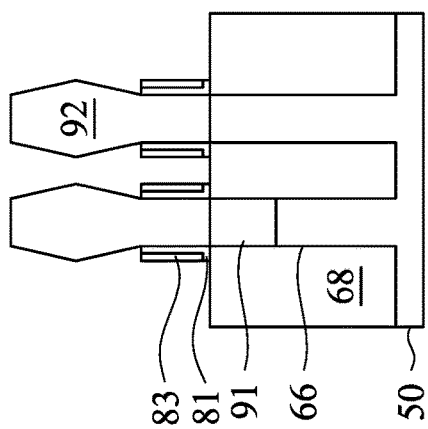
Figure 12C:
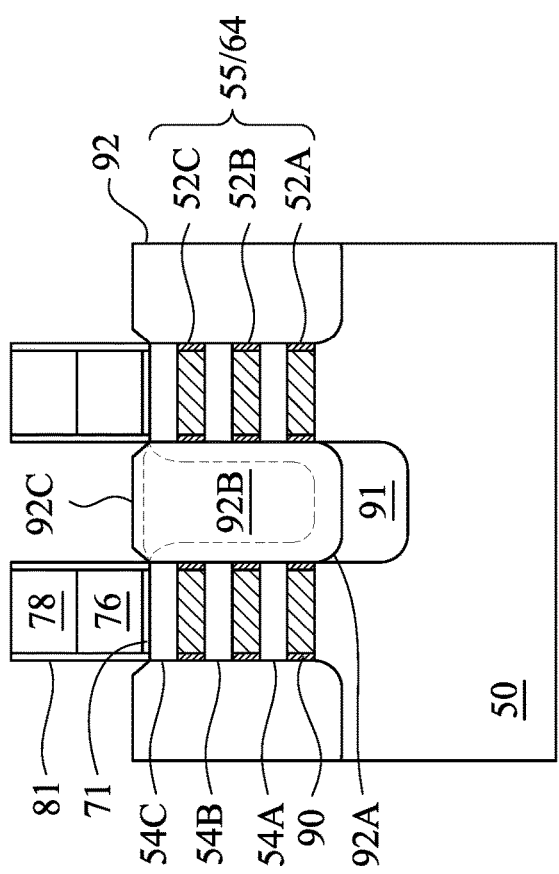
Figure 12E:
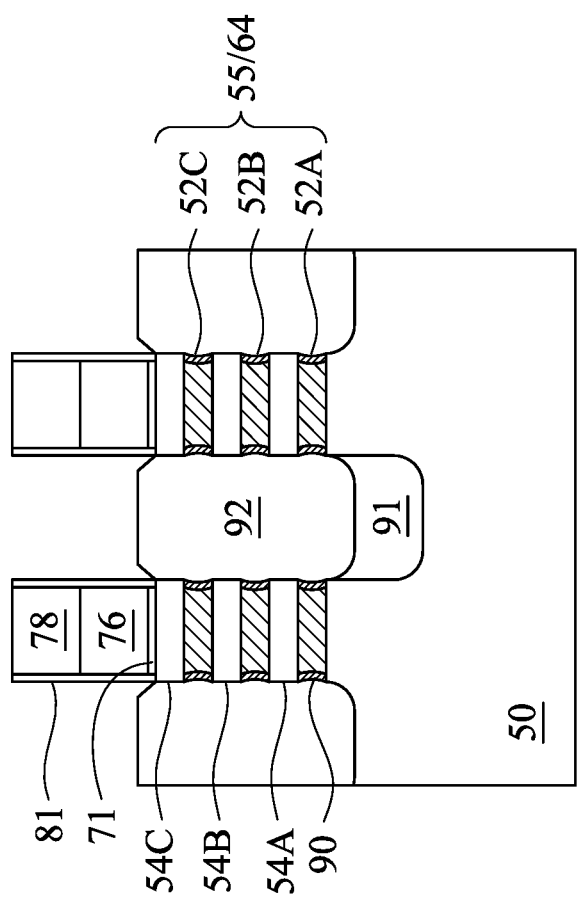

FIG. 12E illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12E, the epitaxial source/drain regions 92 may be formed in contact with the first inner spacers 90 and may extend past sidewalls of the second nanostructures 54.

Figure 13B:
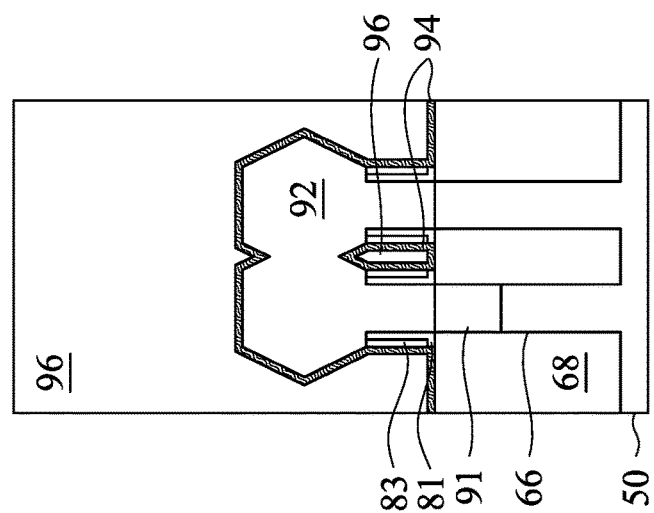
Figure 13A:
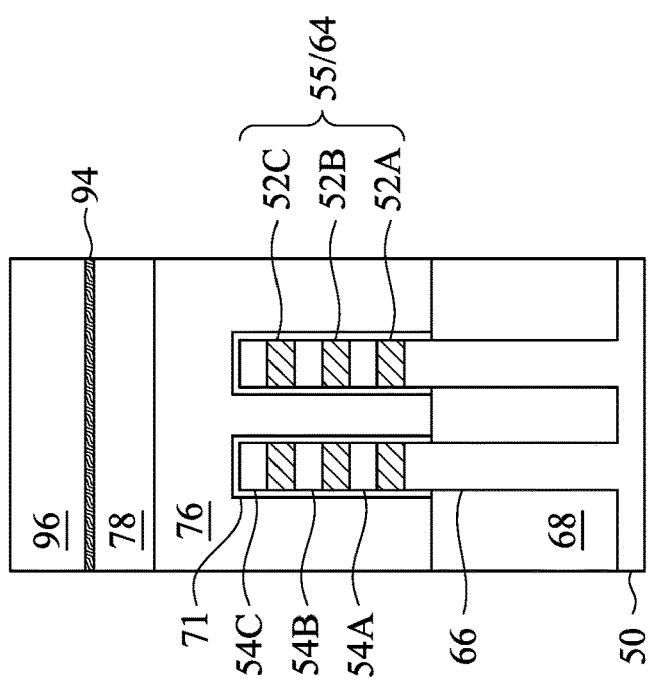
Figure 13C:
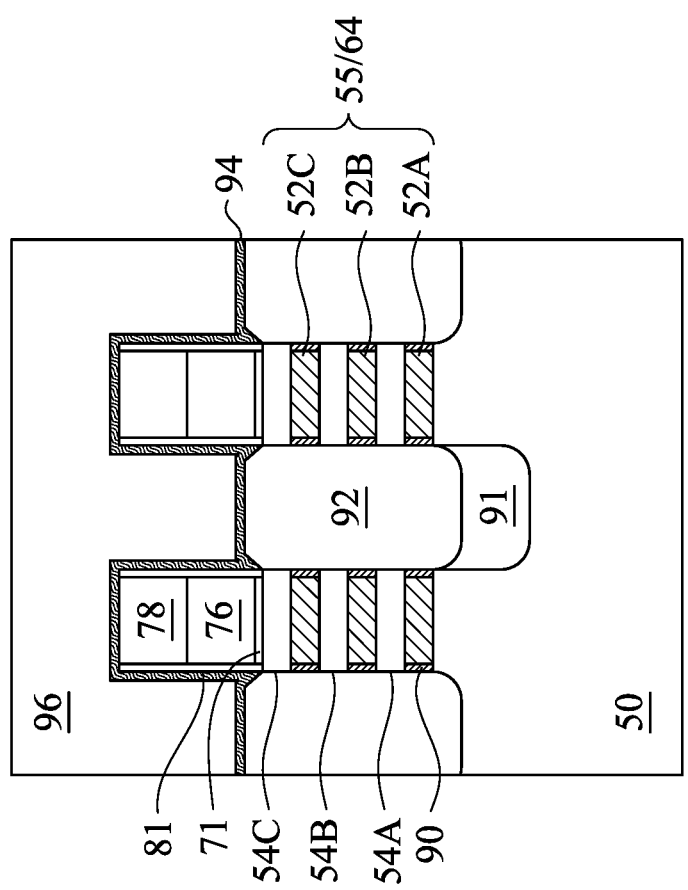

In FIGS. 13A through 13C, a first interlayer dielectric (ILD) 96 is deposited over the structure illustrated in FIGS. 12A through 12C. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14B:
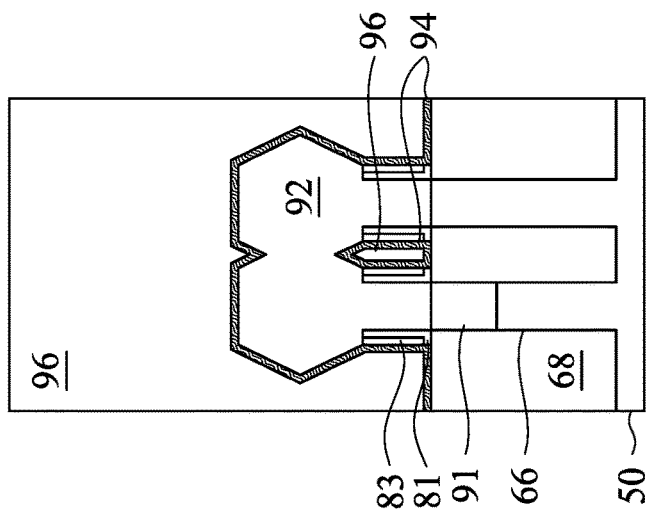
Figure 14A:
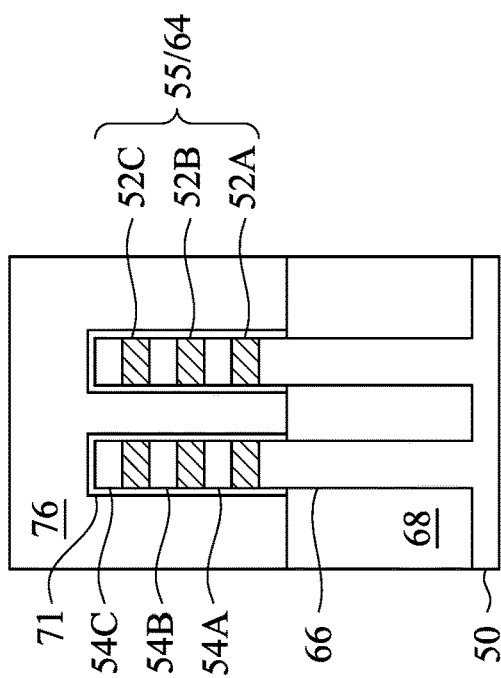
Figure 14C:
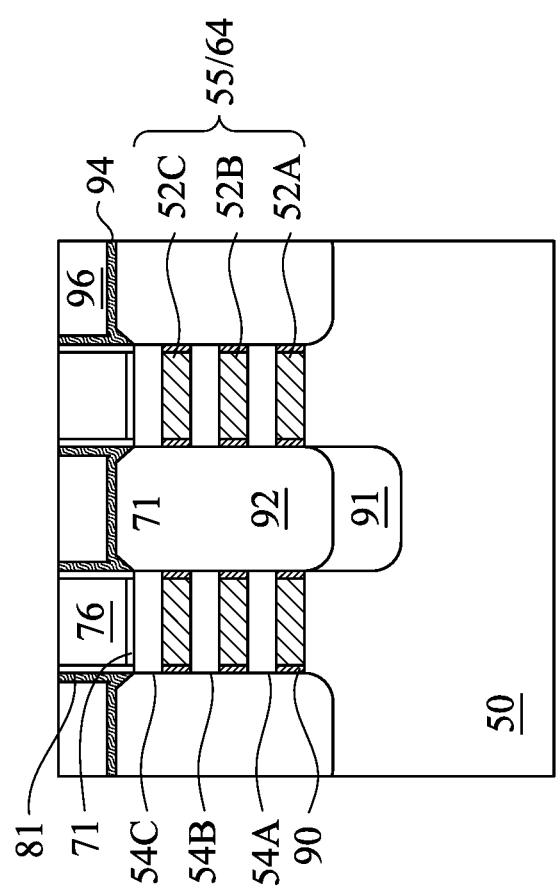

In FIGS. 14A through 14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15B:
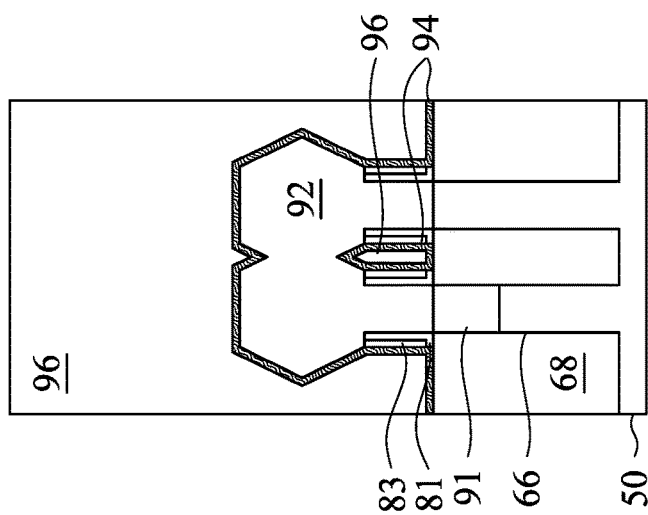
Figure 15A:
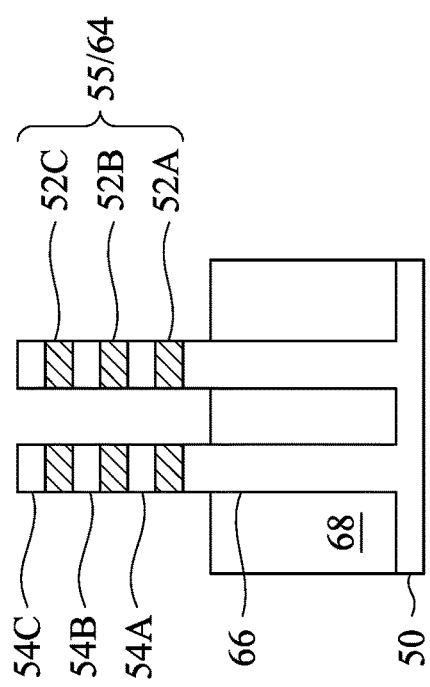
Figure 15C:
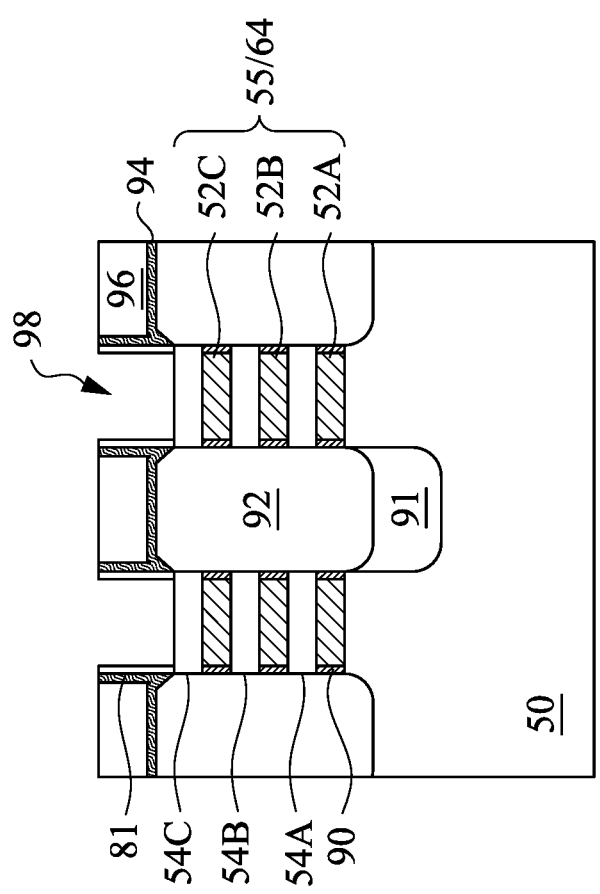

In FIGS. 15A through 15C, the dummy gates 76, and the masks 78 if present, are removed in one or more etching steps, so that third recesses 98 are formed. Portions of the dummy gate dielectrics 71 in the third recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76

Figure 16B:
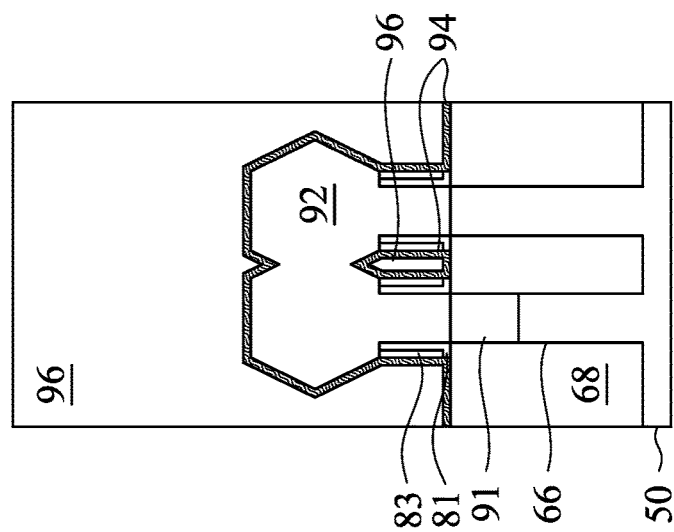
Figure 16A:
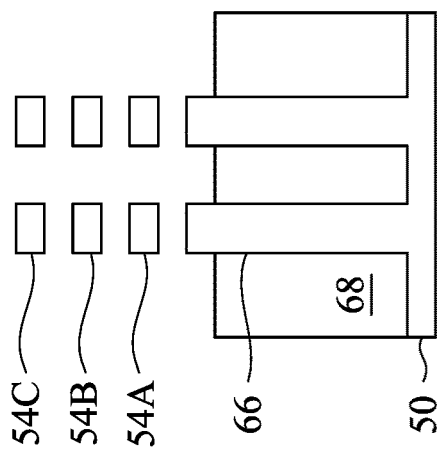
Figure 16C:
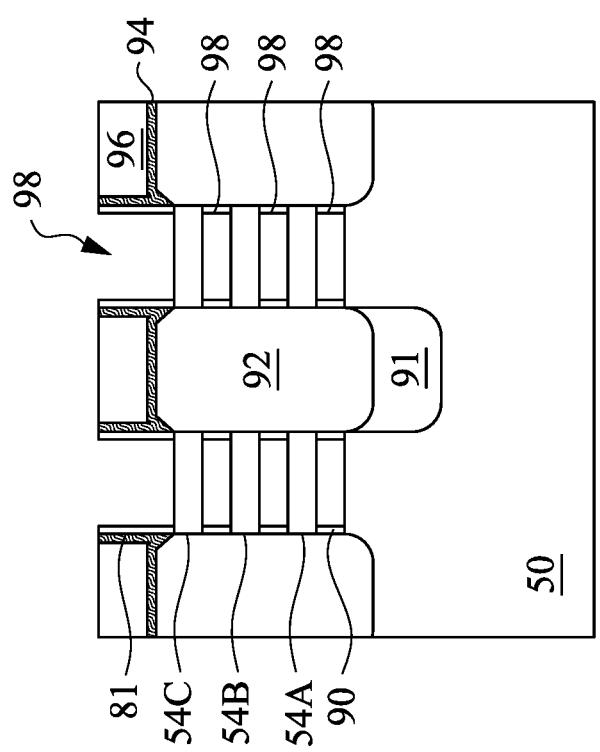

In FIGS. 16A through 16C, the first nanostructures 52 are removed extending the third recesses 98. The first nanostructures 52 may be removed by performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52.

Figure 17B:
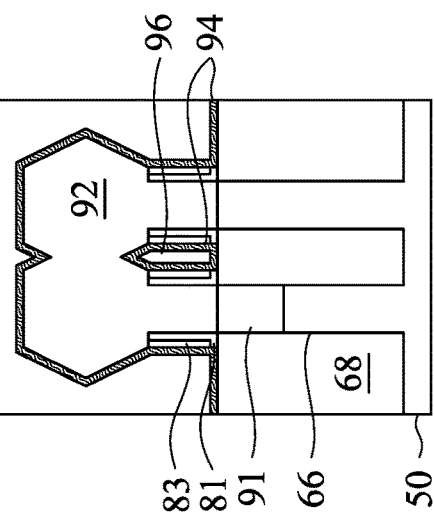
Figure 17A:
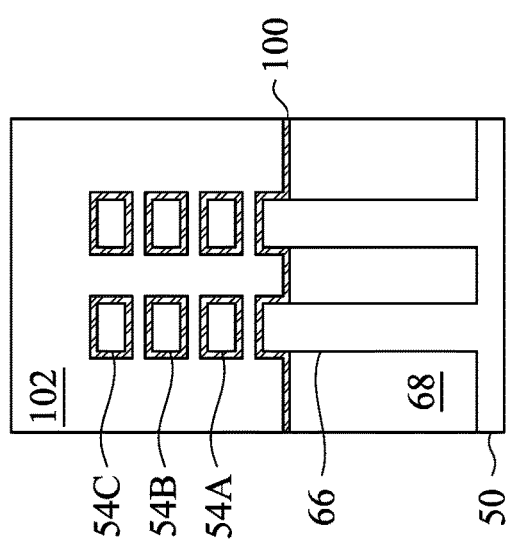
Figure 17C:
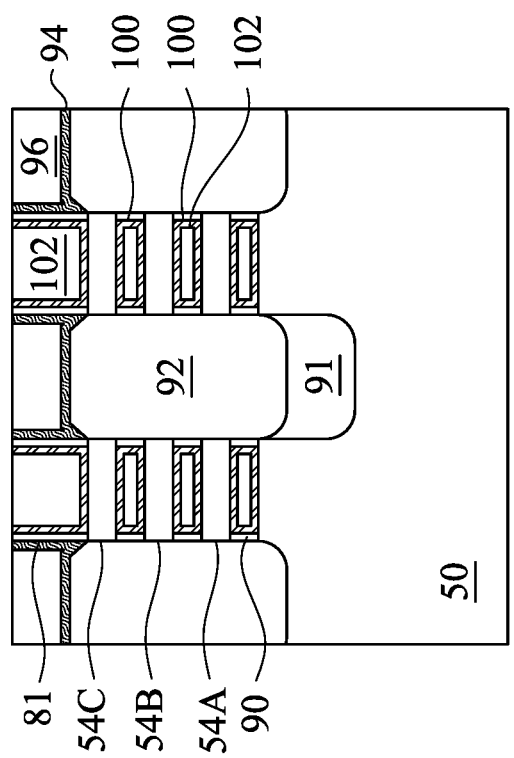

In FIGS. 17A through 17C, gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first spacers 81 and the first inner spacers 90.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18B:
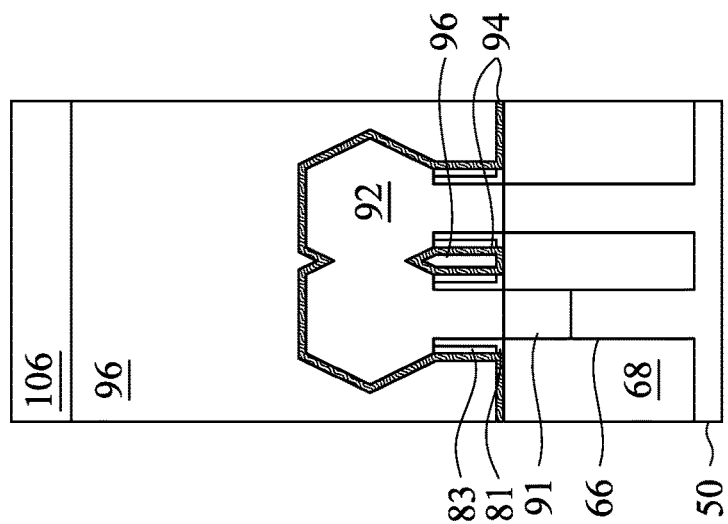
Figure 18A:
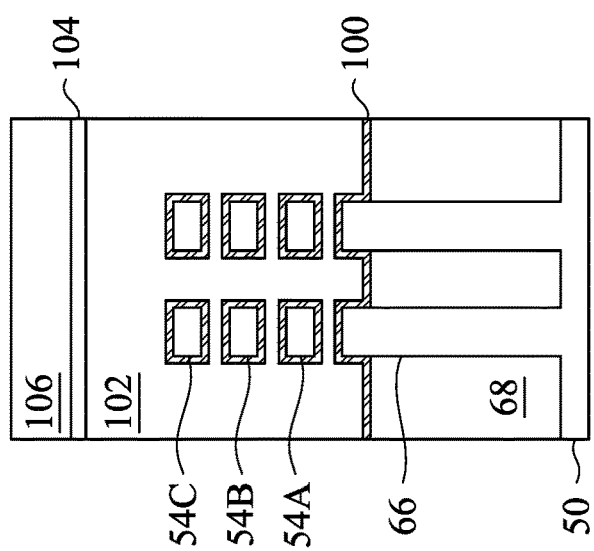
Figure 18C:
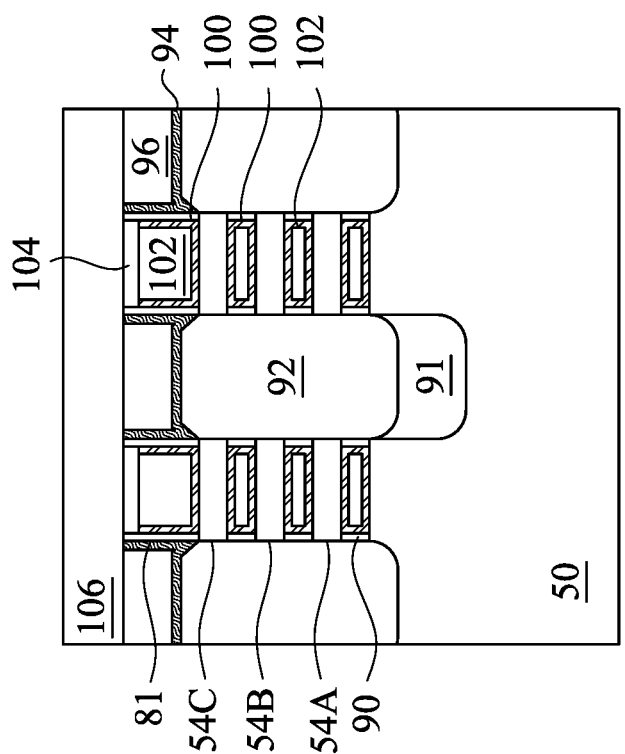

In FIGS. 18A through 18C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 20A through 20C) penetrate through the gate masks 104 to contact the top surfaces of the recessed gate electrodes 102.

As further illustrated by FIGS. 18A through 18C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19C:
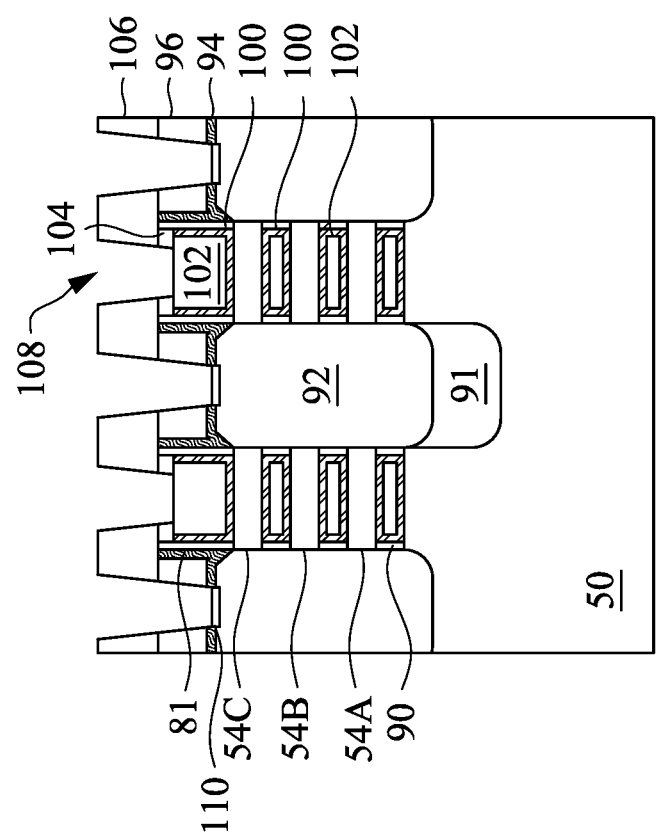

In FIGS. 19A through 19C, the second ILD 106, the first ILD 96, the CESL 94, and the gate masks 104 are etched to form fourth recesses 108 exposing surfaces of the epitaxial source/drain regions 92 and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the epitaxial source/drain regions 92 and/or the gate structures, and a bottom of the fourth recesses 108 may be level with (e.g., at a same level, or having a same distance from the substrate 50), or lower than (e.g., closer to the substrate 50) the epitaxial source/drain regions 92 and/or the gate structures. Although FIG. 19C illustrates the fourth recesses 108 as exposing the epitaxial source/drain regions 92 and the gate structures in a same cross-section, in various embodiments, the epitaxial source/drain regions 92 and the gate structures may be exposed in different cross-sections, thereby reducing the risk of shorting subsequently formed contacts.

After the fourth recesses 108 are formed, first silicide regions 110 are formed over the epitaxial source/drain regions 92. In some embodiments, the first silicide regions 110 are formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the first silicide regions 110. The un-reacted portions of the deposited metal are then removed, e.g., by an etching process. Although the first silicide regions 110 are referred to as silicide regions, the first silicide regions 110 may also be germanide regions, or silicon germanide regions (e.g., regions comprising silicide and germanide). In an embodiment, the first silicide regions 110 comprise TiSi and has a thickness in a range between about 2 nm and about 10 nm.

Figure 20B:
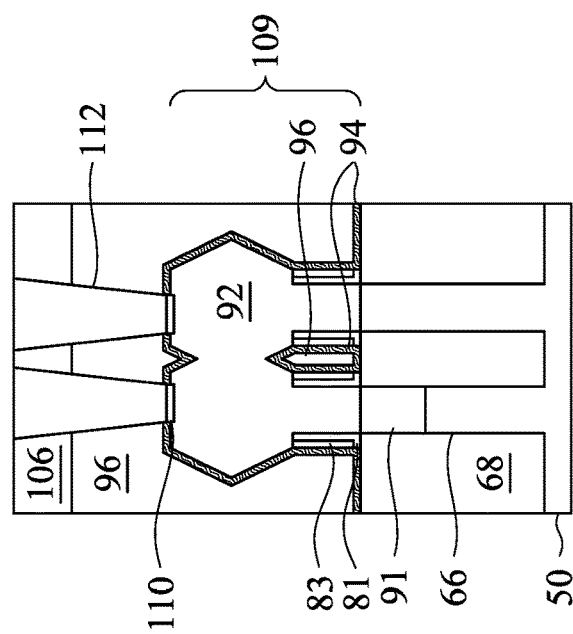
Figure 20A:
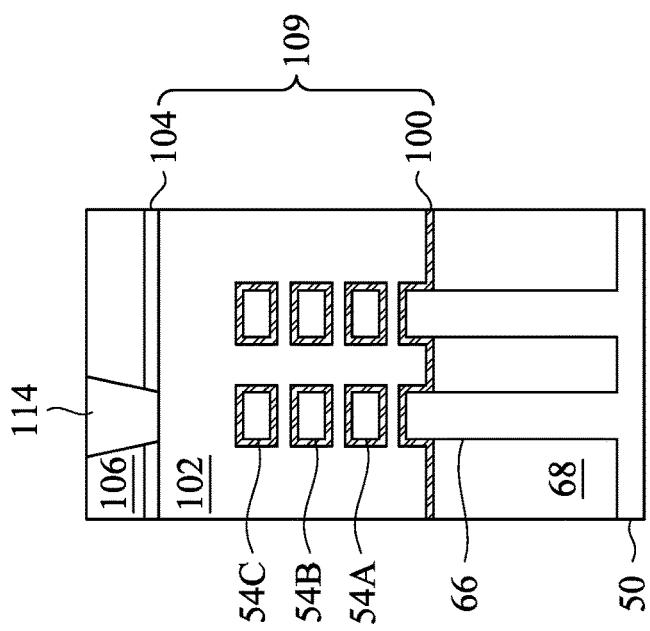
Figure 20C:
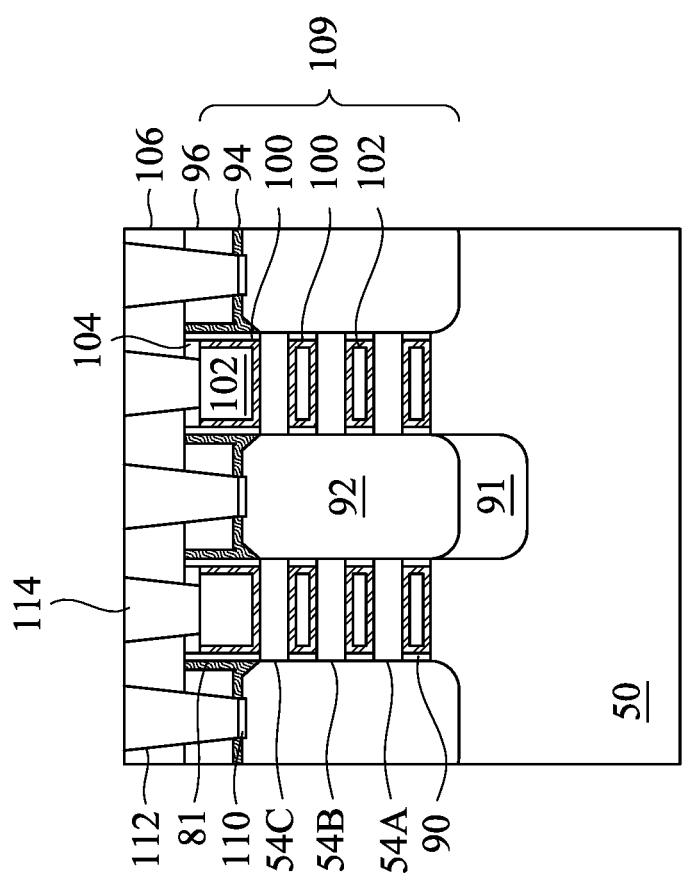

In FIGS. 20A through 20C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically coupled to an underlying conductive feature (e.g., a gate electrode 102 and/or a first silicide region 110). The gate contacts 114 are electrically coupled to the gate electrodes 102 and the source/drain contacts 112 are electrically coupled to the first silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The epitaxial source/drain regions 92, the second nanostructures 54, and the gate structures (including the gate dielectric layers 100 and the gate electrodes 102) may collectively be referred to as transistor structures 109. The transistor structures 109 may be formed in a device layer, with a first interconnect structure (such as the front-side interconnect structure 120, discussed below with respect to FIGS. 21A through 21C) being formed over a front-side thereof and a second interconnect structure (such as the back-side interconnect structure 136, discussed below with respect to FIGS. 32A through 32C) being formed over a back side thereof. Although the device layer is described as having nano-FETs, other embodiments may include a device layer having different types of transistors (e.g., planar FETs, finFETs, thin film transistors (TFTs), or the like).

Although FIGS. 20A through 20C illustrate a source/drain contact 112 extending to each of the epitaxial source/drain regions 92, the source/drain contacts 112 may be omitted from certain ones of the epitaxial source/drain regions 92. For example, as explained in greater detail below, conductive features (e.g., back-side vias or power rails) may be subsequently attached through a back side of one or more of the epitaxial source/drain regions 92. For these particular epitaxial source/drain regions 92, the source/drain contacts 112 may be omitted or may be dummy contacts that are not electrically connected to any overlying conductive lines (such as the first conductive features 122, discussed below with respect to FIGS. 21A through 21C).

FIGS. 21A through 36C illustrate intermediate steps of forming front-side interconnect structures and back-side interconnect structures on the transistor structures 109, including intermediate steps of using ion implantation combined with annealing, according to some embodiments. The front-side interconnect structures and the back-side interconnect structures may each comprise conductive features that are electrically connected to the nano-FETs formed on the substrate 50. The process steps described in FIGS. 21A through 36C may be applied to both the n-type region 50N and the p-type region 50P. As noted above, a back-side conductive feature (e.g., a back-side via or a power rail) may be connected to one or more of the epitaxial source/drain regions 92. As such, the source/drain contacts 112 may be optionally omitted from the epitaxial source/drain regions 92.

Figure 21B:
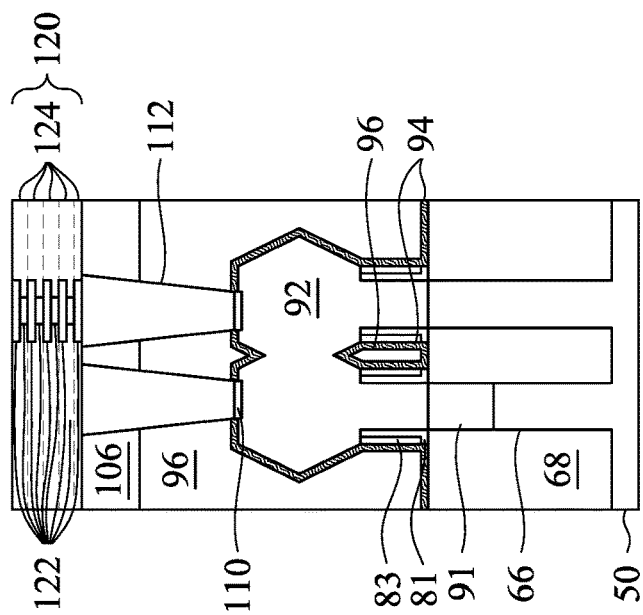
Figure 21A:
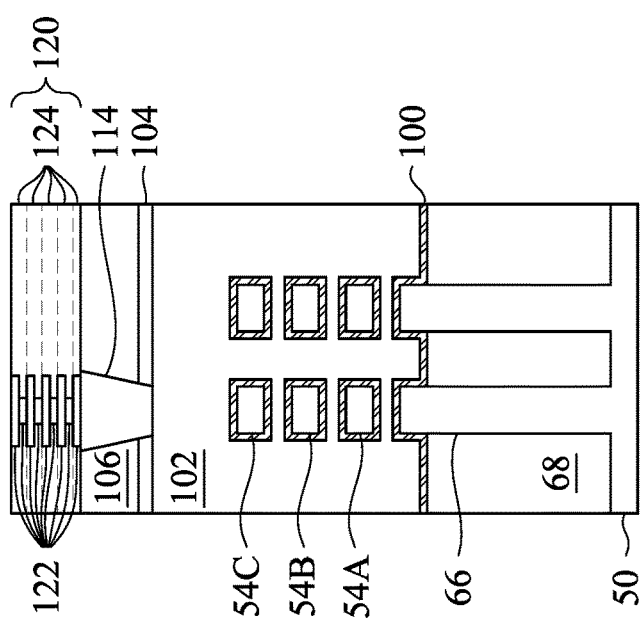
Figure 21C:
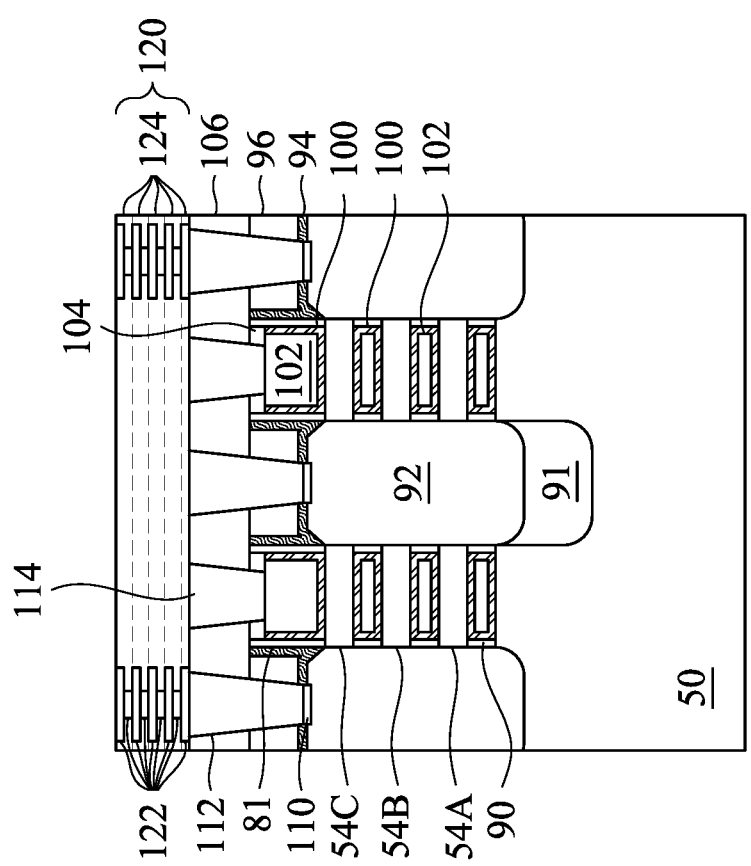

In FIGS. 21A through 21C, a front-side interconnect structure 120 is formed on the second ILD 106. The front-side interconnect structure 120 may be referred to as a front-side interconnect structure because it is formed on a front side of the substrate 50 (e.g., a side of the substrate 50 on which active devices such as the transistor structures 109 are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

FIGS. 21A through 21C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 22B:
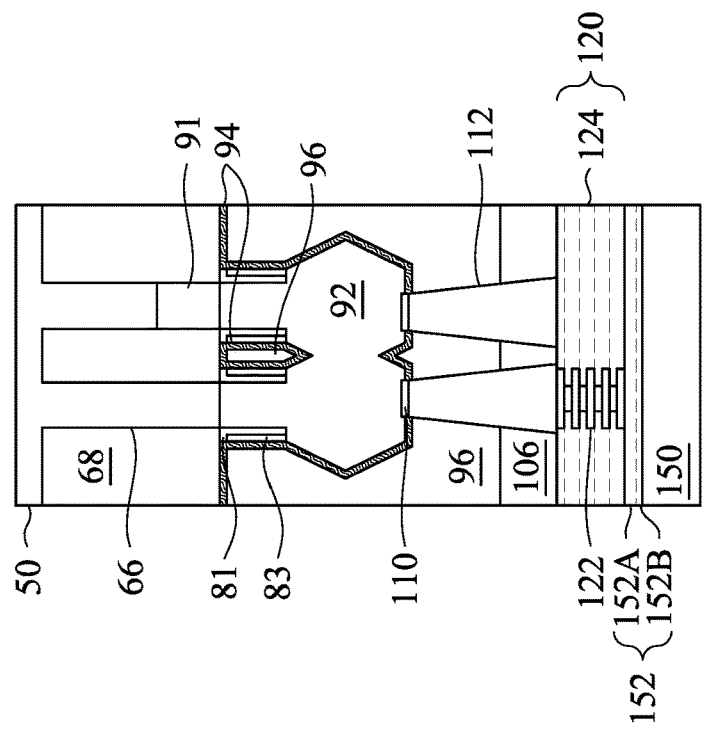
Figure 22A:
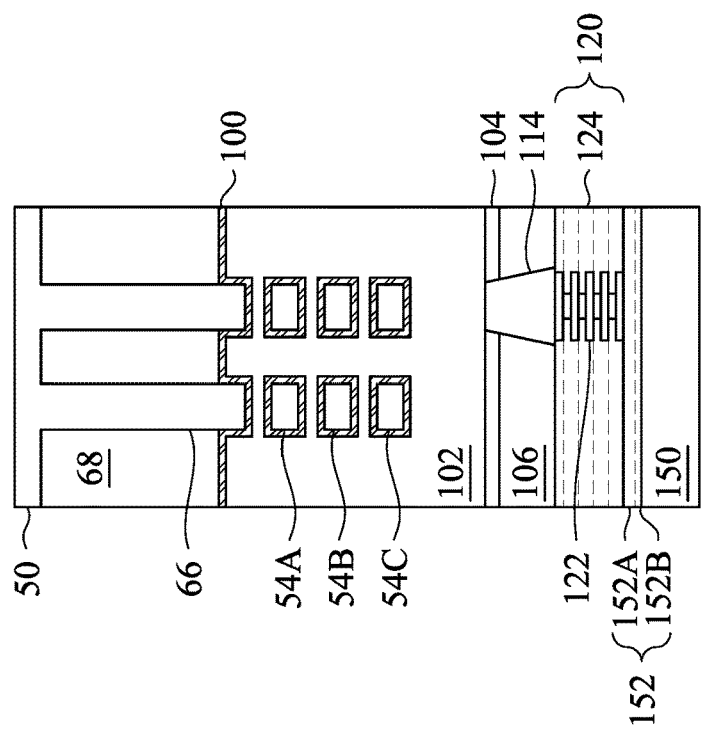
Figure 22C:
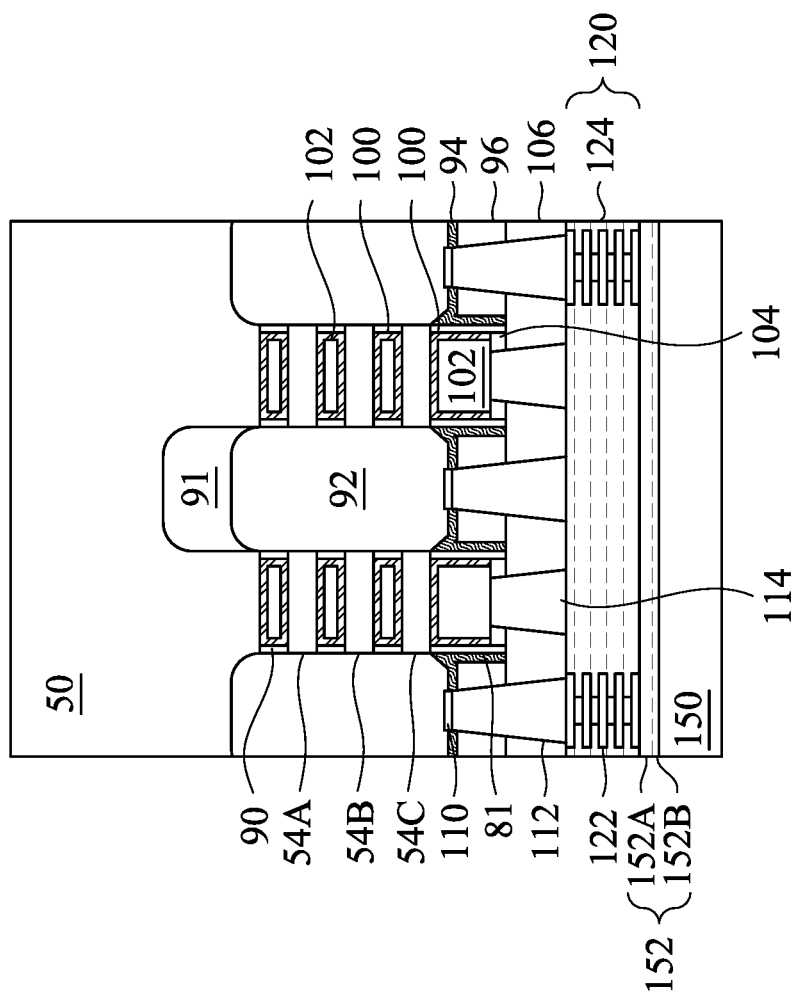

In FIGS. 22A through 22C, a carrier substrate 150 is bonded to a top surface of the front-side interconnect structure 120 by a first bonding layer 152A and a second bonding layer 152B (collectively referred to as a bonding layer 152). The carrier substrate 150 may be a glass carrier substrate, a ceramic carrier substrate, a wafer (e.g., a silicon wafer), or the like. The carrier substrate 150 may provide structural support during subsequent processing steps and in the completed device.

In various embodiments, the carrier substrate 150 may be bonded to the front-side interconnect structure 120 using a suitable technique, such as dielectric-to-dielectric bonding, or the like. The dielectric-to-dielectric bonding may comprise depositing the first bonding layer 152A on the front-side interconnect structure 120. In some embodiments, the first bonding layer 152A comprises silicon oxide (e.g., a high density plasma (HDP) oxide, or the like) that is deposited by CVD, ALD, PVD, or the like. The second bonding layer 152B may likewise be an oxide layer that is formed on a surface of the carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 120 and the two are pressed against each other to initiate a pre-bonding of the carrier substrate 150 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 150 to a temperature of about 150° C. to about 400° C.

Further in FIGS. 22A through 22C, after the carrier substrate 150 is bonded to the front-side interconnect structure 120, the device may be flipped such that a back side of the transistor structures 109 faces upwards. The back side of the transistor structures 109 may refer to a side opposite to the front side of the substrate 50 on which the active devices are formed.

Figure 23B:
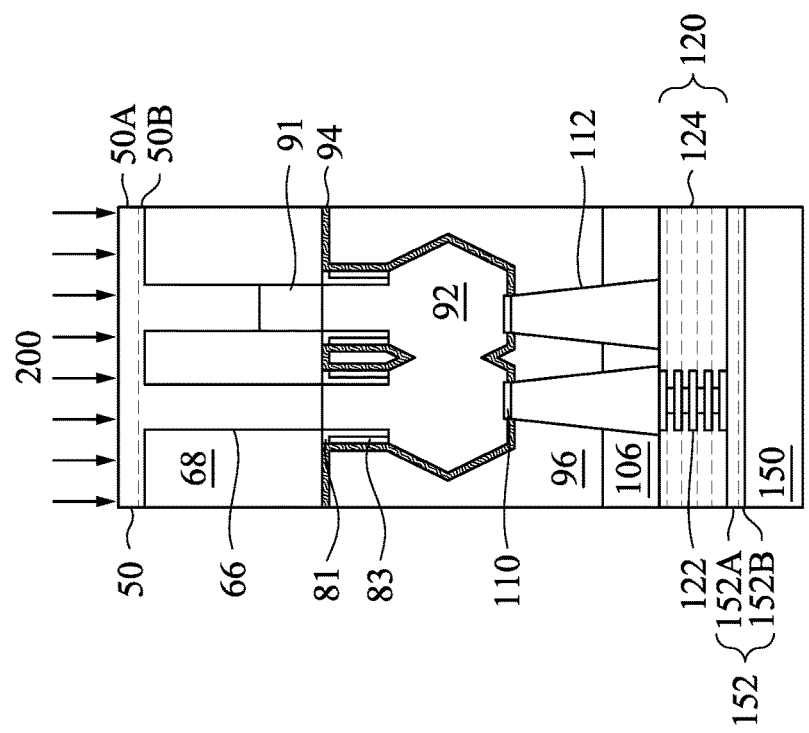
Figure 23A:
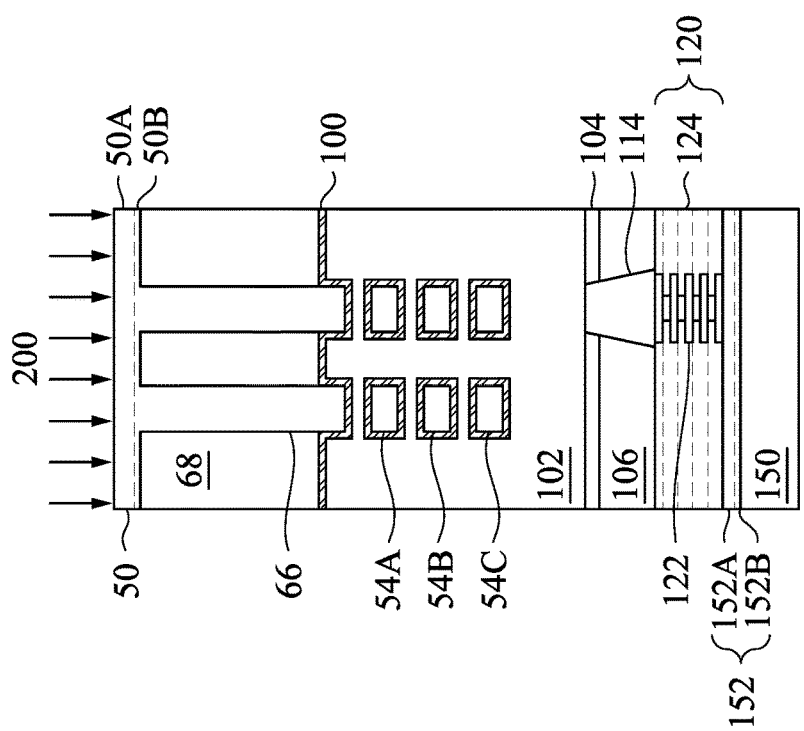
Figure 23C:
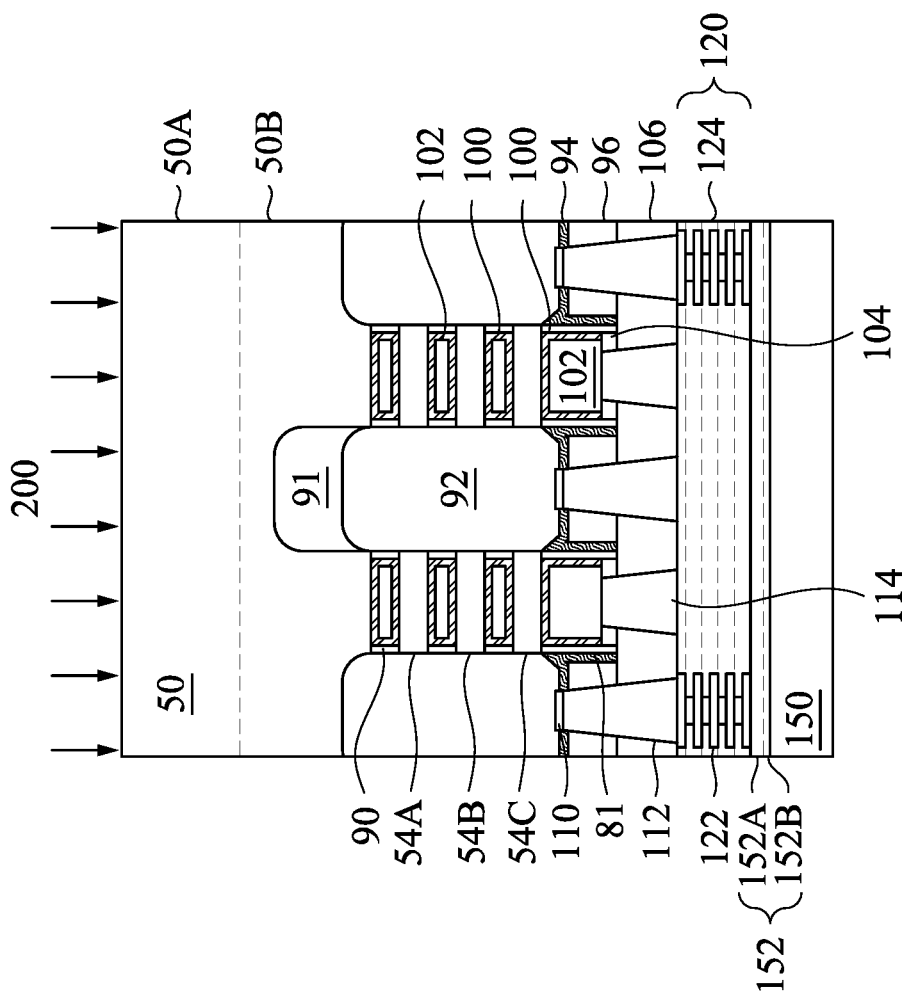

In FIGS. 23A through 23C, ions are implanted into the semiconductor substrate 50 through a back side of the semiconductor substrate 50 to form an implantation region 50A of the substrate 50. Before implanting the ions, a thinning process may be applied to the back side of the substrate 50. The thinning process may comprise a planarization process (e.g., a mechanical grinding, a CMP, or the like), an etch-back process, a combination thereof, or the like. The thinning process may reduce the thickness of the substrate 50 to between 3 μm to 5 μm. The thickness of the substrate 50 may be a distance between the top surface of the substrate 50 and a top surface of the STI regions 68.

After the thinning process, a plasma process may be performed, for example, by applying an ion gas 200 to the top surface of the substrate 50 to implant the ions into the implantation region 50A of the substrate 50. The ion gas 200 may include hydrogen ions or a mixture of hydrogen ions and helium ions. If the ion gas 200 includes the mixture of hydrogen ions and helium ions, a ratio between the hydrogen ions and the helium ions dosage in the mixture may be about 4:6, which can save about 60% to 70% of implantation dosage as compared to the embodiments where the ion gas 200 includes hydrogen ions only. The implantation density for applying the ion gas may be between $10^{16}$ atoms/cm$^3$ and $10^{17}$ atoms/cm$^3$. In some embodiments, if the ion gas 200 includes hydrogen ions only, the implantation density for applying the hydrogen ions may be between $3e^{16}$ atoms/cm$^3$ and $9e^{16}$ atoms/cm$^3$ (e.g., $6e^{16}$ atoms/cm$^3$). In some embodiments, if the ion gas 200 includes the mixture of hydrogen ions and helium ions, the implantation density for applying the hydrogen ions may be between $3.6e^{15}$ atoms/cm$^3$ and $10.8e^{15}$ atoms/cm$^3$ (e.g., $7.2e^{15}$ atoms/cm$^3$), and the implantation density for applying the helium ions may be between $0.6e^{16}$ atoms/cm$^3$ and $1.6e^{16}$ atoms/cm$^3$ (e.g., $1.1e^{6}$ atoms/cm$^3$). After the implantation, the substrate 50 may include the implantation region 50A and a remainder region 50B. The remainder region 50B may be substantially free of ions from the ion gas 200. The thickness of the remainder region 50B of the substrate 50 may be between 10 nm and 50 nm. In some embodiments, to help achieve the desired thickness of the remainder region 50B, the applied implantation energy may be significantly more than 10 kiloelectronvolts (keV). For example, the applied implantation energy may be more than 1 megaelectronvolts (MeV).

Figure 24B:
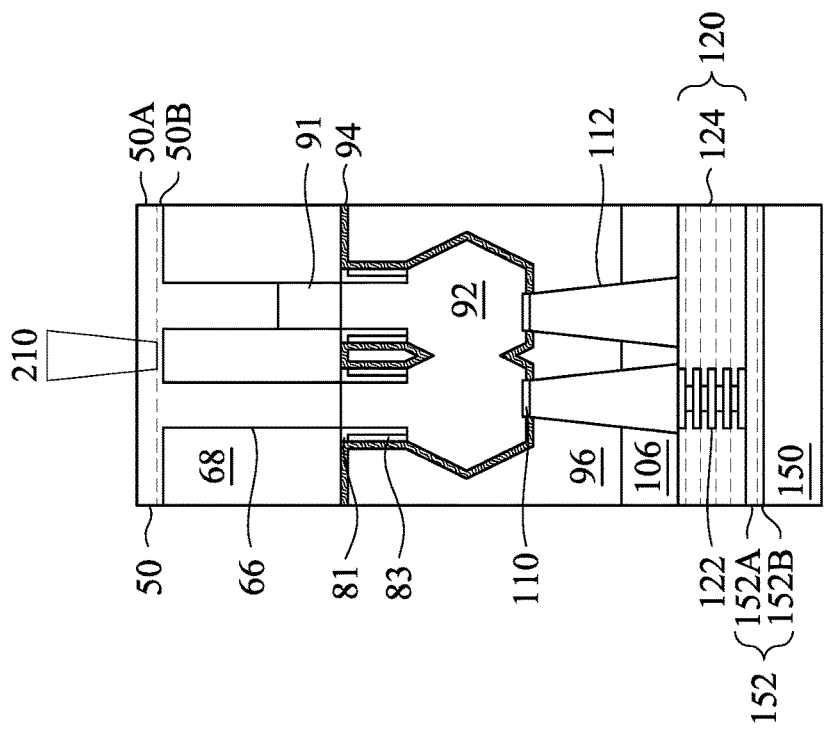
Figure 24A:
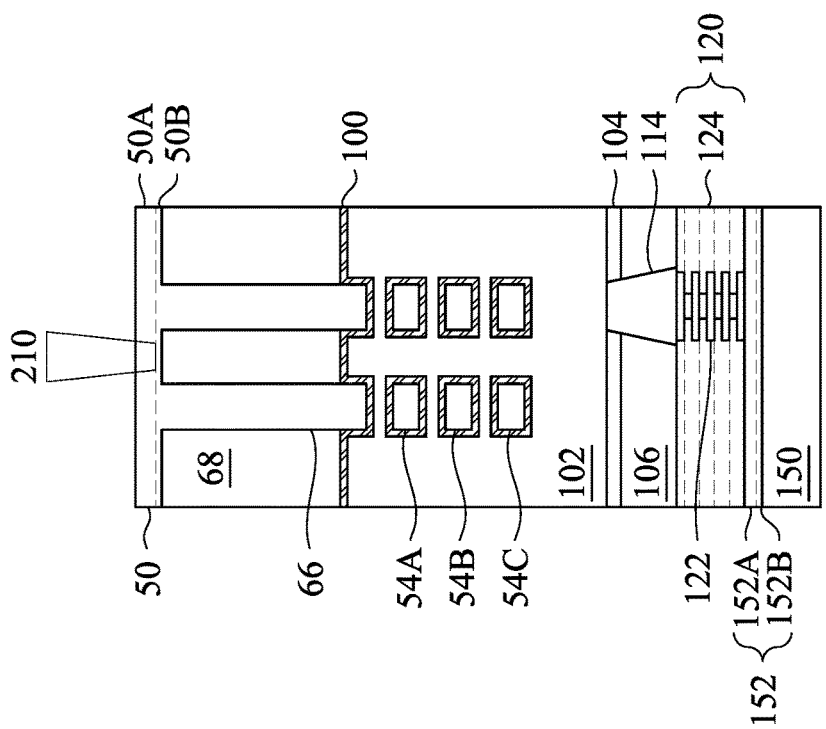
Figure 24C:
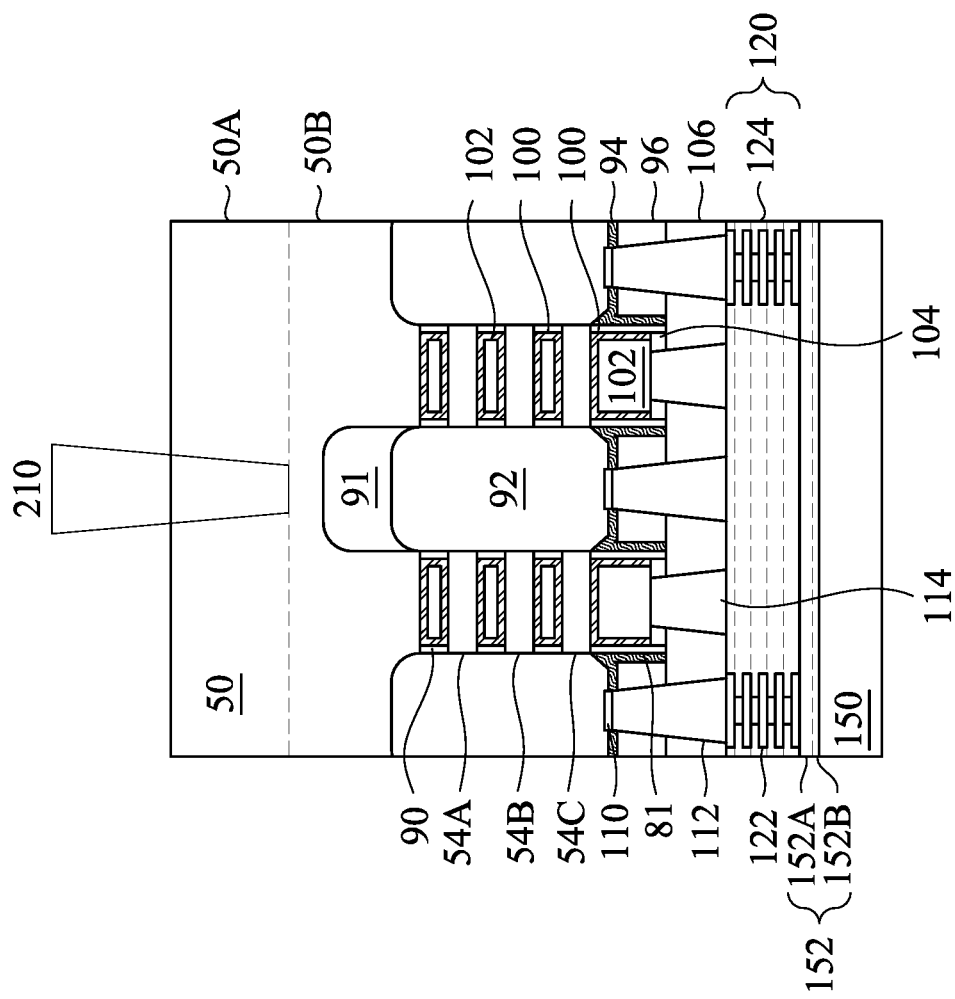
Figure 25A:
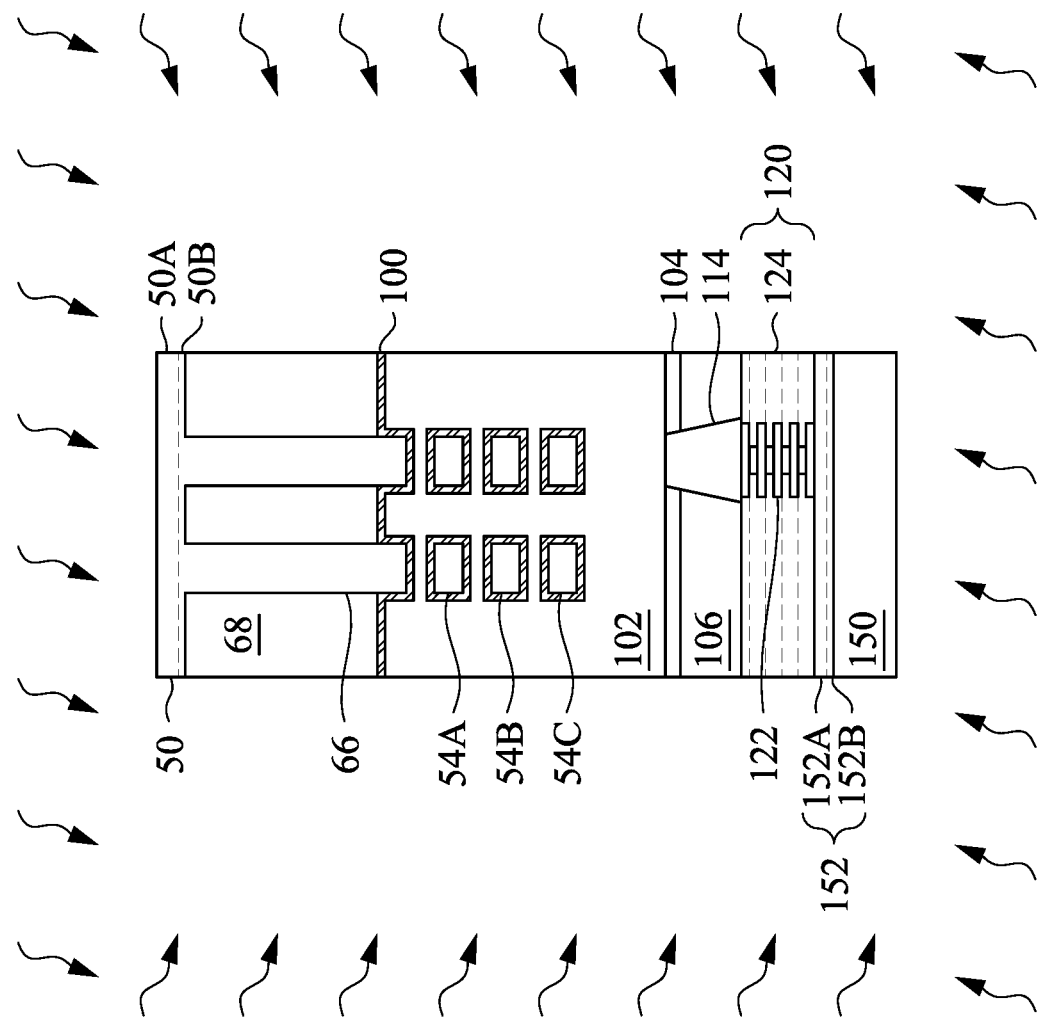
Figure 25B:
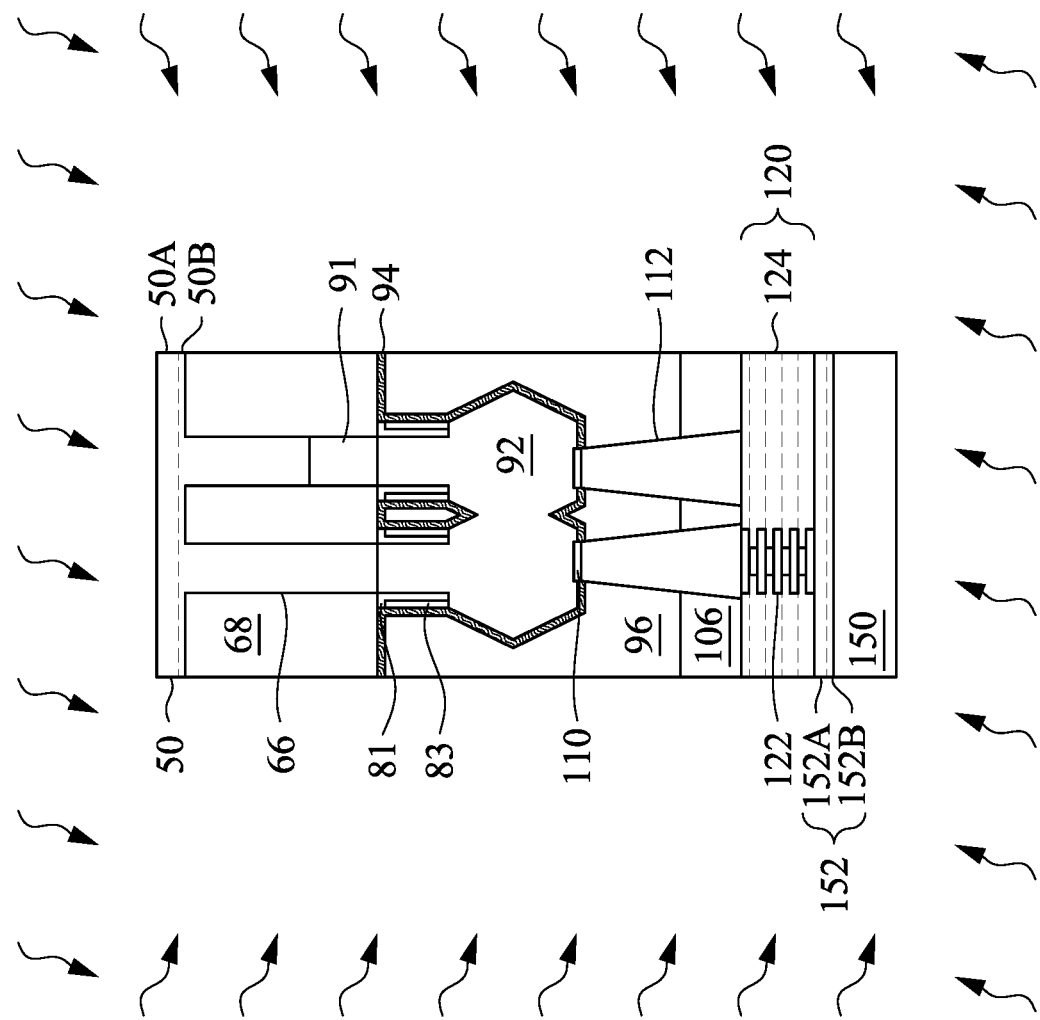
Figure 25C:
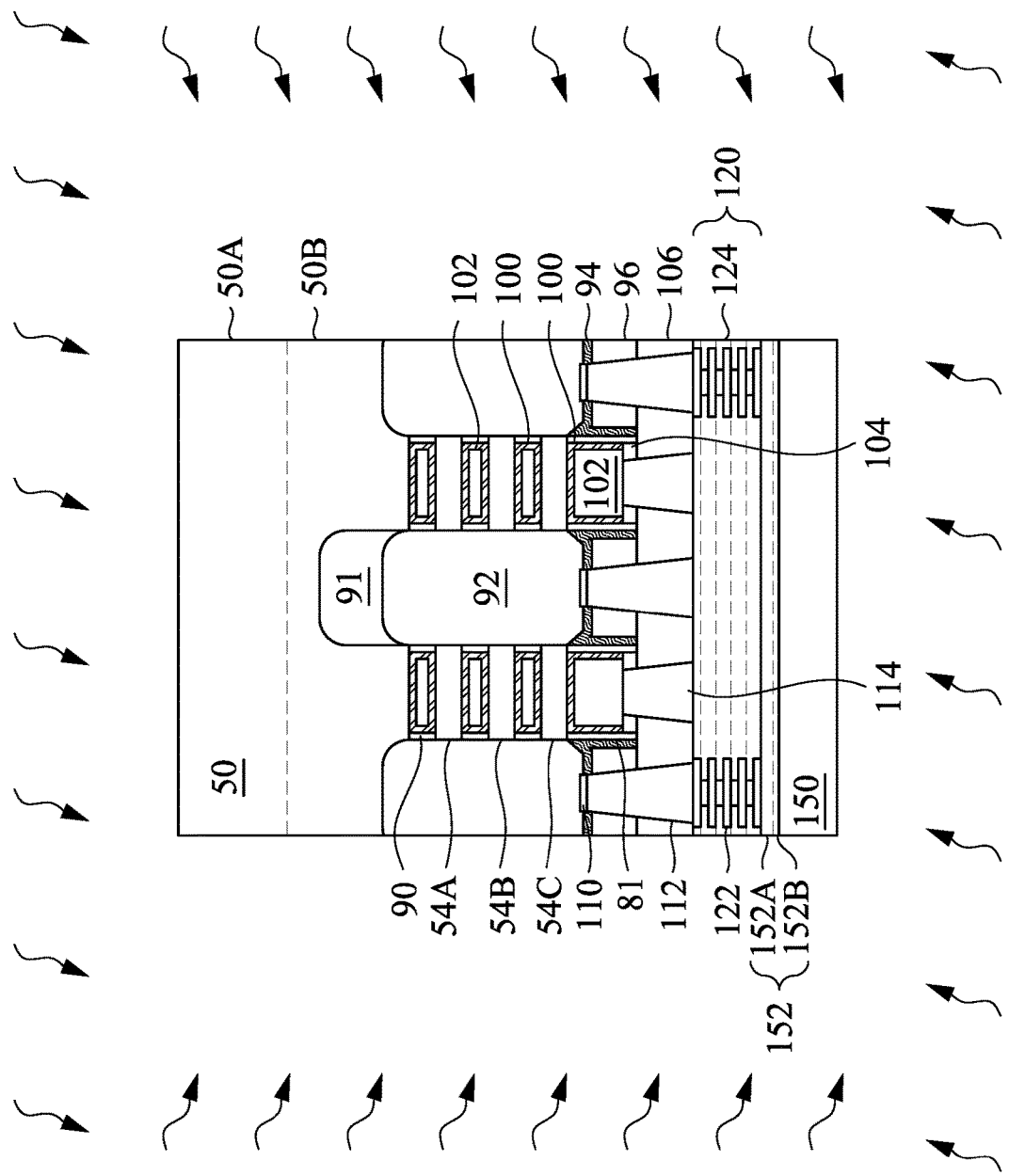

After the implantation, an annealing process may be applied to separate the implantation region 50A from the remainder region 50B of the substrate 50. FIGS. 24A through 24C illustrate an annealing process by applying a pulsed laser 210 in the implantation region 50A of the semiconductor substrate 50. The wavelength, the power, and the pulsed duration of the pulsed laser 210 may be adjusted such that the energy density of the pulsed laser may be at least 600 milliJoule (mJ)/cm$^2$ and the maximum device temperature of the semiconductor device during the annealing process may be at most 400° C. FIGS. 25A through 25C illustrate another annealing process by using a furnace to heat the semiconductor device. An anneal temperature of the furnace may be in a range of 300° C. to 400° C.

Figure 26B:
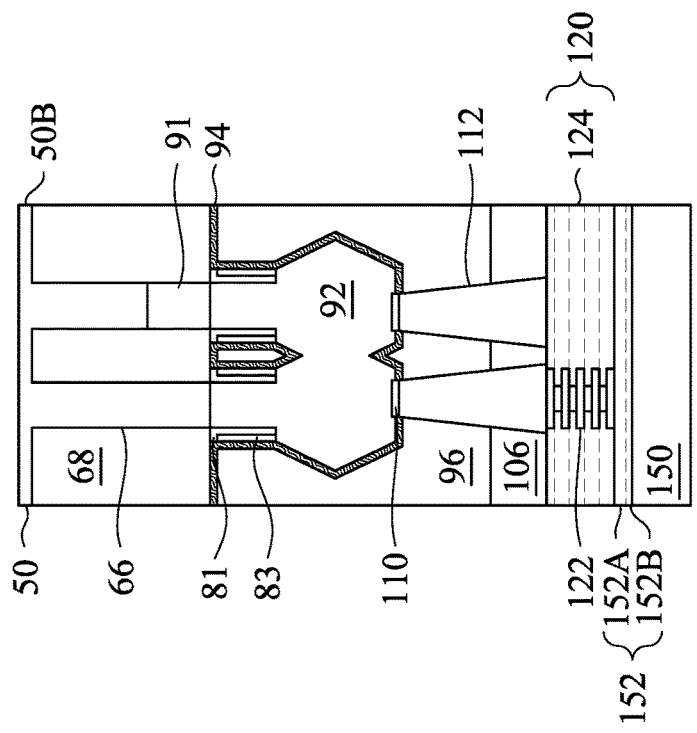
Figure 26A:
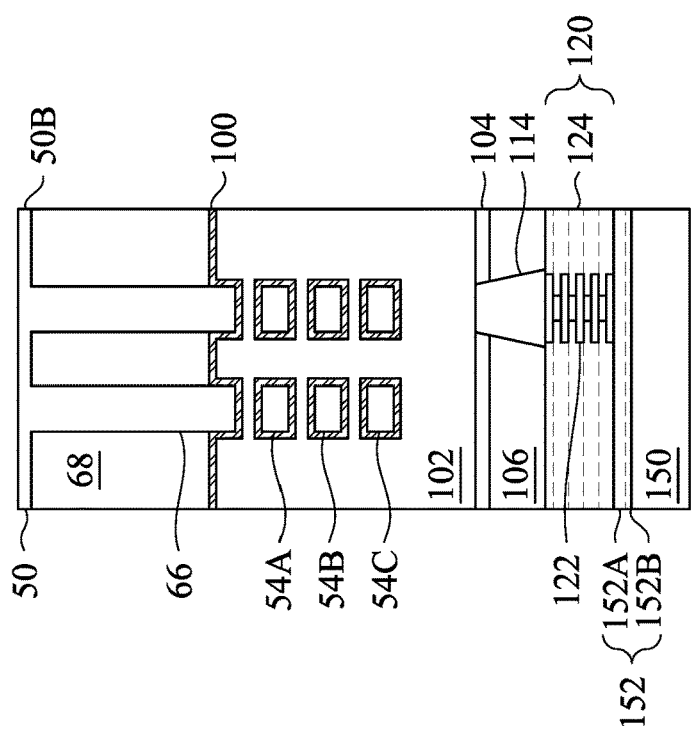
Figure 26C:
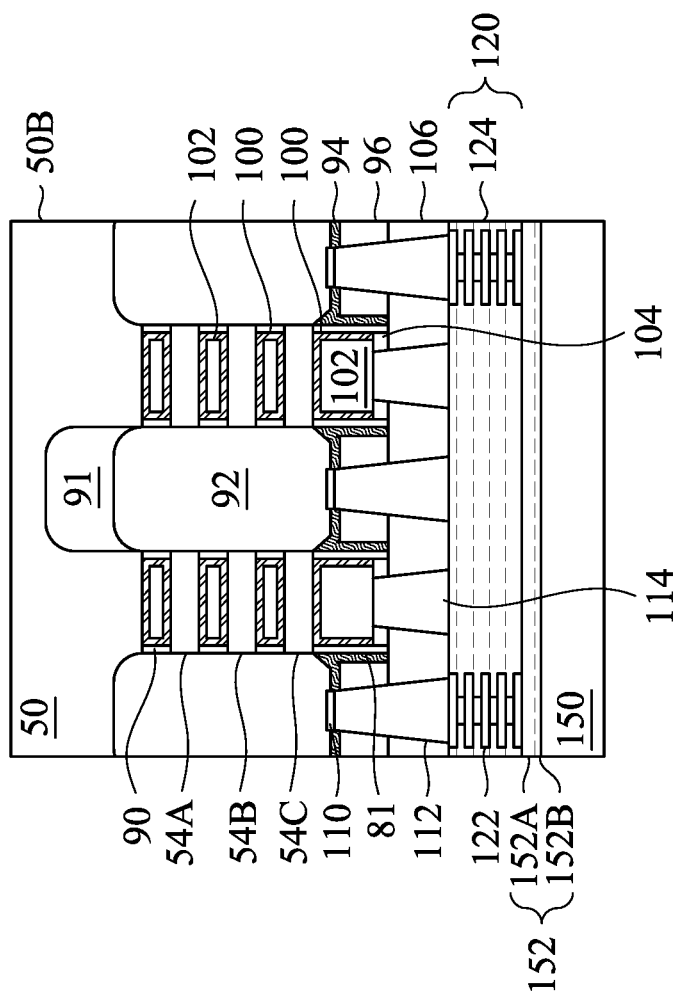

After the annealing process, the implantation region 50A is separated from the remainder region 50B of the substrate 50, as illustrated in FIGS. 26A through 26C. As a result, the thickness of the substrate 50 is reduced to a thickness of the remainder region 50B (e.g., to between 10 nm and 50 nm).

Figure 27B:
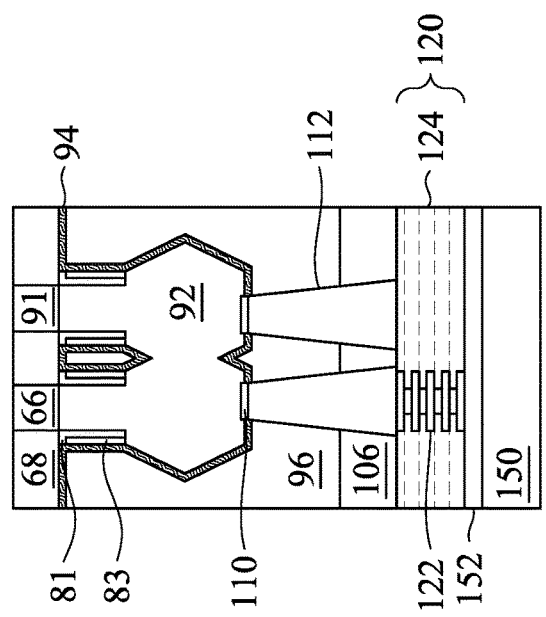
Figure 27A:
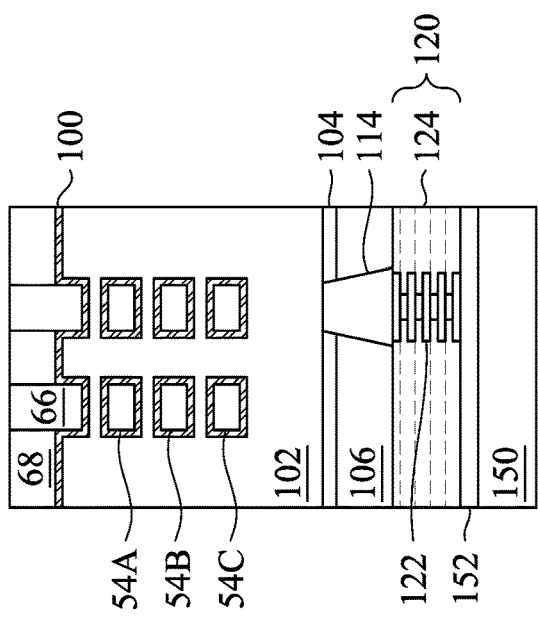
Figure 27C:
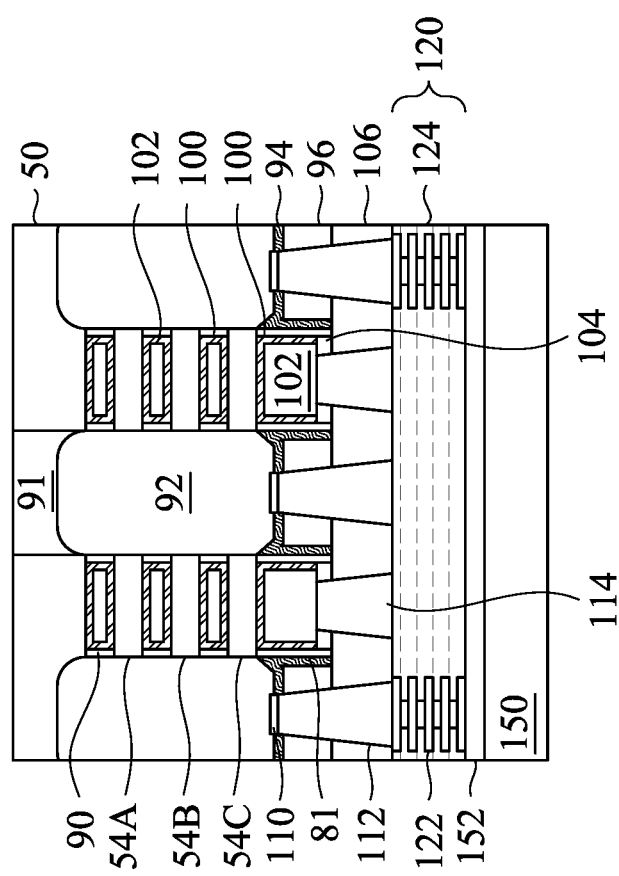

After the implantation region 50A is separated from the remainder region 50B of the substrate 50, an optional cleaning process may be applied to the back side of the substrate 50 (e.g., the remainder region 50B), as illustrated in FIGS. 27A through 27C. The cleaning process may comprise a suitable etching process, such as an isotropic etching process (e.g., a wet etching process), an anisotropic etching process (e.g., a dry etching process), or the like. The cleaning process may remove portions of the remainder region 50B to expose surfaces of the first epitaxial materials 91 opposite the front-side interconnect structure 120. Further, a portion of the substrate 50 may remain over the gate structures (e.g., the gate electrodes 102 and the gate dielectric layers 100) and the nanostructures 55 after the cleaning process. As illustrated in FIGS. 27A through 27C, back-side surfaces of the substrate 50, the first epitaxial materials 91, the STI regions 68, and the fins 66 may be level with one another following the cleaning process.

Ion implantation combined with pulsed laser or furnace annealing for removing the temporary substrate as described above provides uniformity, cost, and throughput advantages. The cut substrate (e.g., the implantation region 50A) removed from the substrate 50 can be reusable. The implantation process combined with the annealing process as described above avoids the thickness uniformity and substrate edge peeling issues. The dose rate needed for substrate splitting can be efficiently cut by about 75% or more.

Figure 28B:
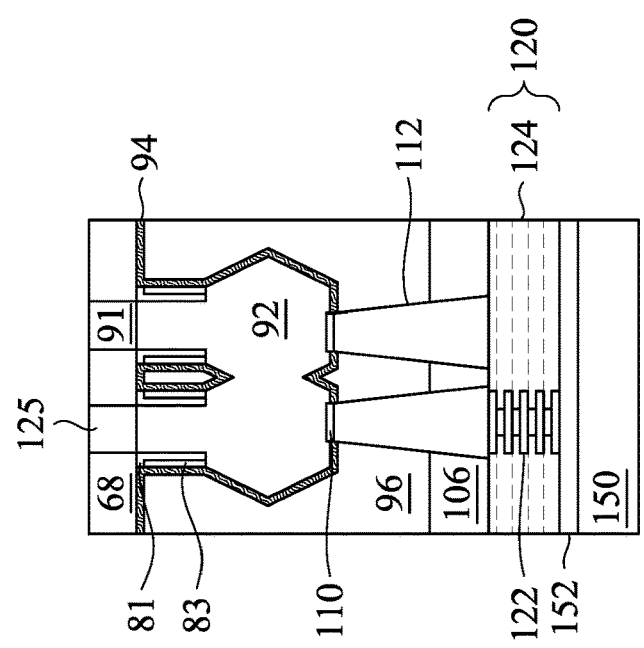
Figure 28A:
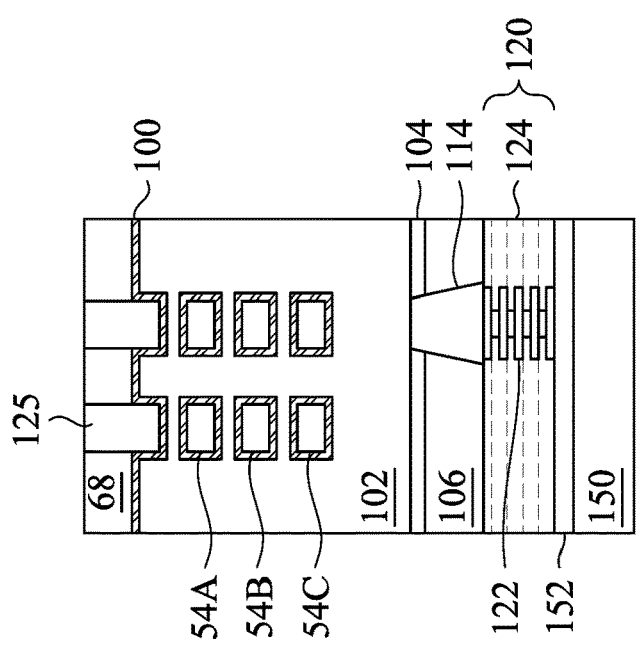
Figure 28C:
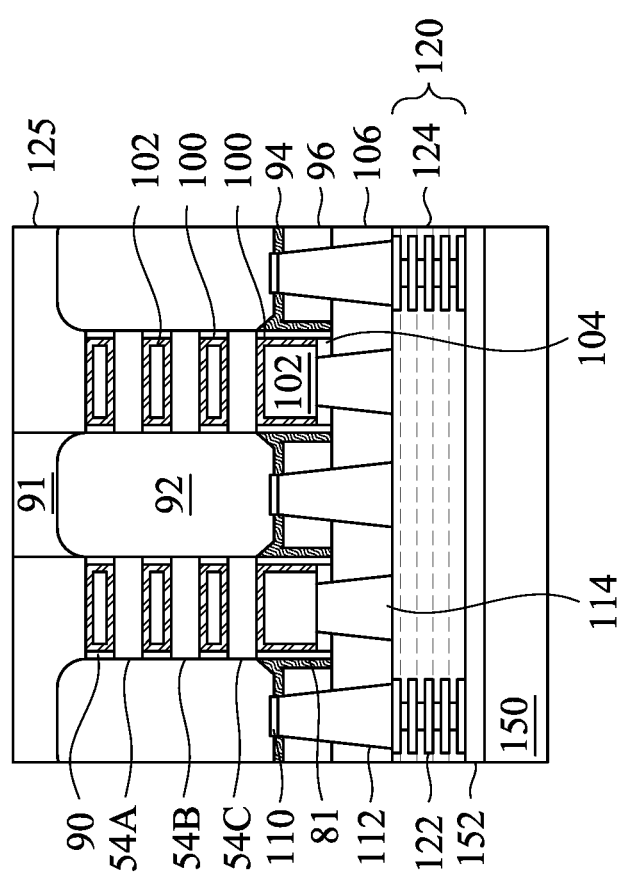

In FIGS. 28A through 28C, remaining portions of the fins 66 and the substrate 50 are removed and replaced with a second dielectric layer 125. The fins 66 and the substrate 50 may be etched using a suitable etching process. In some embodiments, the removing process here with respect to FIGS. 28A through 28C can be combined with or replace the optional removing process described with respect to FIGS. 27A through 27C. The etching process may be one that is selective to the material of the fins 66 and the substrate 50 (e.g., etches the material of the fins 66 and the substrate 50 at a faster rate than the material of the STI regions 68, the gate dielectric layers 100, the epitaxial source/drain regions 92, and the first epitaxial materials 91). After etching the fins 66 and the substrate 50, surfaces of the STI regions 68, the gate dielectric layers 100, the epitaxial source/drain regions 92, and the first epitaxial materials 91 may be exposed.

The second dielectric layer 125 is then deposited on the back side of the transistor structures 109 in recesses formed by removing the fins 66 and the substrate 50. The second dielectric layer 125 may be deposited over the STI regions 68, the gate dielectric layers 100, and the epitaxial source/drain regions 92. The second dielectric layer 125 may physically contact surfaces of the STI regions 68, the gate dielectric layers 100, the epitaxial source/drain regions 92, and the first epitaxial materials 91. The second dielectric layer 125 may be substantially similar to the second ILD 106, described above with respect to FIGS. 18A through 18C. For example, the second dielectric layer 125 may be formed of a like material and using a like process as the second ILD 106. As illustrated in FIGS. 28A through 28C, a CMP process or the like may be used to remove material of the second dielectric layer 125 such that top surfaces of the second dielectric layer 125 are level with top surfaces of the STI regions 68 and the first epitaxial materials 91.

Figure 29C:
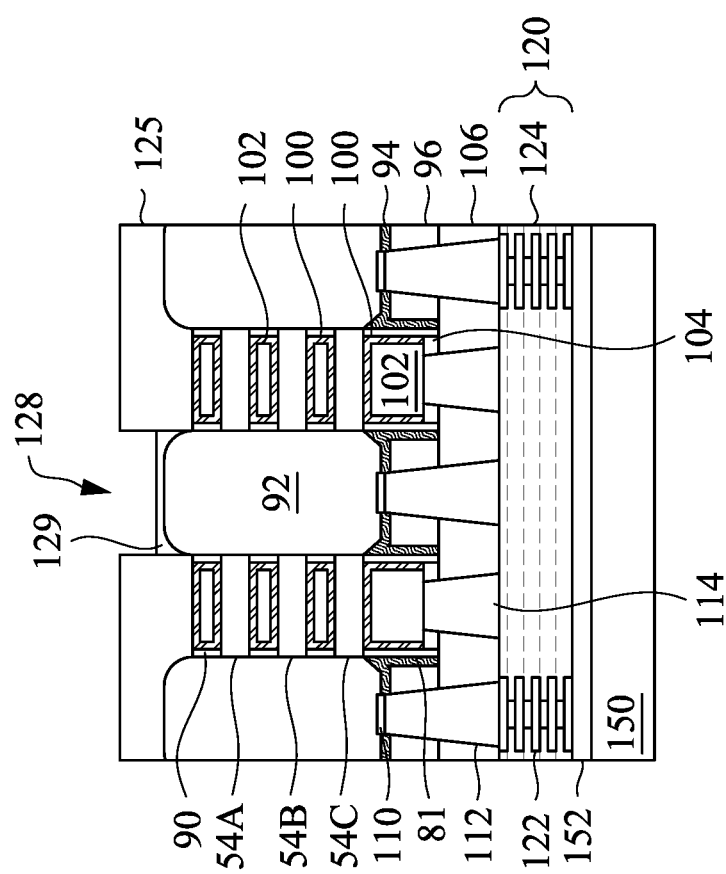

In FIGS. 29A through 29C, the first epitaxial materials 91 are removed to form fifth recesses 128 and second silicide regions 129 are formed in the fifth recesses 128. The first epitaxial materials 91 may be removed by a suitable etching process, which may be an isotropic etching process, such as a wet etching process. The etching process may have a high etch selectivity to materials of the first epitaxial materials 91. As such, the first epitaxial materials 91 may be removed without significantly removing materials of the second dielectric layer 125, the STI regions 68, or the epitaxial source/drain regions 92. The fifth recesses 128 may expose sidewalls of the STI regions 68, back-side surfaces of the epitaxial source/drain regions 92, and sidewalls of the second dielectric layer 125.

Second silicide regions 129 may then be formed in the fifth recesses 128 on back sides of the epitaxial source/drain regions 92. The second silicide regions 129 may be similar to the first silicide regions no, described above with respect to FIGS. 19A through 19C. For example, the second silicide regions 129 may be formed of a like material and using a like process as the first silicide regions no.

Figure 30B:
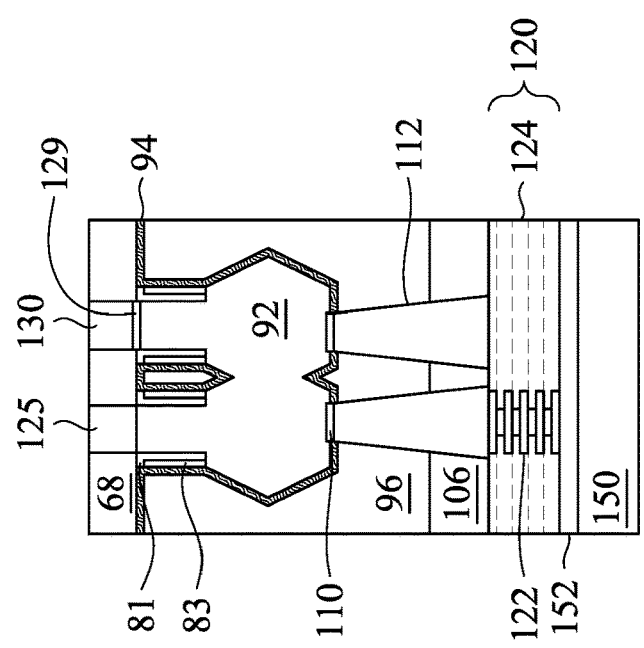
Figure 30A:
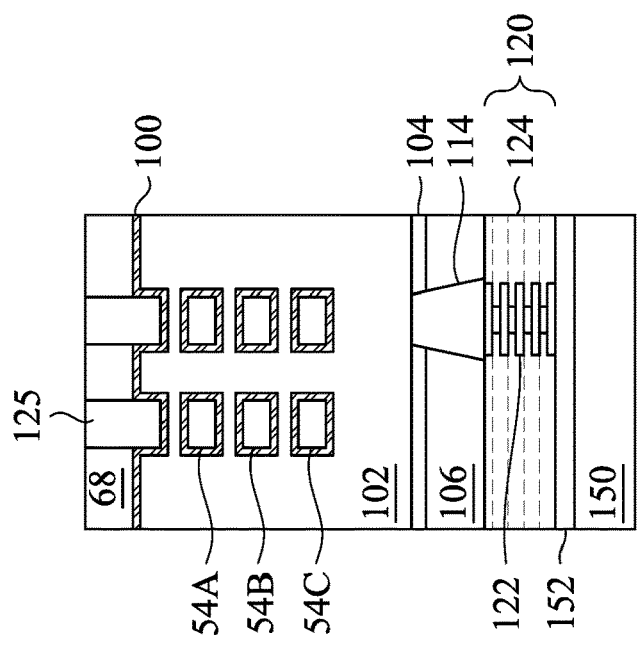
Figure 30C:
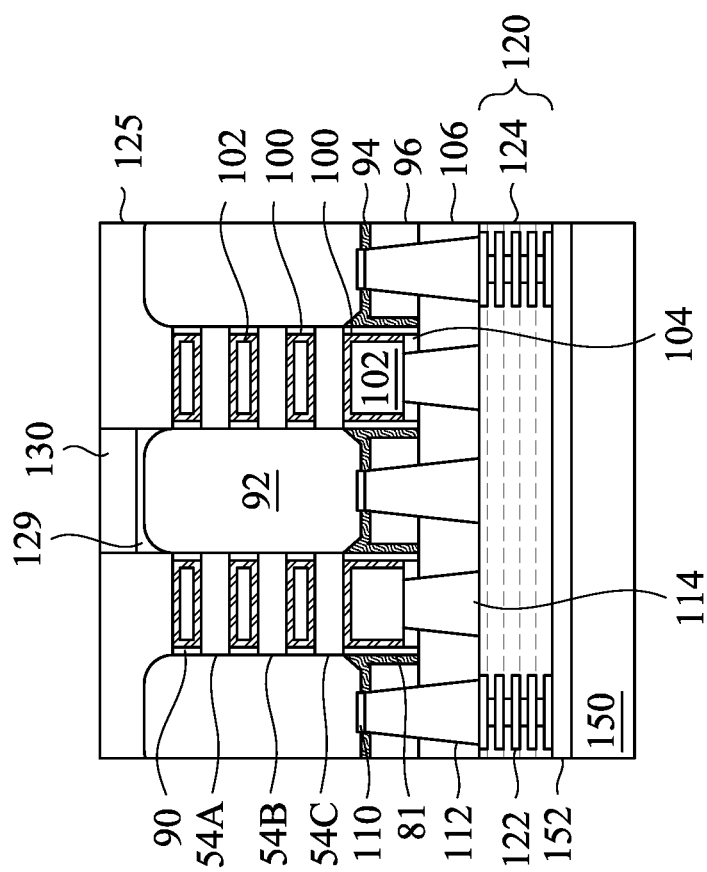

In FIGS. 30A through 30C, back-side vias 130 are formed in the fifth recesses 128. The back-side vias 130 may extend through the second dielectric layer 125 and the STI regions 68 and may be electrically coupled to the epitaxial source/drain regions 92 through the second silicide regions 129. The back-side vias 130 may be similar to the source/drain contacts 112, described above with respect to FIGS. 20A through 20C. For example, the back-side vias 130 may be formed of a like material and using a like process as the source/drain contacts 112.

In FIGS. 31A through 31D, conductive lines 134 and a third dielectric layer 132 are formed over the second dielectric layer 125, the STI regions 68, and the back-side vias 130. The third dielectric layer 132 may be similar to the second dielectric layer 125. For example, third dielectric layer 132 may be formed of a like material and using a like process as the second dielectric layer 125.

The conductive lines 134 are formed in the third dielectric layer 132. Forming the conductive lines 134 may include patterning recesses in the third dielectric layer 132 using a combination of photolithography and etching processes, for example. A pattern of the recesses in the third dielectric layer 132 may correspond to a pattern of the conductive lines 134. The conductive lines 134 are then formed by depositing a conductive material in the recesses. In some embodiments, the conductive lines 134 comprise a metal layer, which may be a single layer or a composite layer comprising a plurality of sub-layers formed of different materials. In some embodiments, the conductive lines 134 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The conductive lines 134 may be formed using, for example, CVD, ALD, PVD, plating, or the like. The conductive lines 134 are physically and electrically coupled to the epitaxial source/drain regions 92 through the back-side vias 130 and the second silicide regions 129. A planarization process (e.g., a CMP, a grinding, an etch-back, or the like) may be performed to remove excess portions of the conductive lines 134 formed over the third dielectric layer 132.

In some embodiments, the conductive lines 134 are power rails, which are conductive lines that electrically connect the epitaxial source/drain regions 92 to a reference voltage, a supply voltage, or the like. By placing power rails on a back side of the resulting semiconductor die rather than on a front-side of the semiconductor die, advantages may be achieved. For example, a gate density of the nano-FETs and/or interconnect density of the front-side interconnect structure 120 may be increased. Further, the back side of the semiconductor die may accommodate wider power rails, reducing resistance and increasing efficiency of power delivery to the nano-FETs. For example, a width of the conductive lines 134 may be at least twice a width of first level conductive lines (e.g., first conductive features 122) of the front-side interconnect structure 120.

Figure 31B:
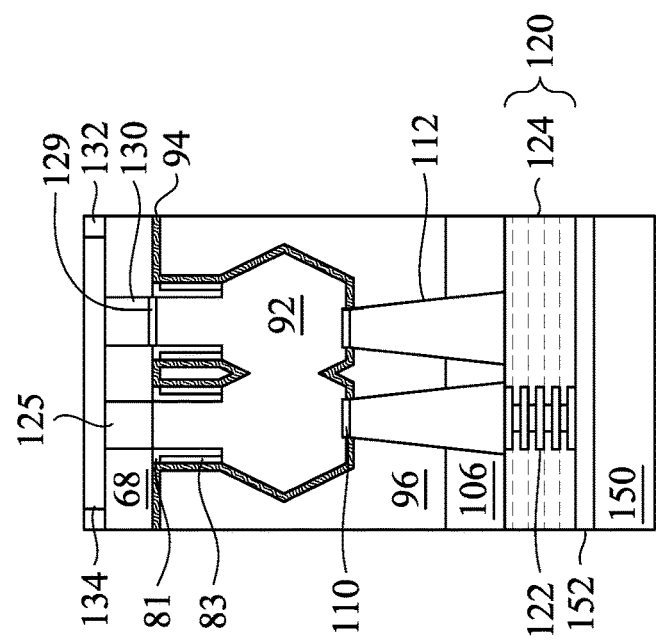
Figure 31A:
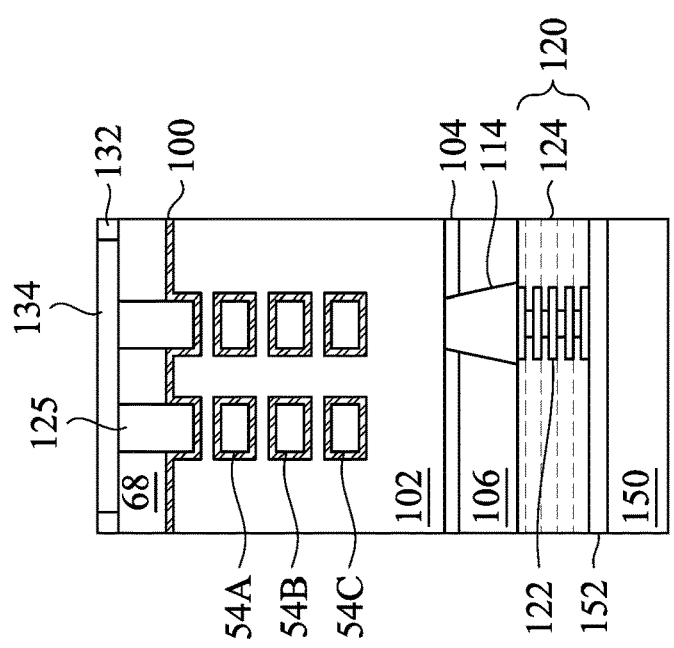
Figure 31C:
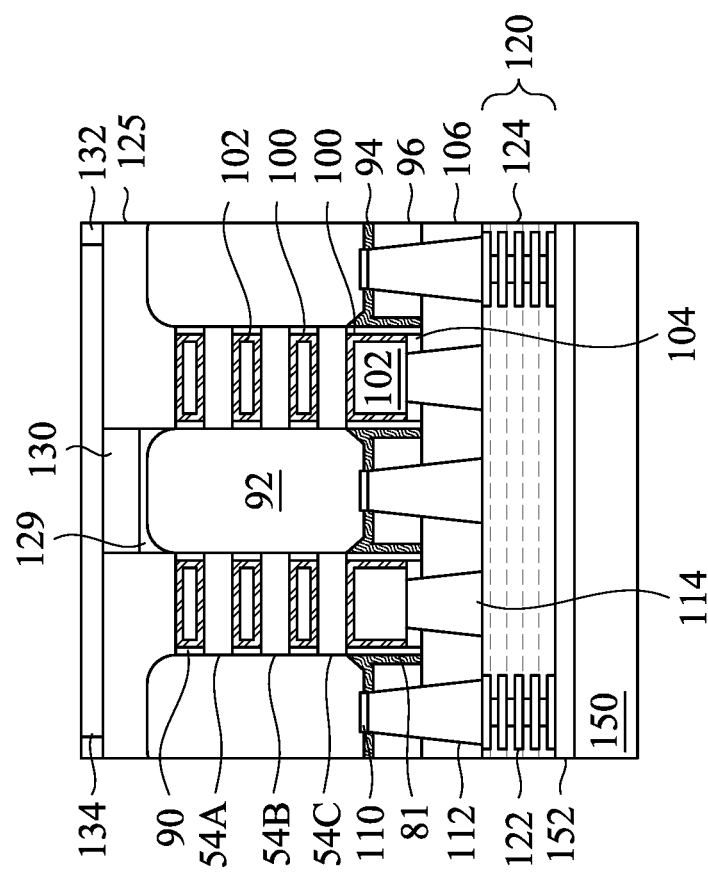
Figure 31D:
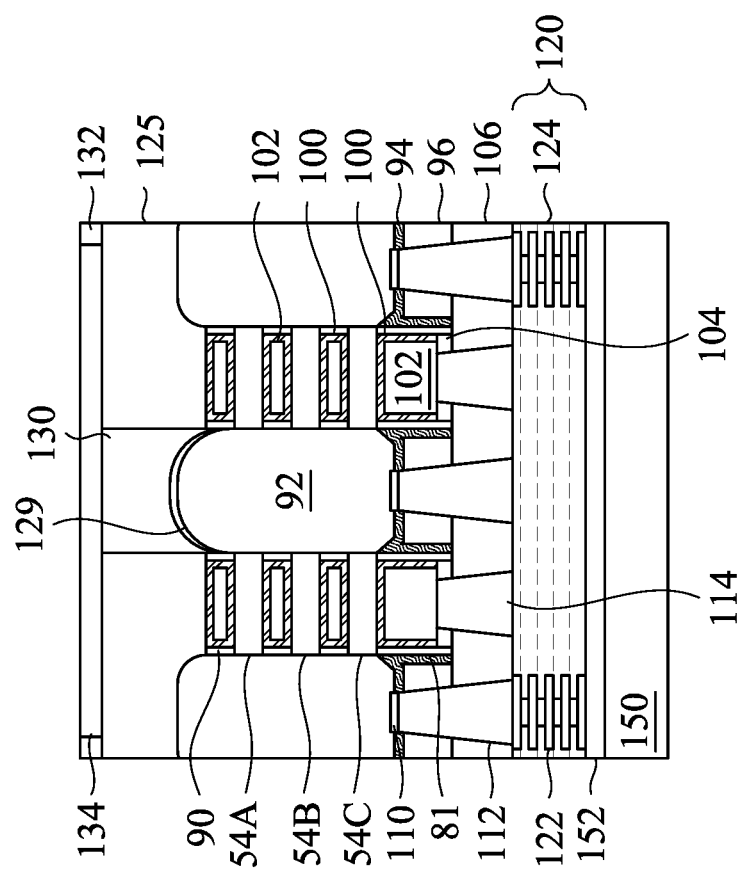

FIG. 31D illustrates an embodiment in which the epitaxial source/drain regions 92 to which the back-side vias 130 are electrically coupled have heights greater than the epitaxial source/drain regions 92 which are not electrically coupled to the back-side vias 130. The heights of the epitaxial source/drain regions 92 may be selected by controlling depths of the first recesses 86 and the second recesses 87 and/or controlling the thickness of the first epitaxial materials 91. In some embodiments, ratio of a height of the epitaxial source/drain regions 92 which are not electrically coupled to the back-side vias 130 to a height of the epitaxial source/drain regions 92 which are electrically coupled to the back-side vias 130 may be from about 10 to about 50. Forming the epitaxial source/drain regions 92 which are not electrically coupled to the back-side vias 130 with heights less than the epitaxial source/drain regions 92 which are electrically coupled to the back-side vias 130 results in the epitaxial source/drain regions 92 which are not electrically coupled to the back-side vias 130 being separated from the conductive lines 134 by a greater thickness of the second dielectric layer 125. This provides better isolation of the epitaxial source/drain regions 92 which are not electrically coupled to the back-side vias 130 from the conductive lines 134 and improves device performance.

Figure 32C:
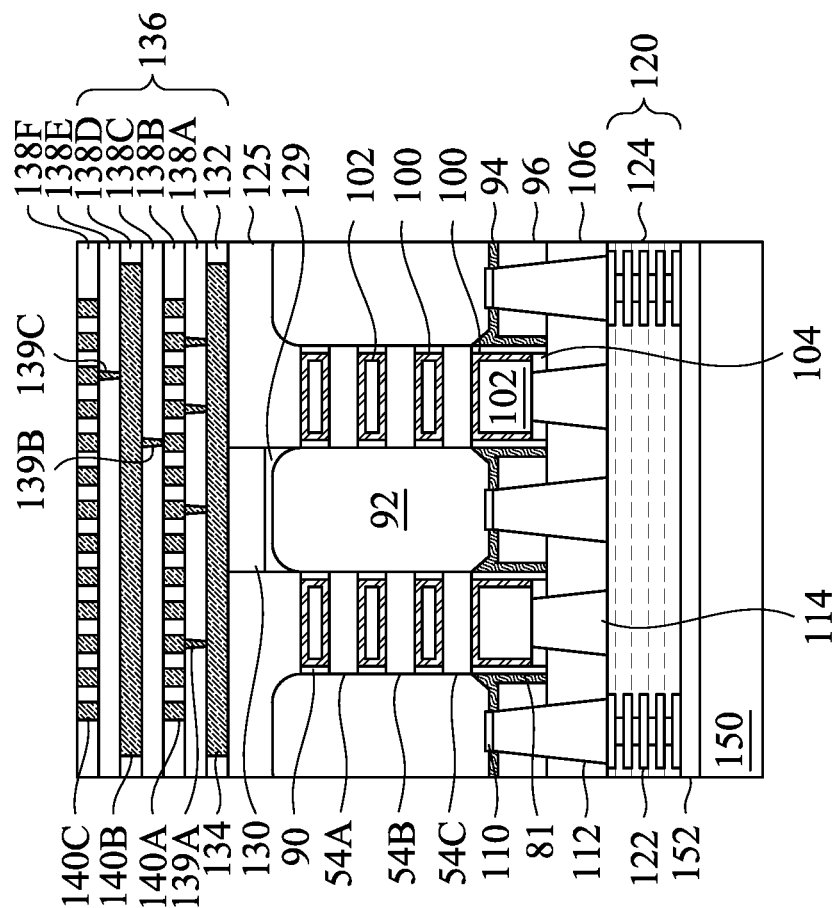

In FIGS. 32A through 32C, remaining portions of a back-side interconnect structure 136 are formed over the third dielectric layer 132 and the conductive lines 134. The back-side interconnect structure 136 may be referred to as a back-side interconnect structure because it is formed on a back side of the transistor structures 109 (e.g., a side of the transistor structures 109 opposite to the front side of the substrate 50 on which the active devices are formed). The back-side interconnect structure 136 may comprise the second dielectric layer 125, the third dielectric layer 132, the back-side vias 130, and the conductive lines 134. The back-side interconnect structure 136 may further comprise conductive lines 140A-140C (collectively referred to as conductive lines 140) and conductive vias 139A-139C (collectively referred to as conductive vias 139) formed in fourth dielectric layers 138A-138F (collectively referred to as fourth dielectric layers 138). The conductive vias 139 may extend through respective ones of the fourth dielectric layers 138 to provide vertical connections between layers of the conductive lines 140.

The conductive vias 139 and the conductive lines 140 may be formed through any acceptable process, such as, a damascene process, a dual damascene process, or the like. In some embodiments, the conductive vias 139 and the conductive lines 140 may be formed using damascenes processes in which a respective fourth dielectric layer 138 is patterned utilizing a combination of photolithography and etching techniques to form trenches corresponding to the desired pattern of the conductive vias 139 and/or the conductive lines 140. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the conductive vias 139 and the conductive lines 140 may be formed by depositing a seed layer of copper or a copper alloy, and filling the trenches by electroplating. A chemical mechanical planarization (CMP) process or the like may be used to remove excess conductive material from a surface of the respective fourth dielectric layer 138 and to planarize surfaces of the fourth dielectric layer 138 and the conductive vias 139 and/or the conductive lines 140 for subsequent processing.

FIGS. 32A through 32C illustrate three layers of the conductive vias 139, three layers of the conductive lines 140, and six layers of the fourth dielectric layers 138 in the back-side interconnect structure 136. However, it should be appreciated that the back-side interconnect structure 136 may comprise any number of conductive vias 139 and conductive lines 140 disposed in any number of fourth dielectric layers 138. The back-side interconnect structure 136 may be electrically connected to the conductive lines 134 (e.g., power rails) to provide circuits (e.g., power circuits) on the back side of the nano-FETs.

Figure 33C:
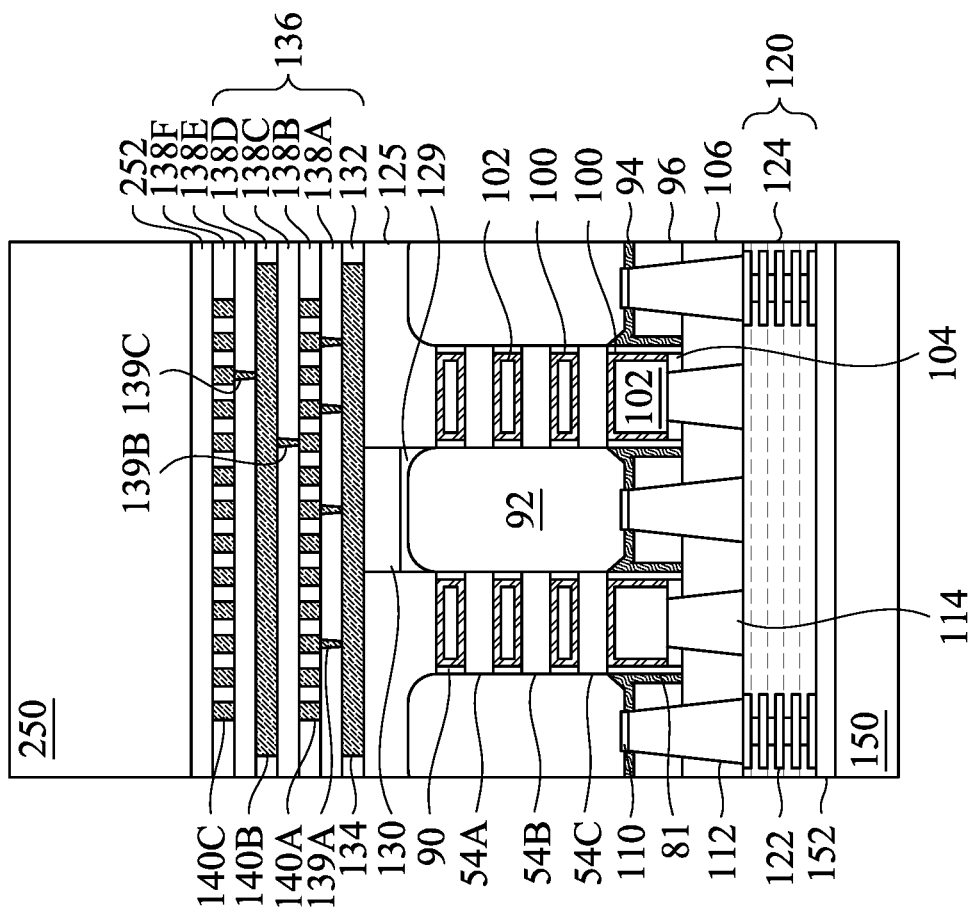

In FIGS. 33A through 33C, a second substrate 250 is bonded to a top surface of the back-side interconnect structure 136 by bonding layers 252. The second substrate 250 may be a second semiconductor substrate, and the semiconductor material of the second substrate 250 may be similar to that of the semiconductor substrate 50. The second substrate 250 may provide structural support during subsequent processing steps and in the completed device. The bonding layers 252 may be similar to bonding layers 152. The bonding layers 252 may bind the second substrate 250 to the top surface of the back-side interconnect structure 136 using similar processes to the bonding layers 152 binding the carrier substrate 150 to the top surface of the front-side interconnect structure 120, as described above with respect to FIGS. 22A through 22C.

Figure 34B:
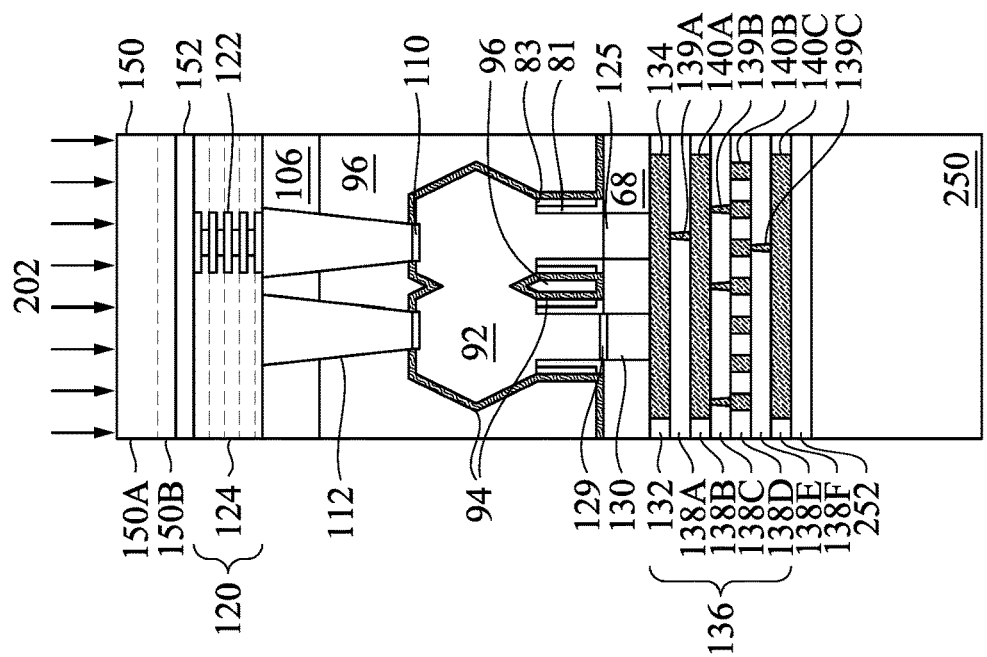
Figure 34A:
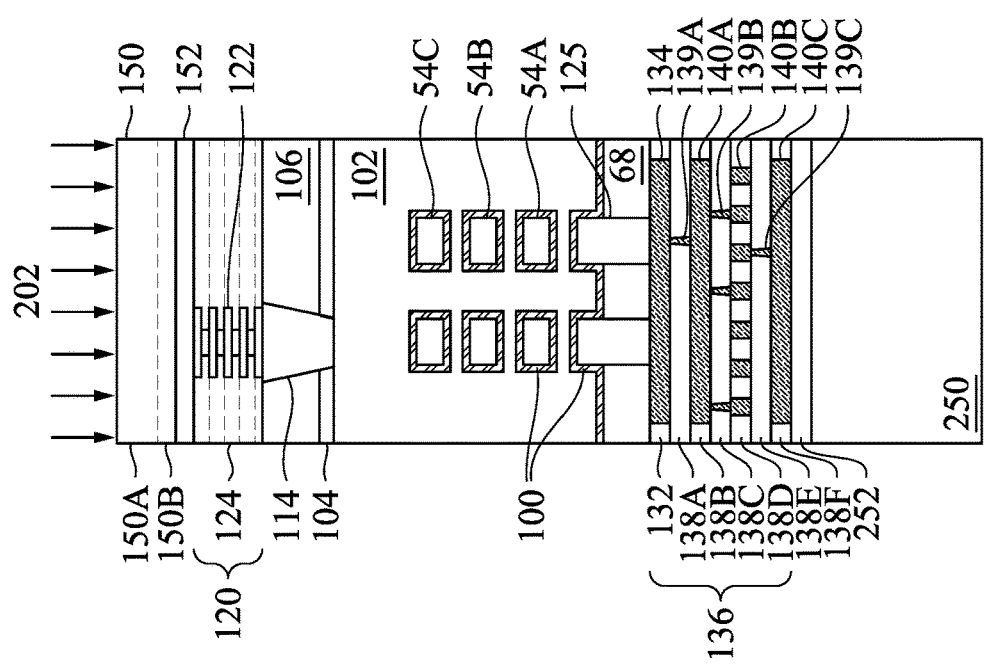
Figure 34C:
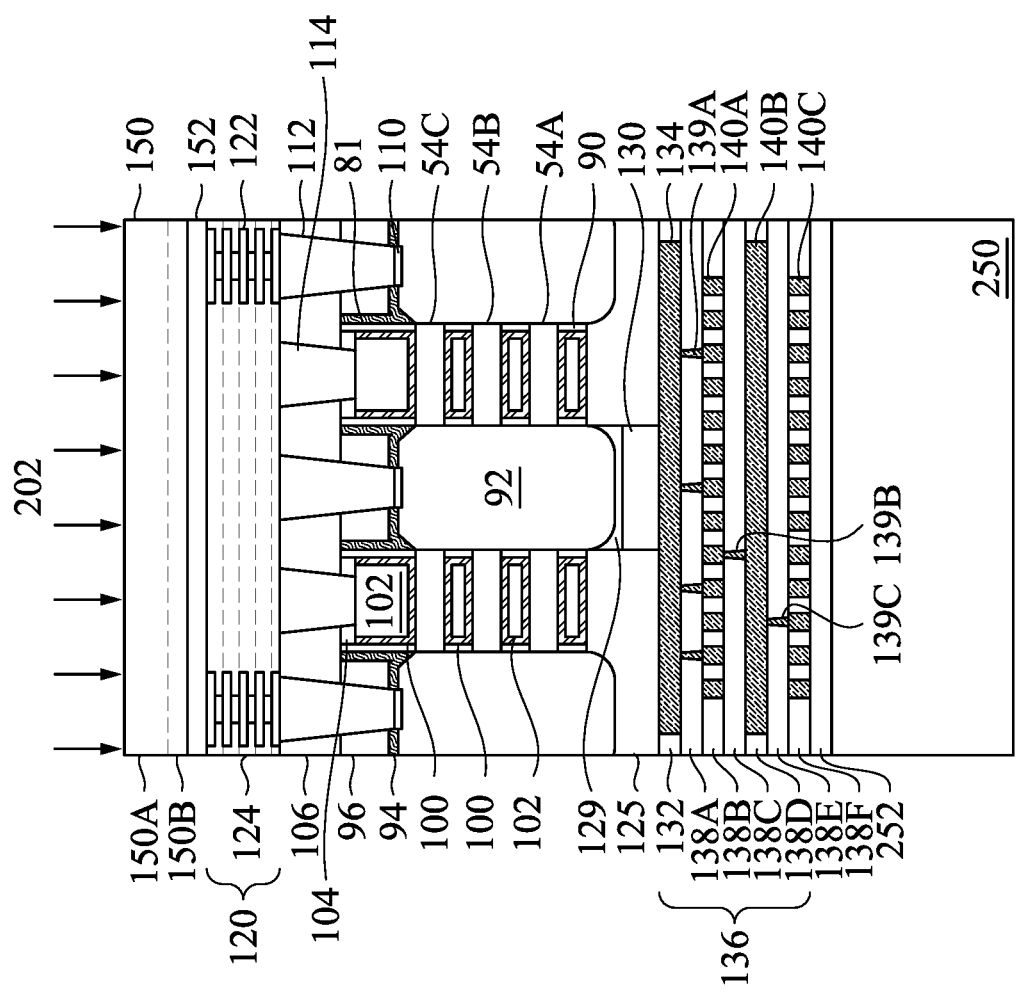

In FIGS. 34A through 34C, the device may be flipped such that the carrier substrate 150 faces upwards. Then, a thinning process may be applied to the front side of the carrier substrate 150. The thinning process may comprise a planarization process (e.g., a mechanical grinding, a CMP, or the like), an etch-back process, a combination thereof, or the like. The thinning process may reduce the thickness of the carrier substrate 150 to between 3 μm to 5 μm. The thickness of the carrier substrate 150 may be a distance between the top surface of the carrier substrate 150 and the top surface of the bonding layers 152.

After the thinning process, ions are implanted into the carrier substrate 150 to form an implantation region 150A of the carrier substrate iso. A plasma process may be performed, for example, by applying an ion gas 202 to the top surface of the carrier substrate 150 through a front side of the carrier substrate 150 to implant the ions into the implantation region 150A of the carrier substrate iso. The ion gas 202 may be similar to the ion gas 200 described above with respect to FIGS. 23A through 23C. After the implantation, the carrier substrate 150 includes the implantation region 150A and a remainder region 150B. The remainder region 150B may be substantially free of ions from the ion gas 202. The thickness of the remainder region 150B of the carrier substrate 150 may be between 10 nm and 50 nm. In some embodiments, to help achieve the desired thickness of the remainder region 150B, the applied implantation energy may be significantly more than 10 keV. For example, the applied implantation energy may be more than 1 MeV.

After the implantation, an annealing process is applied to separate the implantation region 150A from the remainder region 150B of the carrier substrate iso. The annealing process may be similar to the annealing process using a pulsed laser described above with respect to FIGS. 24A through 24C except that the pulsed laser here is applied to the implantation region 150A of the carrier substrate iso. The annealing process may also be similar to the annealing process using a furnace described above with respect to FIGS. 25A through 25C.

Figure 35B:
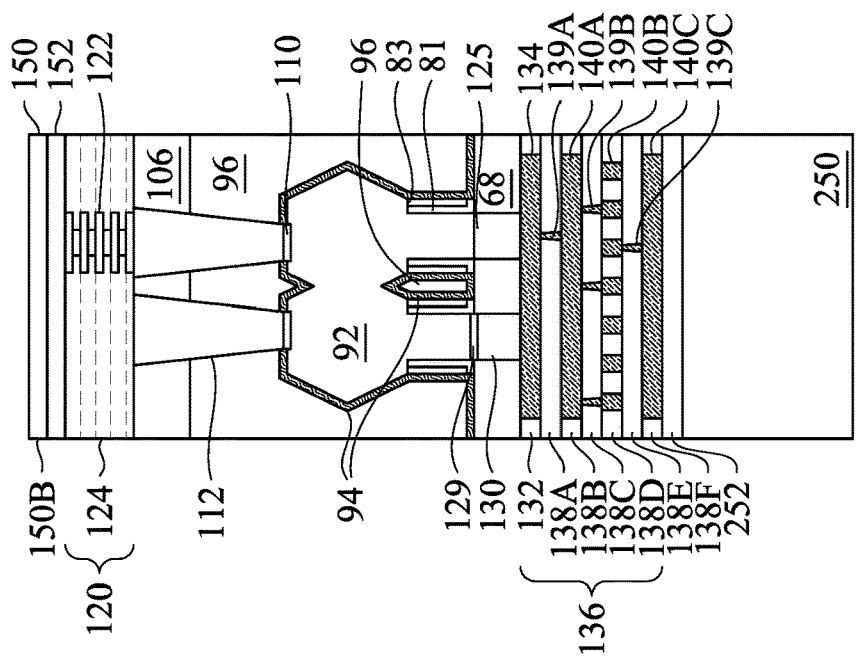
Figure 35A:
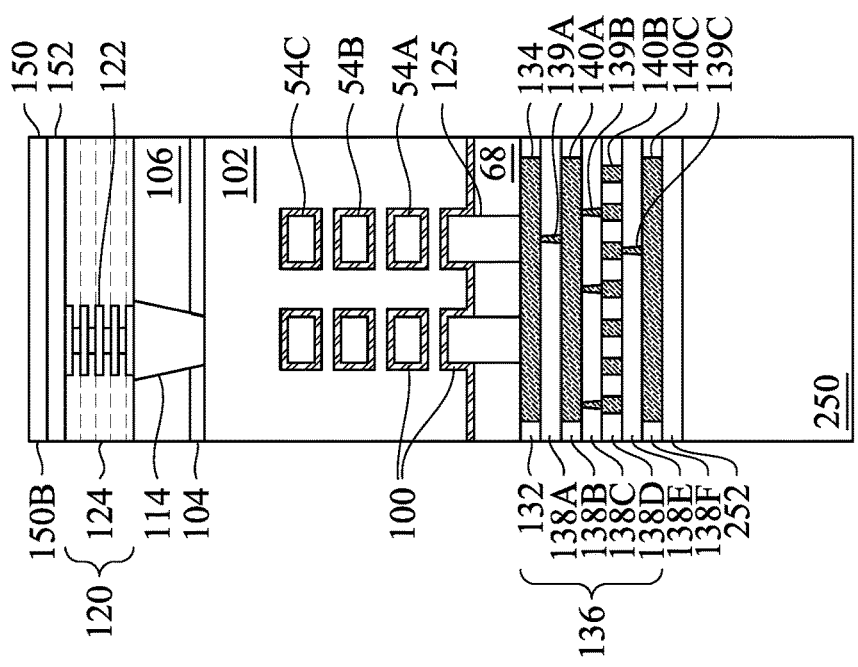
Figure 35C:
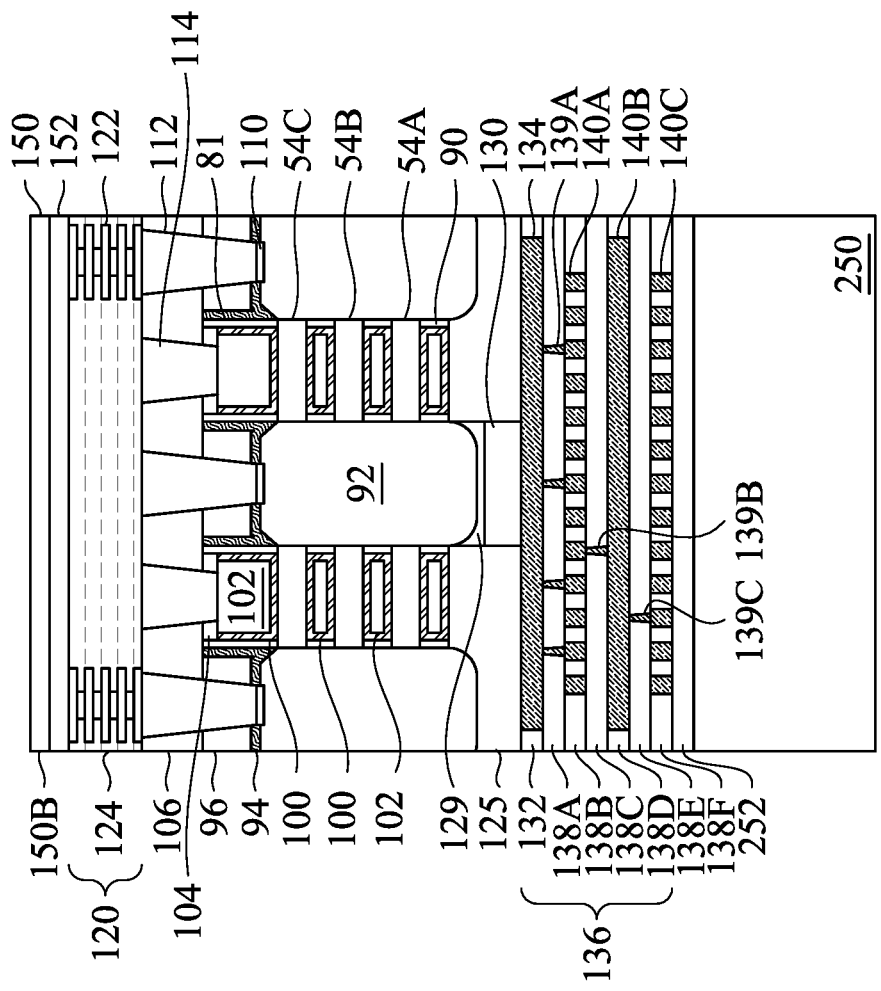

After the annealing process, the implantation region 150A is separated from the remainder region 150B of the carrier substrate 150, as illustrated in FIGS. 35A through 35C. As a result, the thickness of the carrier substrate 150 is reduced to a thickness of the remainder region 150B (e.g., to between 10 nm and 50 nm).

After the implantation region 150A is separated from the remainder region 150B of the carrier substrate 150, an optional cleaning process may be applied to the front side of the carrier substrate 150 (e.g., the remainder region 150B). The cleaning process may comprise a suitable etching process, such as an isotropic etching process (e.g., a wet etching process), an anisotropic etching process (e.g., a dry etching process), a planarization process, or the like. The cleaning process may remove the remainder region 150B and the bonding layers 152 to expose the top surfaces of the front-side interconnect structure 120. In some embodiments, etching using ammonium hydroxide (e.g., NH$_4$OH) may be applied to remove the remainder region 150B. A planarization process such as CMP, or an oxide removal using, for example, dilute hydrofluoric (dHF), may be applied to remove the bonding layers 152.

Figure 36B:
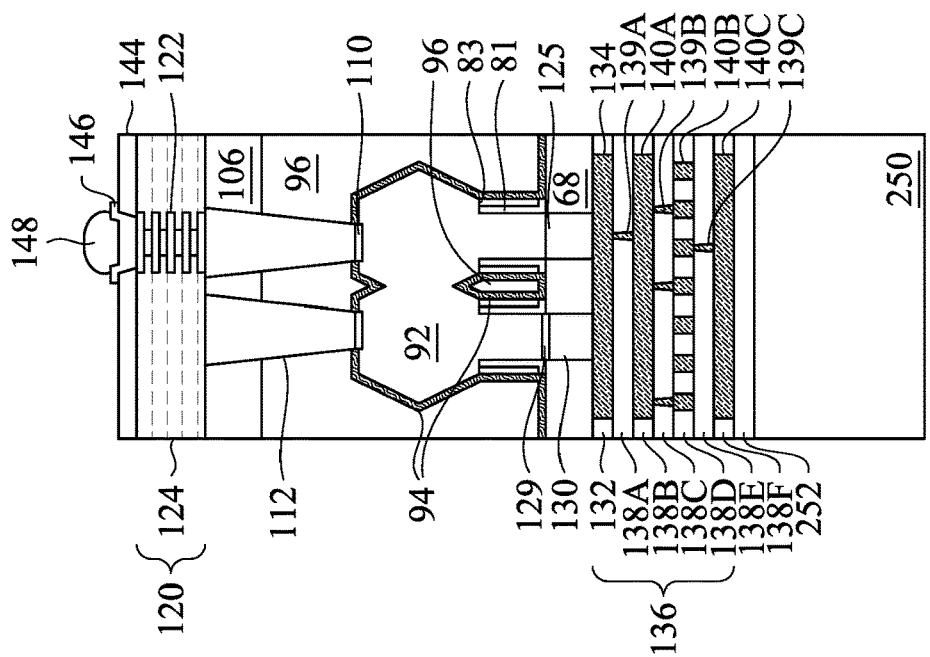
Figure 36A:
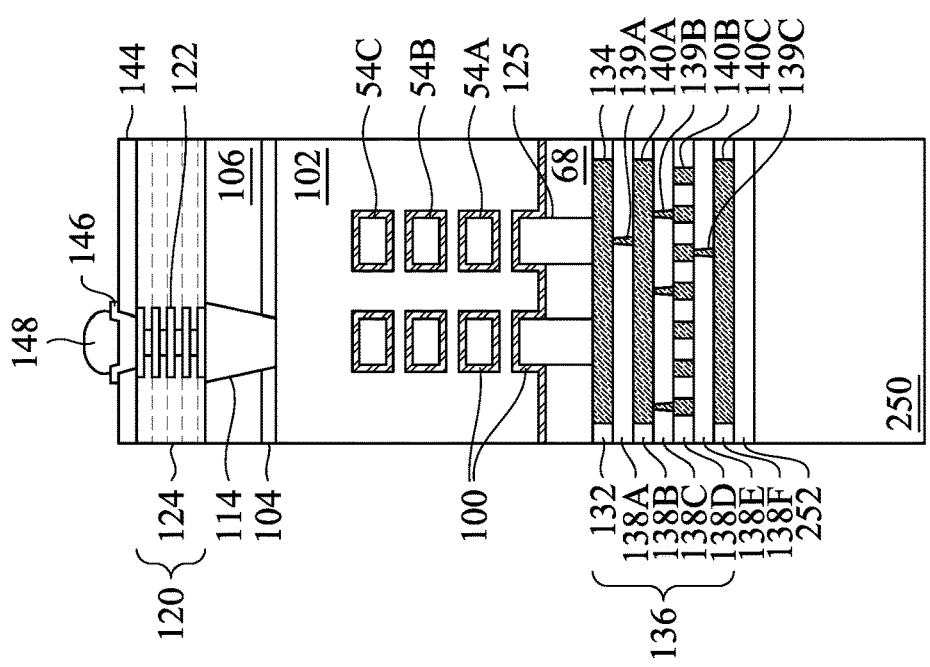
Figure 36C:
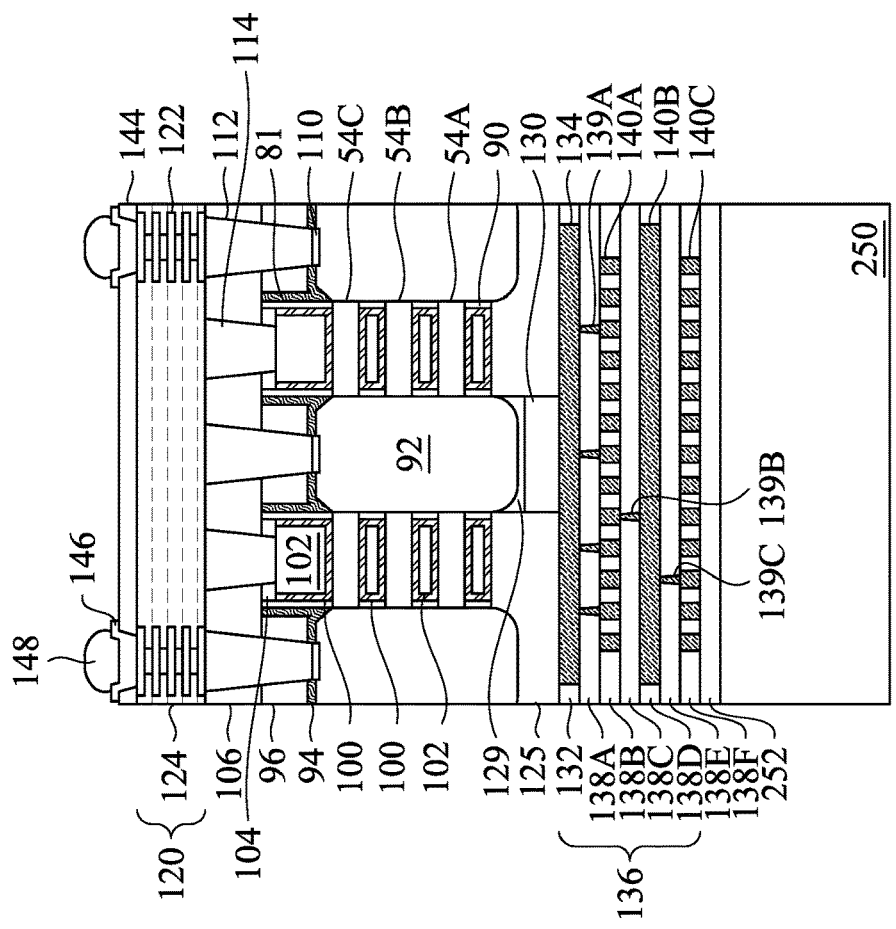

Optionally, in FIGS. 36A through 36C, a passivation layer 144, UBMs 146, and external connectors 148 may be formed over the front-side interconnect structure 120. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 may be formed through the passivation layer 144 to the first conductive features 122 in the front-side interconnect structure 120, and external connectors 148 may be formed on the UBMs 146. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may provide signal, supply voltage, and/or ground connections to the nano-FETs described above.

FIGS. 22A through 36C illustrate embodiment intermediate steps of forming front-side interconnect structures and back-side interconnect structures, including ion implantation combined with annealing applied to the semiconductor substrate 50 and the carrier substrate 150. In these embodiments, the plasma process applied to the carrier substrate 150 occurs after the carrier substrate 150 is bonded to the top surface of the front-side interconnect structure 120 and after the thinning process is applied to the carrier substrate 150. FIGS. 37 through 42C illustrate alternative embodiments to FIGS. 22A through 36C. In FIGS. 37 through 42C, the plasma process applied to the carrier substrate 150 occurs before the carrier substrate 150 is bonded to the top surface of the front-side interconnect structure 120, and the thinning process does not need to be applied to the carrier substrate 150 before the plasma process applied to the carrier substrate 150.

Figure 37:
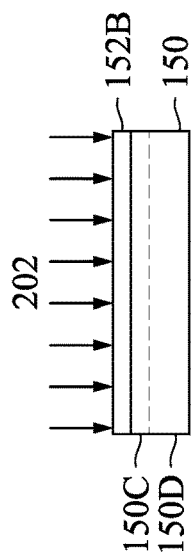

FIGS. 37 through 42C may continue from FIGS. 21A through 21C where like reference numerals indicate like elements formed by like processes. In FIG. 37, a second bonding layer 152B may be formed on a surface of the carrier substrate 150. In some embodiments, the second bonding layer 152B comprises silicon oxide (e.g., a high density plasma (HDP) oxide, or the like) that is deposited by CVD, ALD, PVD, or the like. Other suitable materials may be used for the second bonding layer 152B.

Figure 38B:
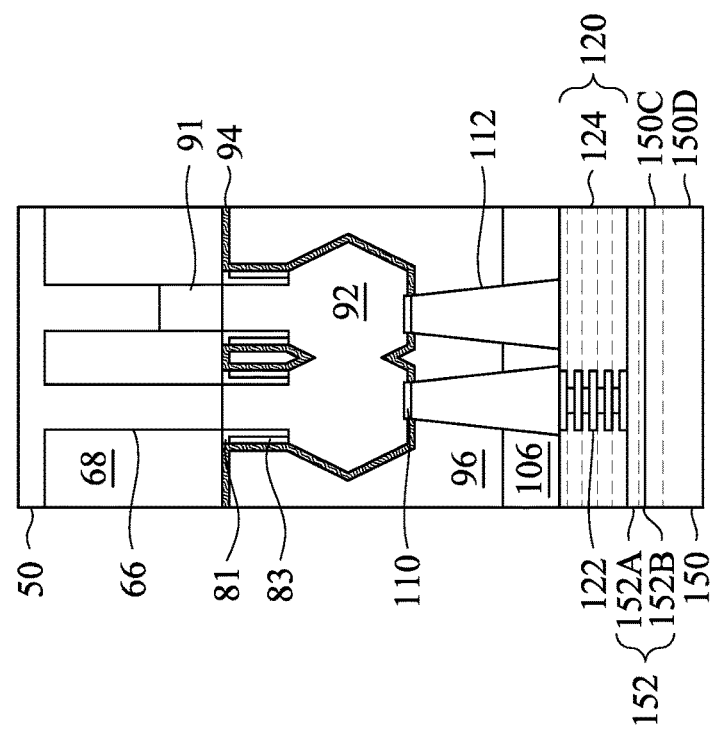
Figure 38A:
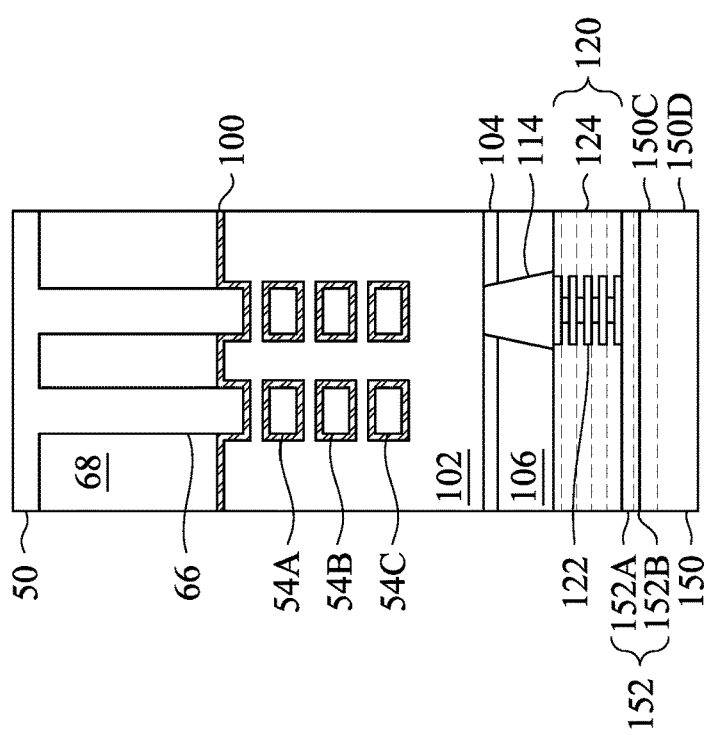
Figure 38C:
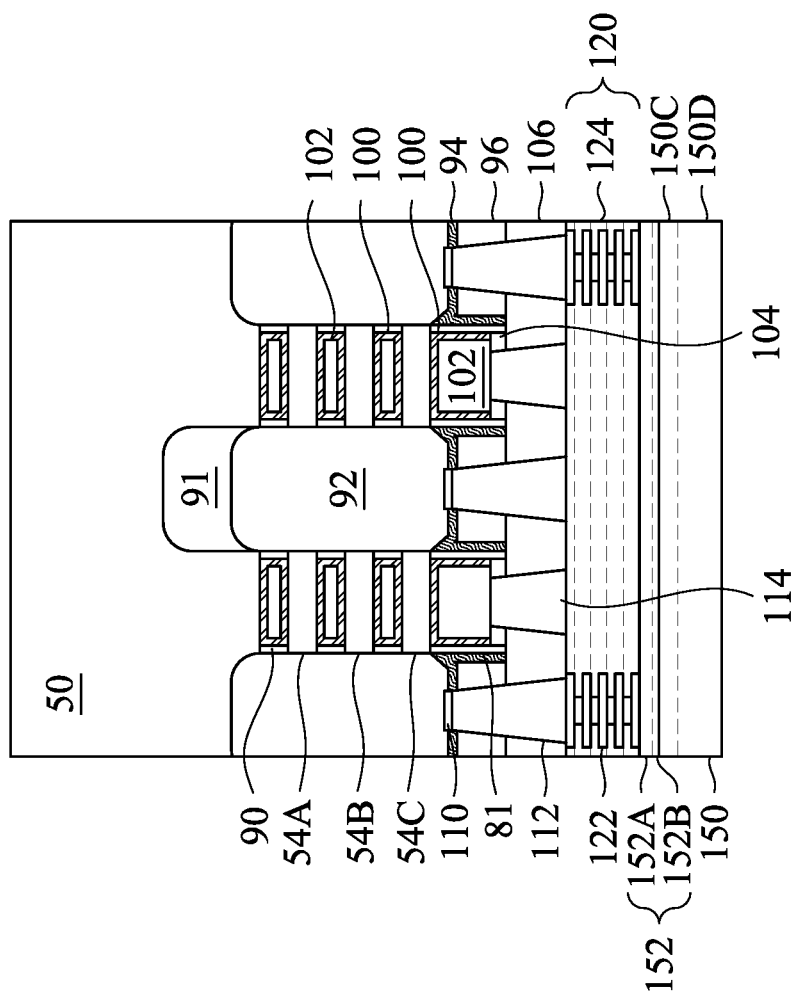

Then, a plasma process may be performed, for example, by applying an ion gas 202 to the top surface of the carrier substrate 150 through the second bonding layer 152B to implant the ions into the implantation region 150C of the carrier substrate 150 prior to the carrier substrate 150 being bonded to the front-side interconnect structure 120 (see FIGS. 38A through 38C). The ion gas 202 may be similar to the ion gas 200 described above with respect to FIGS. 23A through 23C. After the implantation, the carrier substrate 150 includes the implantation region 150C and a remainder region 150D. The thickness of the implantation region 150C of the carrier substrate 150 may be between 10 nm and 50 nm. In some embodiments, to help achieve the desired thickness of the implantation region 150C, the applied implantation energy may be 10 keV or less. The remainder region 150D may be substantially free of ions from the ion gas 202.

In FIGS. 38A through 38C, a first bonding layer 152A may be deposited on the front-side interconnect structure 120. The first bonding layer 152A may be an oxide layer that is formed on the front-side interconnect structure 120 using, for example, CVD, ALD, PVD, thermal oxidation, or the like. Other suitable materials may be used for the first bonding layer 152A. The carrier substrate 150 is bonded to the top surface of the front-side interconnect structure 120 by the first bonding layer 152A and a second bonding layer 152B (collectively referred to as a bonding layer 152). The bonding process may include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 120 and the two are pressed against each other to initiate a pre-bonding of the carrier substrate 150 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 150 to a temperature of about 150° C. to about 400° C.

Further in FIGS. 38A through 38C, after the carrier substrate 150 is bonded to the front-side interconnect structure 120, the device may be flipped such that the back side of the transistor structures 109 faces upwards. In contrast to the embodiments illustrated in FIGS. 34A through 34C where the remainder region 150B is between the implantation region 150A and the bonding layers 152, in the embodiments illustrated in FIGS. 38A through 38C, the implantation region 150C is between the remainder region 150D and the bonding layers 152.

Figure 39B:
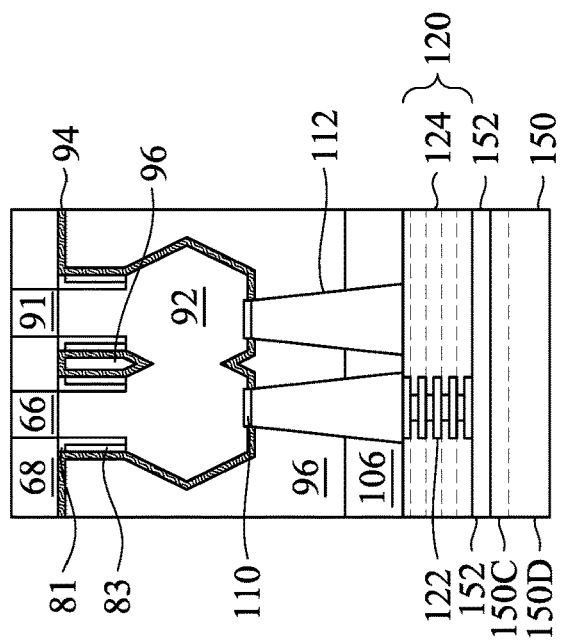
Figure 39A:
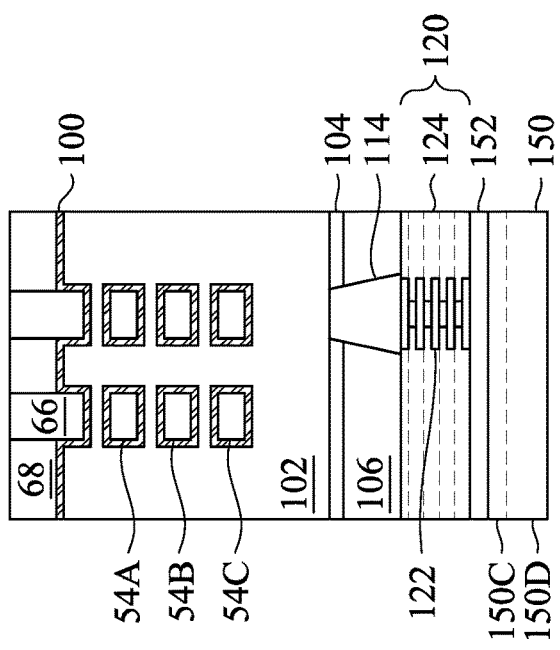
Figure 39C:
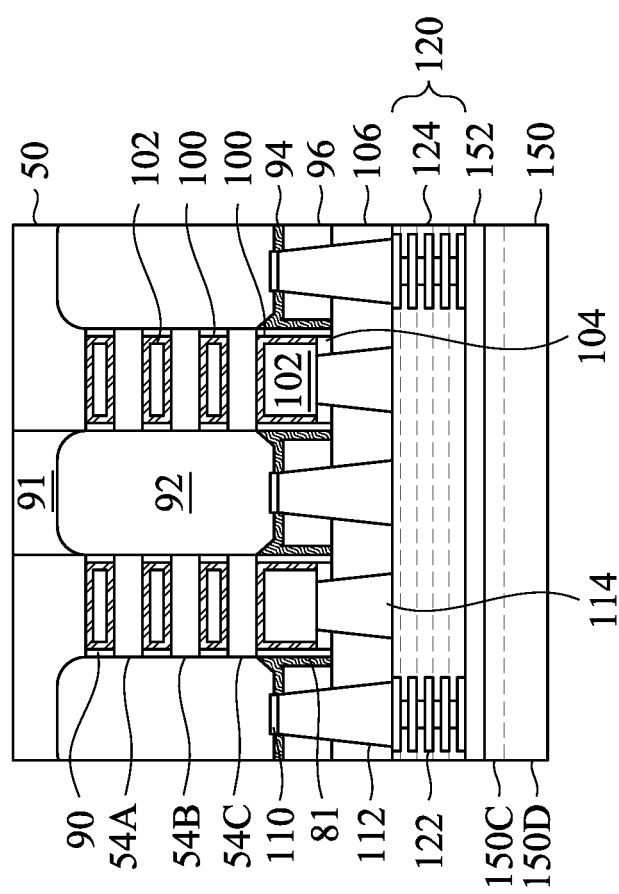

In FIGS. 39A through 39C, surfaces of the first epitaxial materials 91 opposite the front-side interconnect structure 120 may be exposed by using processes similar to the processes described above with respect to FIGS. 23A through 27C.

Figure 40B:
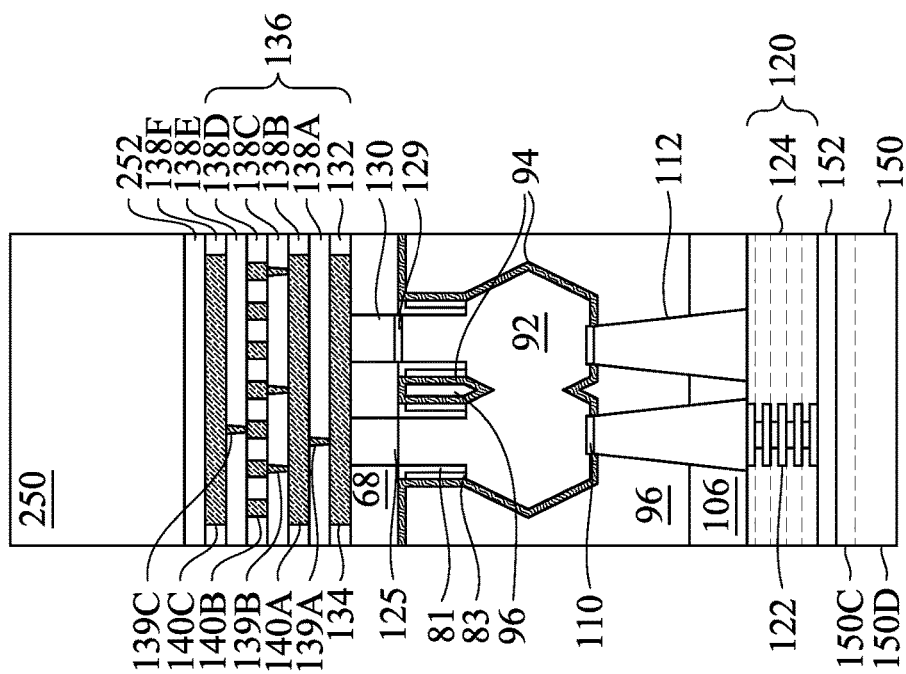
Figure 40A:
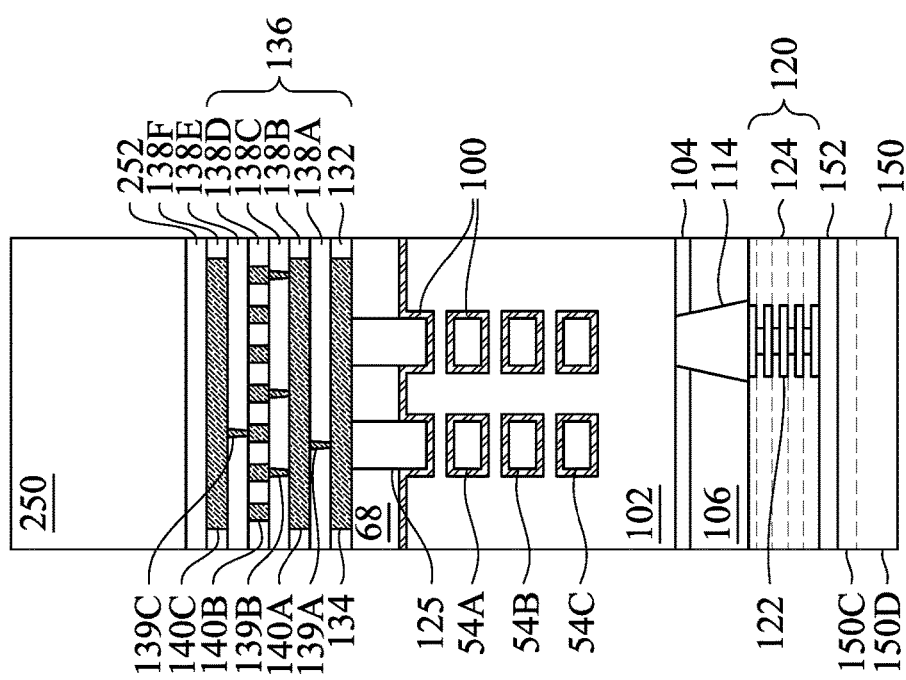
Figure 40C:
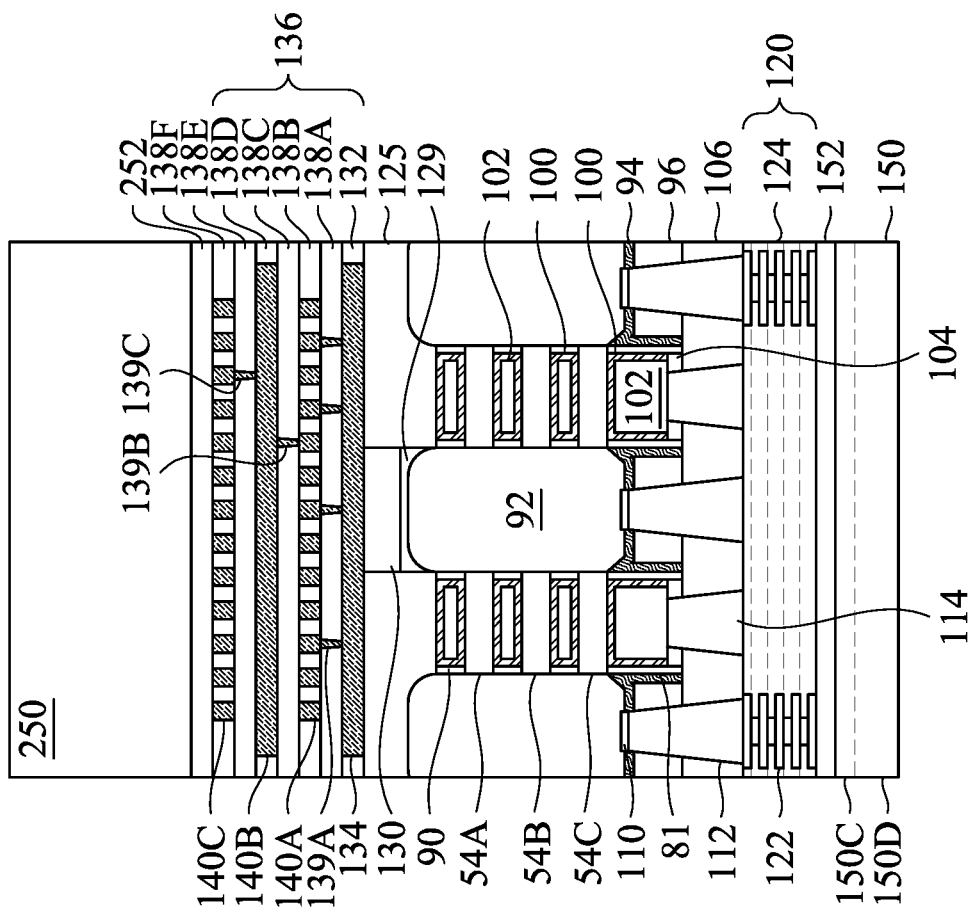

In FIGS. 40A through 40C, the back-side interconnect structure 136 is formed using processes similar to the processes described above with respect to FIGS. 28A through 32C. Further in FIGS. 40A through 40C, a second substrate 250 is bonded to the top surface of the back-side interconnect structure 136 by bonding layers 252 using processes similar to the processes described above with respect to FIGS. 33A through 33C.

Figure 41B:
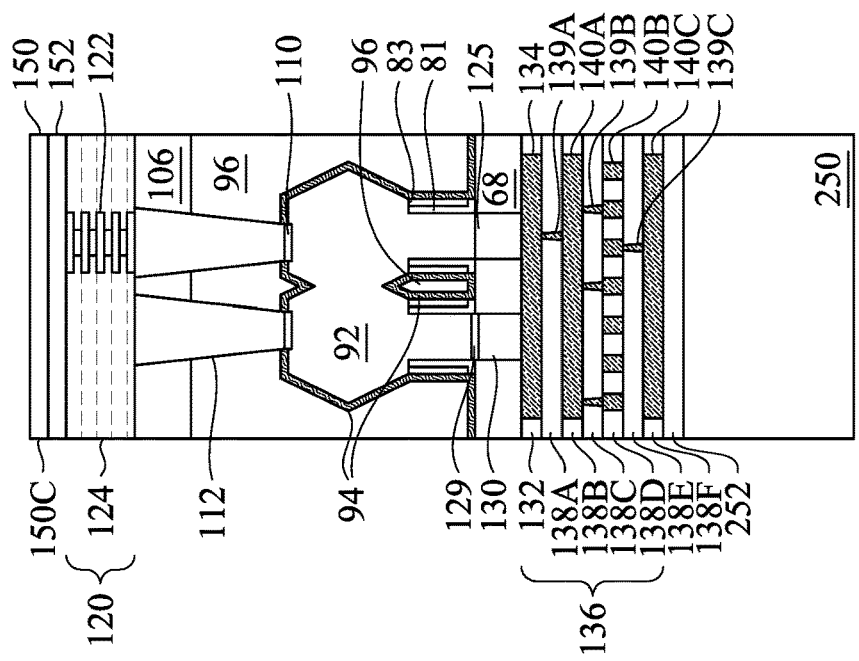
Figure 41A:
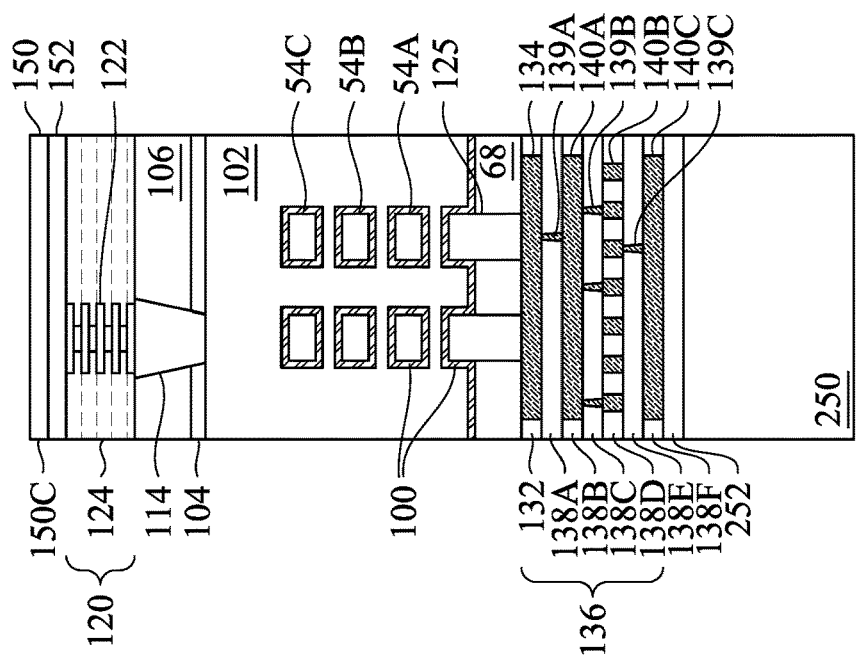
Figure 41C:
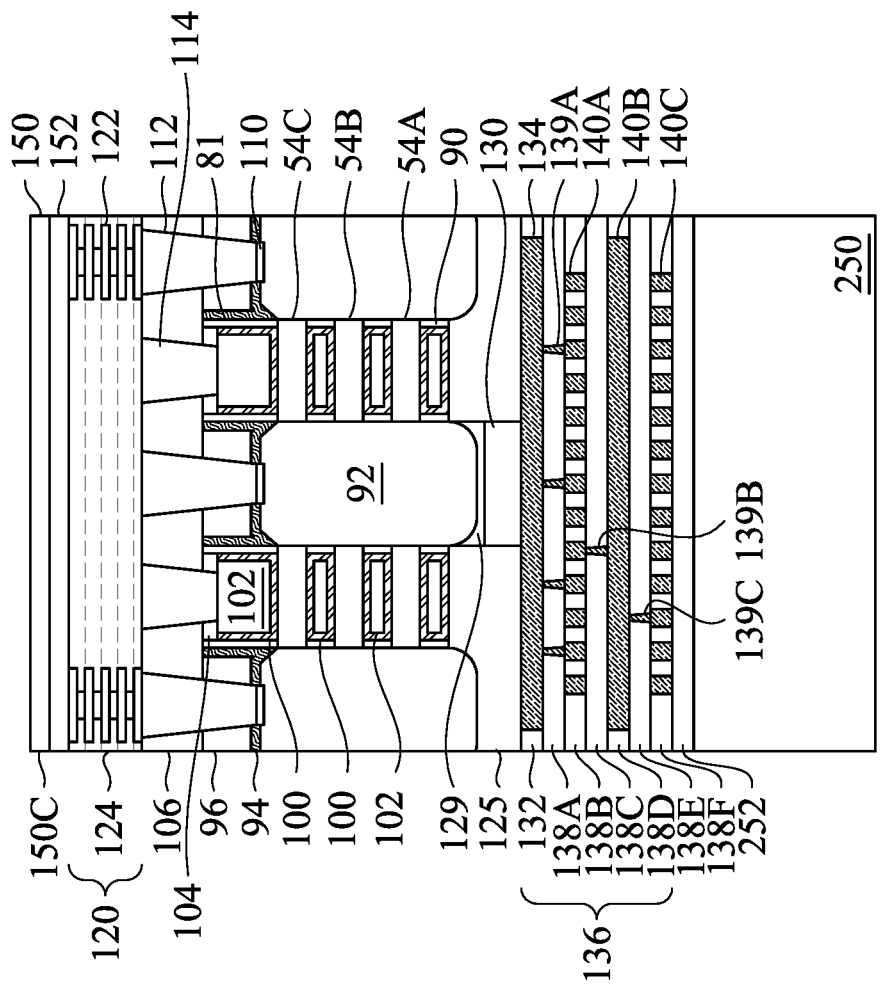

In FIGS. 41A through 41C, the device may be flipped such that the carrier substrate faces upwards. Further in FIGS. 41A through 41C, an annealing process is applied to separate the remainder region 150D from the implantation region 150C of the carrier substrate 150. The annealing process may be performed with a pulse laser or a furnace. The annealing process may be similar to the annealing process using a pulsed laser described above with respect to FIGS. 24A through 24C except that the pulsed laser here is applied to the remainder region 150D of the carrier substrate 150. The annealing process may also be similar to the annealing process using a furnace described above with respect to FIGS. 25A through 25C. In some embodiments, the remainder region 150D may be reused as a carrier substrate in the processing of additional devices.

The implantation depth into a substrate is usually rather small relative to the thickness of the substrate. In some example embodiments, the implantation depth into the substrate may be about 3 μm to 5 μm, as compared to the thickness of the substrate about 775 μm. In the embodiments described with respect to FIGS. 34A through 34C, the ion gas 202 is applied to the carrier substrate 150 from the side opposite to the bonding layers 152. So, to ensure that the carrier substrate 150 after the annealing process (e.g., the remainder region 150B next to the bonding layers 152) is thin enough (e.g., 10 nm to 50 nm), before the ion gas 202 is applied to the carrier substrate 150, a thinning process needs to be applied to the carrier substrate 150 to reduce the thickness of the carrier substrate 150 to about 3 μm to 5 μm first. In contrast, in the embodiments with respect to FIGS. 37 through 41C, the ion gas 202 is applied to the carrier substrate 150 from the side of the bonding layer 152B. The carrier substrate 150 after the annealing process is the implantation region 150C next to the bonding layers 152 (see FIGS. 37 and 41A-41C). Further, the ion gas 202 is applied to the carrier substrate 150 through the bonding layer 152B, which further reduces the implantation depth into the carrier substrate 150 (e.g., the thickness of the implantation region 150C). In some embodiments, the thickness of the implantation region 150C next to the bonding layers 152 may be about 10 nm to 50 nm. So, in contrast to the embodiments with respect to FIGS. 22A through 35C, here in the embodiments with respect to FIGS. 37 through 41C, no separate thinning process needs be applied to the carrier substrate 150 prior to the plasma process applied to the carrier substrate 150.

After the annealing process, the remainder region 150D is separated from the implantation region 150C of the carrier substrate 150, as illustrated in FIGS. 41A through 41C. As a result, the thickness of the carrier substrate 150 is reduced to a thickness of the implantation region 150C (e.g., to between 10 nm and 50 nm).

After the remainder region 150l) is separated from the implantation region 150C of the carrier substrate 150, an optional cleaning process may be applied to the front side of the carrier substrate 150 (e.g., the implantation region 150C). The cleaning process may comprise a suitable etching process, such as an isotropic etching process (e.g., a wet etching process), an anisotropic etching process (e.g., a dry etching process), or the like. The cleaning process may remove the implantation region 150C and the bonding layers 152 to expose the top surfaces of the front-side interconnect structure 120. In some embodiments, etching using ammonium hydroxide (e.g., $NH_4OH$) may be applied to remove the implantation region 150C. A planarization process such as CMP, or an oxide removal using, for example, dilute hydrofluoric (dHF), may be applied to remove the bonding layers 152.

Figure 42B:
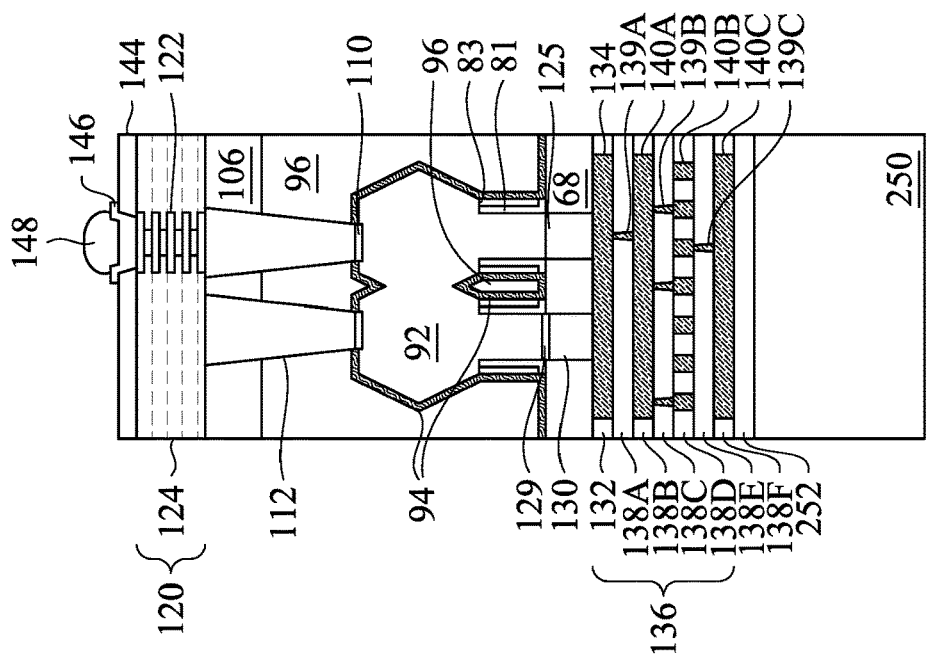
Figure 42A:
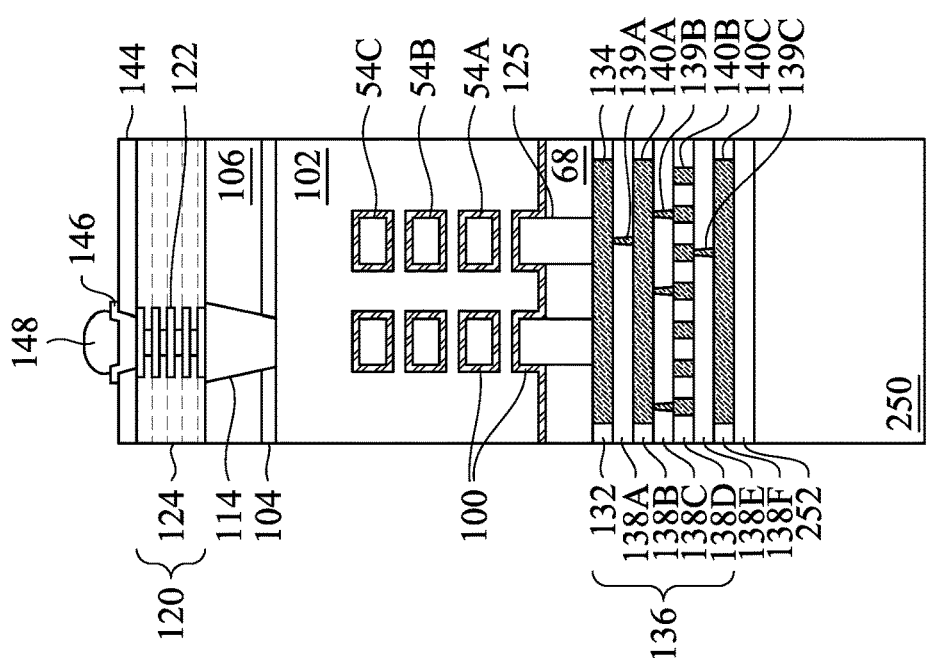
Figure 42C:
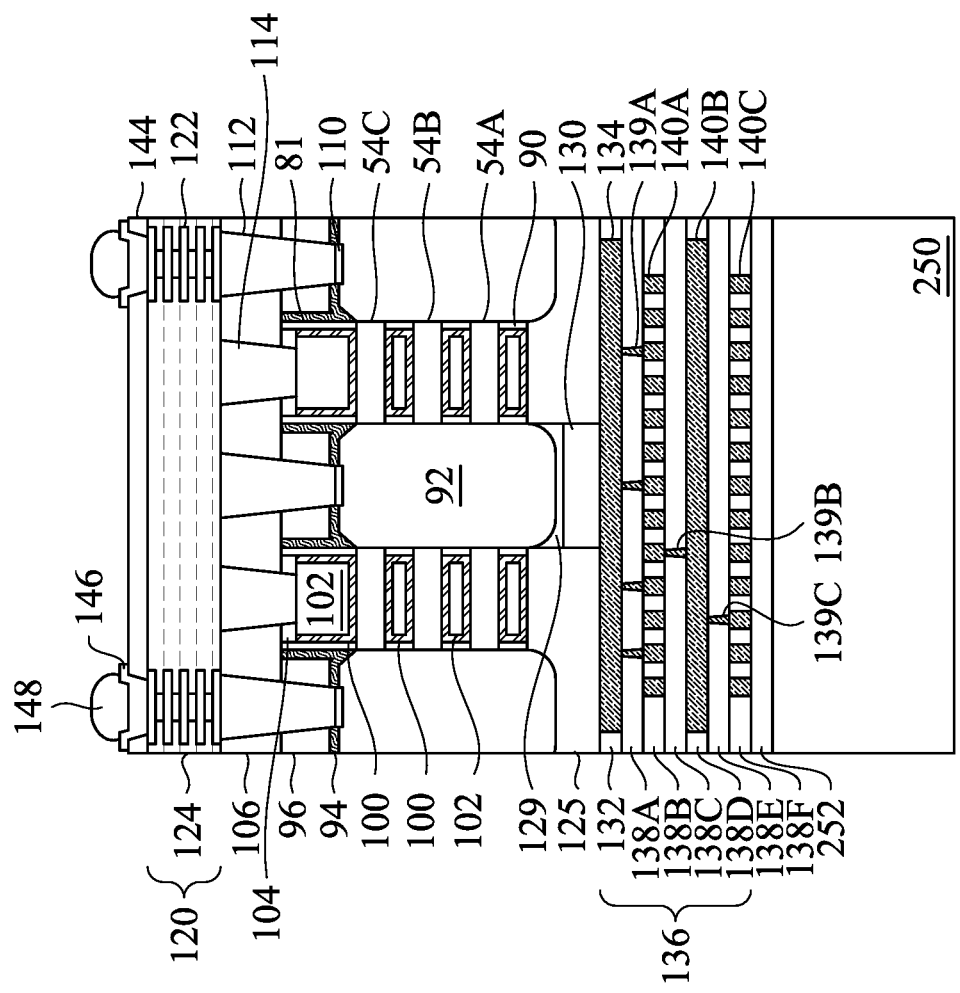

Optionally, in FIGS. 42A through 42C, a passivation layer 144, UBMs 146, and external connectors 148 may be formed over the front-side interconnect structure 120 using processes similar to the processes described above with respect to FIGS. 36A through 36C.

In accordance with embodiments, a method includes forming a transistor structure of a device on a first semiconductor substrate; forming a front-side interconnect structure over a front side of the transistor structure; bonding a carrier substrate to the front-side interconnect structure; implanting ions into the first semiconductor substrate to form an implantation region of the first semiconductor substrate; and removing the first semiconductor substrate. Removing the first semiconductor substrate includes applying an annealing process to separate the implantation region from a remainder region of the first semiconductor substrate. The method also includes forming a back-side interconnect structure over a back side of the transistor structure. In an embodiment, implanting the ions may include flipping the device such that the first semiconductor substrate faces upwards; grinding the first semiconductor substrate to reduce a thickness of the first semiconductor substrate to a first thickness number; and applying an ion gas to the first semiconductor substrate to implant the ions into the implantation region of the first semiconductor substrate. In an embodiment, the ion gas may include hydrogen ions or a mixture of hydrogen ions and helium ions. In an embodiment, the ion gas may include the mixture of hydrogen ions and helium ions, and a ratio between the hydrogen ions and the helium ions may be about 4:6. In an embodiment, applying the ion gas to the first semiconductor substrate may include applying the ion gas to the first semiconductor substrate with an implantation density between $10^{16}$ atoms/$cm^3$ and $10^{17}$ atoms/$cm^3$. In an embodiment, a thickness of the remainder region of the first semiconductor substrate may be between 10 nm and 50 nm. In an embodiment, removing the first semiconductor substrate may further include, after the implantation region is separated from the remainder region of the first semiconductor substrate, etching the remainder region of the first semiconductor substrate to expose the transistor structure. In an embodiment, applying the annealing process may include applying the annealing process by applying a pulsed laser in the implantation region of the first semiconductor substrate. An energy density of the pulsed laser may be at least 600 mJ/cm$^2$, and a maximum device temperature of the device during the annealing process may be at most 400° C. In an embodiment, applying the annealing process may include applying the annealing process by using a furnace to heat the device. The anneal temperature of the furnace may be in a range of 300° C. to 400° C. In an embodiment, the method may further include implanting second ions into the carrier substrate to form an implantation region of the carrier substrate and removing the carrier substrate. Removing the carrier substrate may include applying a second annealing process to separate the implantation region of the carrier substrate from a remainder region of the carrier substrate.

Embodiments may achieve advantages. For example, H/He ion implantation combined with pulsed laser or furnace annealing provides uniformity, cost, and throughput benefits. The embodiment techniques can efficiently cut the dose rate needed for substrate splitting by about 75%. The cut substrate (e.g., the remainder region 150D described with respect to FIGS. 41A through 41C) can be reusable. The embodiment techniques are described in the context of back-side power delivery applications, but they can also be applied to other applications, such as three-dimensional integrated circuit (3DIC) and layer transfer applications.

In accordance with embodiments, a method includes forming a transistor structure of a device on a semiconductor substrate; forming a front-side interconnect structure over a front side of the transistor structure; bonding a carrier substrate to the front-side interconnect structure; flipping the device such that the semiconductor substrate is above the carrier substrate; grinding the semiconductor substrate to reduce a thickness of the semiconductor substrate; applying an ion gas to the semiconductor substrate to form an implantation region of the semiconductor substrate; separating the implantation region from the semiconductor substrate using an annealing process; etching the semiconductor substrate to expose the transistor structure; and forming a back-side interconnect structure over a back side of the transistor structure. In an embodiment, the ion gas may include hydrogen ions or a mixture of hydrogen ions and helium ions. In an embodiment, applying the ion gas to the semiconductor substrate may include applying the ion gas to the semiconductor substrate with an implantation density between $10^{16}$ atoms/cm$^3$ and $10^{17}$ atoms/cm$^3$. In an embodiment, applying the annealing process may include applying the annealing process by applying a pulsed laser in the implantation region of the semiconductor substrate. An energy density of the pulsed laser may be at least 600 mJ/cm$^2$, and a maximum device temperature of the device during the annealing process may be at most 400° C. In an embodiment, applying the annealing process may include applying the annealing process by using a furnace to heat the device. An anneal temperature of the furnace may be in a range of 300° C. to 400° C.

In accordance with embodiments, a method includes forming a transistor structure of a device on a first semiconductor substrate; forming a front-side interconnect structure over a front side of the transistor structure; bonding a carrier substrate to the front-side interconnect structure; implanting ions into the carrier substrate to form an implantation region of the carrier substrate; and removing the carrier substrate. Removing the carrier substrate includes applying an annealing process to separate the implantation region of the carrier substrate and a remainder region of the carrier substrate. The method further includes removing the first semiconductor substrate and forming a back-side interconnect structure over a back side of the transistor structure. In an embodiment, implanting the ions into the carrier substrate may include, before bonding the carrier substrate to the front-side interconnect structure, forming a bonding layer on the carrier substrate and applying a ion gas to the carrier substrate through the bonding layer to implant the ions into the implantation region of the carrier substrate. The method may further include applying a ion gas to the carrier substrate through the bonding layer to implant the ions into the implantation region of the carrier substrate. The method may further include, before applying the annealing process, flipping the device such that the first semiconductor substrate faces up and removing the first semiconductor substrate. The method may further include, after forming the back-side interconnect structure over the back side of the transistor structure, bonding a second semiconductor substrate to the back-side interconnect structure and flipping the device such that the carrier substrate faces upwards. Applying the annealing process may include applying the annealing process to separate the remainder region of the carrier substrate from the implantation region of the carrier substrate. In an embodiment, the method may further include, before implanting the ions into the carrier substrate, flipping the device such that the first semiconductor substrate faces upwards and removing the first semiconductor substrate. The method may further include, after forming the back-side interconnect structure over the back side of the transistor structure, bonding a second semiconductor substrate to the back-side interconnect structure, flipping the device such that the carrier substrate faces upwards, and grinding the carrier substrate to reduce a thickness of the carrier substrate. Applying the annealing process may include applying the annealing process to separate the implantation region from the carrier substrate. In an embodiment, the ions may include hydrogen ions or a mixture of hydrogen ions and helium ions. In an embodiment, implanting the ions may include applying an ion gas to the first semiconductor substrate with an implantation density between $10^{16}$ atoms/cm$^3$ and $10^{17}$ atoms/cm$^3$. In an embodiment, applying the annealing process may include applying the annealing process by applying a pulsed laser or by using a furnace to heat the device.

The foregoing outlines features of several embodiments so that those skilled in the art may better understand the aspects of the present disclosure. Those skilled in the aft should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming a transistor structure of a device on a first semiconductor substrate;
forming a front-side interconnect structure over a front side of the transistor structure;
forming a bonding layer on a carrier substrate;

implanting ions into the carrier substrate through the bonding layer to form an implantation region of the carrier substrate;
bonding the carrier substrate to the front-side interconnect structure;
removing the carrier substrate, wherein removing the carrier substrate comprises:
applying an annealing process to separate the implantation region of the carrier substrate and a remainder region of the carrier substrate, the annealing process comprising applying a pulsed laser to the implantation region of the carrier substrate, wherein an energy density of the pulsed laser is at least 600 mJ/cm$^2$, and wherein a maximum device temperature of the device during the annealing process is at most 400° C.; and
forming a back-side interconnect structure over a back side of the transistor structure.

2. The method of claim 1, further comprising:
before applying the annealing process:
flipping the device such that the first semiconductor substrate faces upwards; and
removing the first semiconductor substrate.

3. The method of claim 2, removing the first semiconductor substrate comprising:
implanting second ions into the first semiconductor substrate to form an implantation region of the first semiconductor substrate, wherein removing the first semiconductor substrate comprises:
applying a second annealing process to separate the implantation region of the first semiconductor substrate from a remainder region of the first semiconductor substrate.

4. The method of claim 2, further comprising:
after forming the back-side interconnect structure over the back side of the transistor structure:
bonding a second semiconductor substrate to the back-side interconnect structure; and
flipping the device such that the carrier substrate faces upwards, and wherein applying the annealing process comprises:
applying the annealing process to separate the remainder region of the carrier substrate from the implantation region of the carrier substrate.

5. The method of claim 1, wherein the ions include hydrogen ions or a mixture of hydrogen ions and helium ions.

6. The method of claim 1, wherein applying the annealing process comprises:
applying the annealing process by using a furnace to heat the device,
wherein an anneal temperature of the furnace is in a range of 300° C. to 400° C.

7. The method of claim 1, wherein implanting the ions comprises:
applying an ion gas to the carrier substrate with an implantation density between $10^{16}$ atoms/cm$^3$ and $10^{17}$ atoms/cm$^3$.

8. A method comprising:
forming a transistor structure of a device on a first semiconductor substrate;
forming a front-side interconnect structure over a front side of the transistor structure;
bonding a carrier substrate to the front-side interconnect structure;
flipping the device such that the first semiconductor substrate faces upwards;
removing the first semiconductor substrate;
implanting ions into the carrier substrate to form an implantation region of the carrier substrate; and
removing the carrier substrate, wherein removing the carrier substrate comprises:
applying an annealing process to separate the implantation region of the carrier substrate and a remainder region of the carrier substrate, wherein the annealing process comprises applying a pulsed laser to the implantation region of the carrier substrate, wherein an energy density of the pulsed laser is at least 600 mJ/cm$^2$.

9. The method of claim 8, further comprising:
forming a back-side interconnect structure over a back side of the transistor structure;
bonding a second semiconductor substrate to the back-side interconnect structure;
flipping the device such that the carrier substrate faces upwards; and
grinding the carrier substrate to reduce a thickness of the carrier substrate, wherein applying the annealing process comprises:
applying the annealing process to separate the implantation region from the carrier substrate.

10. The method of claim 8, wherein a maximum device temperature of the device during the annealing process is at most 400° C.

11. The method of claim 10, wherein applying the annealing process comprises:
applying the annealing process by using a furnace to heat the device,
wherein an anneal temperature of the furnace is in a range of 300° C. to 400° C.

12. The method of claim 8, wherein the ions include hydrogen ions or a mixture of hydrogen ions and helium ions.

13. The method of claim 8, wherein the ions include only hydrogen ions, and an implantation density for implanting the hydrogen ions ranges from $3 \times 10^{16}$ atoms/cm$^3$ to $9 \times 10^{16}$ atoms/cm$^3$.

14. The method of claim 8, wherein the ions include a mixture of hydrogen ions and helium ions, and wherein a ratio between the hydrogen ions and the helium ions is 4:6.

15. The method of claim 8, wherein the remainder region of the carrier substrate has a thickness between 10 nm and 50 nm.

16. The method of claim 8, wherein the implanting the ions comprises an implantation energy greater than 10 kiloelectronvolts (keV).

17. A method comprising:
forming a front-side interconnect structure over a front side of a transistor structure of a device on a first semiconductor substrate;
bonding a carrier substrate to the front-side interconnect structure;
after bonding the carrier substrate to the front-side interconnect structure, implanting ions into the first semiconductor substrate to form an implantation region of the first semiconductor substrate, wherein the implanting of the ions comprises grinding the first semiconductor substrate to a reduced thickness, and applying an ion gas to the first semiconductor substrate to implant the ions into the implantation region of the first semiconductor substrate, the ion gas including a mixture of hydrogen ions and helium ions, the hydrogen ions having an implantation density ranging from $3.6 \times 10^{15}$ atoms/cm$^3$ to $10.8 \times 10^{15}$ atoms/cm$^3$ and the helium ion having an implantation density ranging from $0.6 \times 10^{16}$ atoms/cm$^3$ to $1.6 \times 10^{16}$ atoms/cm$^3$; and applying an annealing process to separate the implantation region from a remainder region of the first semiconductor substrate.

18. The method of claim 17, wherein implanting the ions comprises flipping the device such that the first semiconductor substrate faces upwards prior to the implanting of the ions.

19. The method of claim 17, wherein a ratio between the hydrogen ions and the helium ions is 4:6.

20. The method of claim 17, further comprising:

removing the implantation region of the first semiconductor substrate; and forming a back-side interconnect structure over a back side of the transistor structure.

* * * * *